(12) United States Patent
Kimura et al.

(10) Patent No.: US 11,837,437 B2
(45) Date of Patent: Dec. 5, 2023

(54) SPECIMEN MACHINING DEVICE AND INFORMATION PROVISION METHOD

(71) Applicant: JEOL Ltd., Tokyo (JP)

(72) Inventors: Tatsuhito Kimura, Tokyo (JP); Munehiro Kozuka, Tokyo (JP); Tsutomu Negishi, Tokyo (JP); Hisashi Kawahara, Tokyo (JP)

(73) Assignee: JEOL Ltd., Tokyo (JP)

( * ) Notice: Subject to any disclaimer, the term of this patent is extended or adjusted under 35 U.S.C. 154(b) by 60 days.

(21) Appl. No.: 17/832,001

(22) Filed: Jun. 3, 2022

(65) Prior Publication Data
US 2022/0392744 A1    Dec. 8, 2022

(30) Foreign Application Priority Data
Jun. 4, 2021 (JP) .................. 2021-094685

(51) Int. Cl.
*H01J 37/304*    (2006.01)
*H01J 37/08*    (2006.01)
(Continued)

(52) U.S. Cl.
CPC ............ *H01J 37/304* (2013.01); *H01J 37/08* (2013.01); *H01J 37/20* (2013.01); *H01J 37/222* (2013.01);
(Continued)

(58) Field of Classification Search
CPC .. H01J 37/20; H01J 37/30; H01J 37/08; H01J 37/304; H01J 37/3005; H01J 37/3053;
(Continued)

(56) References Cited

U.S. PATENT DOCUMENTS

2006/0255295 A1   11/2006   Yoshioka et al.
2008/0073580 A1*   3/2008   Phaneuf .............. H01J 37/3056
                                                     250/492.21
(Continued)

FOREIGN PATENT DOCUMENTS

JP     H09134700 A    5/1997
JP     2012193962 A    10/2012

OTHER PUBLICATIONS

Extended European Search Report issued in EP22176774.2 dated Apr. 18, 2023.
(Continued)

*Primary Examiner* — David E Smith
*Assistant Examiner* — Hsien C Tsai
(74) *Attorney, Agent, or Firm* — THE WEBB LAW FIRM

(57) ABSTRACT

A specimen machining device for machining a specimen by irradiating the specimen with an ion beam includes an ion source for irradiating the specimen with the ion beam, a specimen stage for holding the specimen, a camera for photographing the specimen, an information provision unit for providing information indicating an expected machining completion time, and a storage unit for storing past machining information. The information provision unit performs processing for calculating the expected machining completion time based on the past machining information, processing for acquiring an image photographed by the camera, processing for calculating a machining speed based on the acquired image, and processing for updating the expected machining completion time based on the machining speed.

9 Claims, 46 Drawing Sheets

(51) Int. Cl.
*H01J 37/20* (2006.01)
*H01J 37/22* (2006.01)

(52) U.S. Cl.
CPC ... *H01J 2237/002* (2013.01); *H01J 2237/026* (2013.01); *H01J 2237/20207* (2013.01); *H01J 2237/30405* (2013.01); *H01J 2237/30472* (2013.01)

(58) Field of Classification Search
CPC ............ H01J 37/3056; H01J 2237/221; H01J 2237/2446; H01J 2237/24578; H01J 2237/31749; H01J 2237/3174; H01J 2237/30466
See application file for complete search history.

(56) References Cited

U.S. PATENT DOCUMENTS

| | | |
|---|---|---|
| 2013/0334034 A1 | 12/2013 | Kitayama et al. |
| 2014/0028828 A1 | 1/2014 | Hunt et al. |
| 2014/0076717 A1* | 3/2014 | Nanri ............... H01J 37/304 204/192.33 |
| 2022/0102112 A1* | 3/2022 | Ninomiya ............ H01J 37/304 |

OTHER PUBLICATIONS

Partial European Search Report issued in EP22176774.2 dated Dec. 7, 2022.

* cited by examiner

| No. | ACCELERATION VOLTAGE | BRIGHTNESS OF TRANSMITTED LIGHT | STATUS OF SPECIMEN |
|---|---|---|---|
| 1 | 6.0kV | 18% | UNTIL SPECIMEN STARTS TO BECOME THINNER |
| 2 | 5.0kV | 20% | UNTIL SPECIMEN STARTS TO BECOME EVEN THINNER |
| 3 | 4.0kV | 23% | UNTIL IMMEDIATELY BEFORE HOLE OPENS IN SPECIMEN |
| 4 | 3.0kV | 50% | UNTIL HOLE OPENS IN SPECIMEN |
| 5 | 2.0kV | — | FINISHING FOR 5 MINUTES |
| 6 | 1.0kV | — | FINISHING FOR 5 MINUTES |
| 7 | 0.5kV | — | FINISHING FOR 5 MINUTES |
| 8 | 0.3kV | — | FINISHING FOR 5 MINUTES |
| 9 | 0.1kV | — | FINISHING FOR 5 MINUTES |

FIG. 16

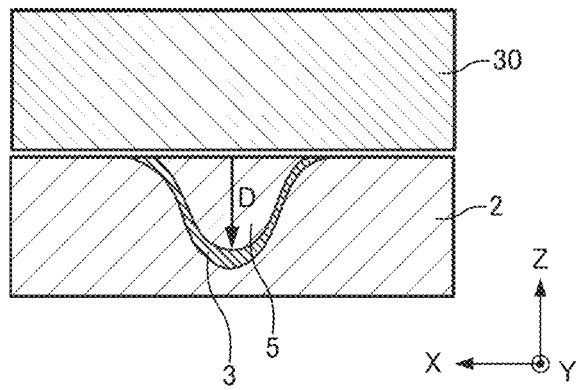

FIG. 18

| No. | ACCELERATION VOLTAGE | MACHINING DEPTH | STATUS OF SPECIMEN |
|---|---|---|---|
| 1 | 6.0kV | 50% | UNTIL SPECIMEN STARTS TO BECOME THINNER |
| 2 | 5.0kV | 75% | UNTIL SPECIMEN STARTS TO BECOME EVEN THINNER |
| 3 | 4.0kV | 90% | UNTIL IMMEDIATELY BEFORE HOLE OPENS IN SPECIMEN |

| No. | ACCELERATION VOLTAGE | BRIGHTNESS OF TRANSMITTED LIGHT | STATUS OF SPECIMEN |
|---|---|---|---|
| 4 | 3.0kV | 50% | UNTIL HOLE OPENS IN SPECIMEN |
| 5 | 2.0kV | — | FINISHING FOR 5 MINUTES |
| 6 | 1.0kV | — | FINISHING FOR 5 MINUTES |
| 7 | 0.5kV | — | FINISHING FOR 5 MINUTES |
| 8 | 0.3kV | — | FINISHING FOR 5 MINUTES |
| 9 | 0.1kV | — | FINISHING FOR 5 MINUTES |

FIG. 19

| No. | ACCELERATION VOLTAGE | POSITION PH | STATUS OF SPECIMEN |
|---|---|---|---|
| 1 | 6.0kV | 50% | UNTIL SPECIMEN STARTS TO BECOME THINNER |
| 2 | 5.0kV | 75% | UNTIL SPECIMEN STARTS TO BECOME EVEN THINNER |
| 3 | 4.0kV | 90% | UNTIL IMMEDIATELY BEFORE SPECIMEN REACHES THICKNESS OF SHIELDING MEMBER |
| 4 | 3.0kV | 100% | UNTIL SPECIMEN REACHES THICKNESS OF SHIELDING MEMBER |
| 5 | 2.0kV | — | FINISHING FOR 5 MINUTES |
| 6 | 1.0kV | — | FINISHING FOR 5 MINUTES |
| 7 | 0.5kV | — | FINISHING FOR 5 MINUTES |
| 8 | 0.3kV | — | FINISHING FOR 5 MINUTES |
| 9 | 0.1kV | — | FINISHING FOR 5 MINUTES |

FIG. 33

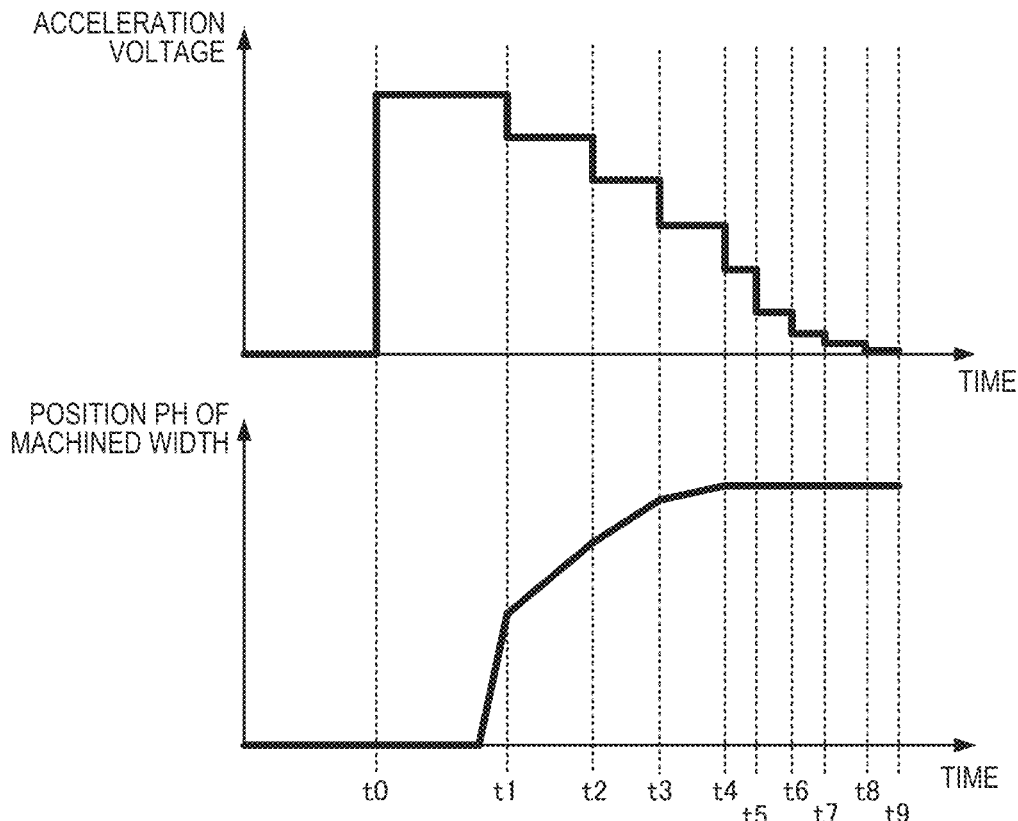

FIG. 34

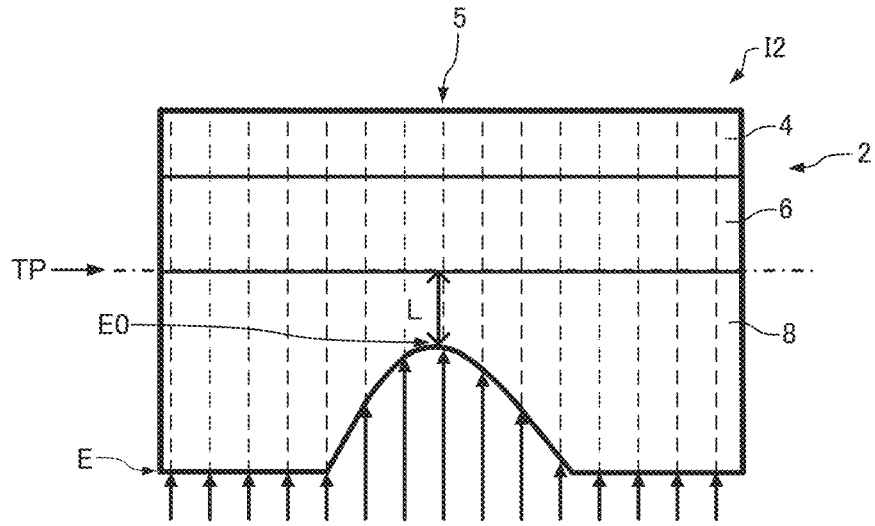

FIG. 41

| No. | ACCELERATION VOLTAGE | REMAINING FILM THICKNESS | STATUS OF SPECIMEN |
|---|---|---|---|
| 1 | 6.0kV | 90% | UNTIL PROTECTIVE MEMBER STARTS TO BE SHAVED |
| 2 | 5.0kV | 50% | UNTIL MACHINED EDGE REACHES 1/2 THE DISTANCE BETWEEN LAMINATED FILM AND PROTECTIVE MEMBER |
| 3 | 4.0kV | 10% | UNTIL IMMEDIATELY BEFORE MACHINED EDGE REACHES LAMINATED FILM |
| 4 | 3.0kV | 0% | UNTIL MACHINED EDGE REACHES LAMINATED FILM |
| 5 | 2.0kV | — | FINISHING FOR 5 MINUTES |
| 6 | 1.0kV | — | FINISHING FOR 5 MINUTES |
| 7 | 0.5kV | — | FINISHING FOR 5 MINUTES |
| 8 | 0.3kV | — | FINISHING FOR 5 MINUTES |
| 9 | 0.1kV | — | FINISHING FOR 5 MINUTES |

FIG. 42

| No. | ACCELERATION VOLTAGE | POSITION PH | STATUS OF SPECIMEN |
|---|---|---|---|
| 1 | 6.0kV | 50% | UNTIL IMMEDIATELY BEFORE TARGET REGION STARTS TO APPEAR |
| 2 | 5.0kV | 75% | UNTIL TARGET REGION STARTS TO APPEAR |
| 3 | 4.0kV | 90% | UNTIL IMMEDIATELY BEFORE ENTIRE TARGET REGION APPEARS |
| 4 | 3.0kV | 100% | UNTIL ENTIRE TARGET REGION APPEARS |
| 5 | 2.0kV | — | FINISHING FOR 5 MINUTES |
| 6 | 1.0kV | — | FINISHING FOR 5 MINUTES |
| 7 | 0.5kV | — | FINISHING FOR 5 MINUTES |
| 8 | 0.3kV | — | FINISHING FOR 5 MINUTES |
| 9 | 0.1kV | — | FINISHING FOR 5 MINUTES |

FIG. 48

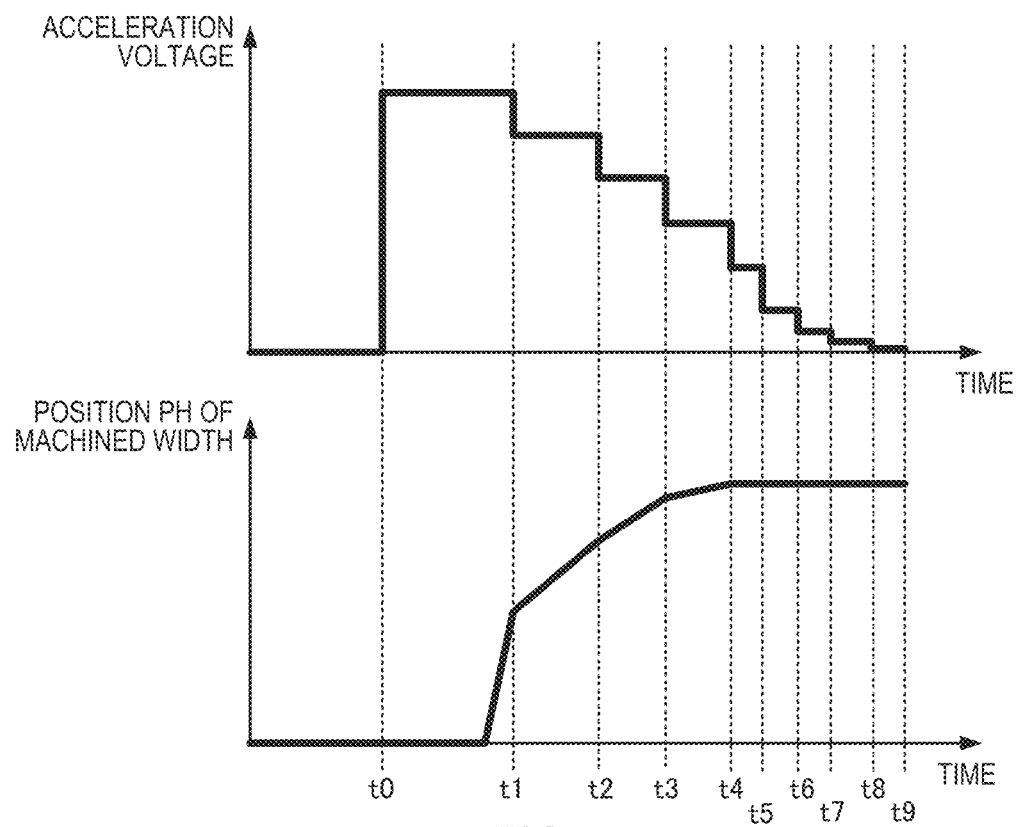

FIG. 49

SPECIMEN MACHINING DEVICE AND INFORMATION PROVISION METHOD

CROSS-REFERENCE TO RELATED APPLICATION

This application claims priority to Japanese Patent Application No. 2021-094685 filed Jun. 4, 2021, the disclosure of which is hereby incorporated by reference in its entirety.

BACKGROUND OF THE INVENTION

Field of the Invention

The present invention relates to a specimen machining device and an information provision method.

Description of Related Art

A Cross Section Polisher (registered trademark) for machining a cross-section of a specimen, an Ion Slicer (registered trademark) for preparing a thin film specimen, and so on are available as specimen machining devices for machining a specimen using an ion beam.

For example, JP-A-2012-193962 discloses a specimen preparation device for preparing a thin film specimen for use in a transmission electron microscope by disposing a shield belt on a bulk specimen, irradiating the specimen with an ion beam through the shield belt, and ion milling the part not shielded by the shield belt.

In this type of specimen machining device, the machining may take a long time. Therefore, if it is possible to know the time required to complete the machining in advance, the frequency with which the user checks the device can be reduced, leading to an improvement in operation efficiency.

SUMMARY OF THE INVENTION

According to a first aspect of the invention, there is provided a specimen machining device for machining a specimen by irradiating the specimen with an ion beam, the specimen machining device including:
 an ion source for irradiating the specimen with the ion beam;
 a specimen stage for holding the specimen;
 a camera for photographing the specimen;
 an information provision unit for providing information indicating an expected machining completion time; and
 a storage unit for storing past machining information,
 the information provision unit performing:
 processing for calculating the expected machining completion time based on the past machining information;
 processing for acquiring an image photographed by the camera;
 processing for calculating a machining speed based on the acquired image; and
 processing for updating the expected machining completion time based on the machining speed.

According to a second aspect of the invention, there is provided an information provision method implemented in a specimen machining device for machining a specimen by irradiating the specimen with an ion beam, the specimen machining device including an ion source for irradiating the specimen with the ion beam, a specimen stage for holding the specimen, and a camera for photographing the specimen, the information provision method including:

calculating an expected machining completion time based on past machining information;
 acquiring an image photographed by the camera;
 calculating a machining speed based on the acquired image; and
 updating the expected machining completion time based on the machining speed.

BRIEF DESCRIPTION OF THE DRAWINGS

FIG. 16 is a table illustrating acceleration voltages set in accordance with the brightness of transmitted light.
FIG. 18 illustrates a machining depth.
FIG. 19 is a table illustrating acceleration voltages set in accordance with a machining depth.

FIG. 33 is a table illustrating acceleration voltages set in accordance with a position.

FIG. 34 illustrates machining statuses during primary milling.

FIG. 41 illustrates processing for detecting an edge of a lower end of a machined region.

FIG. 42 is a table illustrating acceleration voltages set in accordance with the position of an edge.

FIG. 48 is a table illustrating acceleration voltages set in accordance with the position.

FIG. 49 illustrates a status of cross-section processing.

DESCRIPTION OF THE INVENTION

Figure 1:
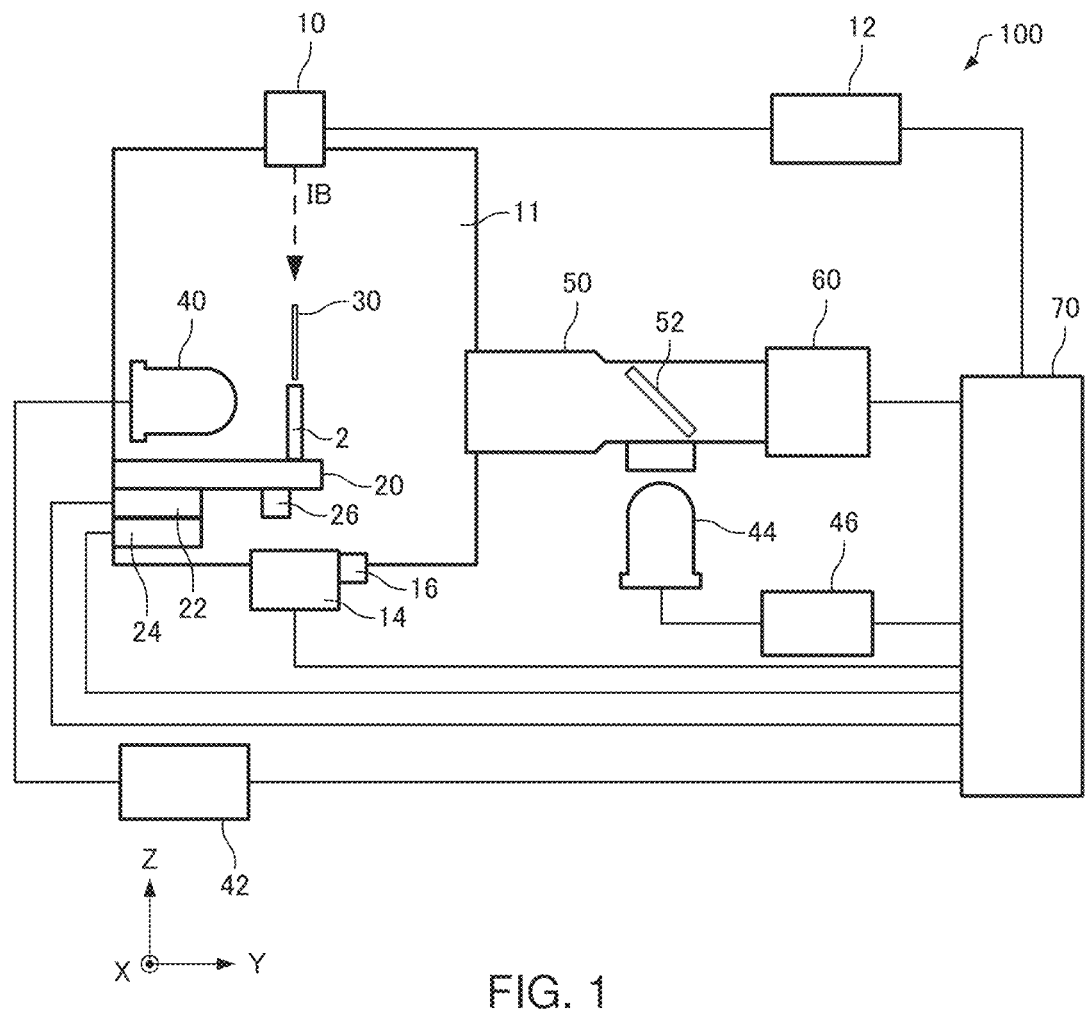
FIG. 1 is a diagram illustrating a configuration of a specimen machining device according to an embodiment of the invention.

According to an embodiment of the invention, there is provided a specimen machining device for machining a specimen by irradiating the specimen with an ion beam, the specimen machining device including:

an ion source for irradiating the specimen with the ion beam;

a specimen stage for holding the specimen;

a camera for photographing the specimen;

an information provision unit for providing information indicating an expected machining completion time; and a storage unit for storing past machining information, the information provision unit performing:

processing for calculating the expected machining completion time based on the past machining information;

processing for acquiring an image photographed by the camera;

processing for calculating a machining speed based on the acquired image; and processing for updating the expected machining completion time based on the machining speed.

With this specimen machining device, the expected machining completion time can be provided from immediately after the start of the machining, and therefore the frequency with which the user checks the device can be reduced, enabling an improvement in operation efficiency. Furthermore, in this specimen machining device, the expected machining completion time is updated by acquiring images of the specimen during the machining, and therefore the expected machining completion time can be provided with high accuracy.

According to an embodiment of the invention, there is provided an information provision method implemented in a specimen machining device for machining a specimen by irradiating the specimen with an ion beam, the specimen machining device including an ion source for irradiating the specimen with the ion beam, a specimen stage for holding the specimen, and a camera for photographing the specimen, the information provision method including:

calculating an expected machining completion time based on past machining information;

acquiring an image photographed by the camera;

calculating a machining speed based on the acquired image; and updating the expected machining completion time based on the machining speed.

With this information provision method, the expected machining completion time can be provided from immediately after the start of the machining, and therefore the frequency with which the user checks the device can be reduced, enabling an improvement in operation efficiency. Furthermore, in this information provision method, the expected machining completion time is updated by acquiring images of the specimen during the machining, and therefore the expected machining completion time can be provided with high accuracy.

Preferred embodiments of the invention are described in detail below with reference to the drawings. It is noted that the following embodiments do not unduly limit the scope of the invention as stated in the claims. Further, all of the components described below are not necessarily essential requirements of the invention.

1. Specimen Machining Device

First, a specimen machining device according to an embodiment of the invention will be described with reference to the figures. FIG. 1 is a diagram illustrating a configuration of a specimen machining device 100 according to this embodiment. FIG. 1 illustrates an X axis, a Y axis, and a Z axis as three mutually orthogonal axes.

The specimen machining device 100 is a device for preparing a specimen used for observation or analysis by irradiating a specimen 2 with an ion beam IB in order to machine the specimen 2. With the specimen machining device 100, it is possible to prepare a thin film specimen that can be observed by a transmission electron microscope.

As illustrated in FIG. 1, the specimen machining device 100 includes an ion source 10, a control circuit 12, an evacuation device 14, a pressure gauge 16, a specimen stage 20, a cooler 22, a heater 24, a temperature sensor 26, a shielding member 30, a transmission illumination device 40, an illumination dimming circuit 42, a coaxial illumination device 44, an illumination dimming circuit 46, an optical system 50, a camera 60, and an information processing device 70.

The ion source 10 irradiates the specimen 2 with the ion beam IB. The ion source 10 is attached to an upper portion of a specimen chamber 11 so as to irradiate the specimen 2 housed in the specimen chamber 11 with the ion beam IB.

For example, the ion source 10 is an ion gun that accelerates ions at a predetermined acceleration voltage and emits the ion beam IB. The ion source 10 emits the ion beam IB along the Z axis. When irradiating the specimen 2 with the ion beam IB, the ion source 10 swings using a parallel axis to the X axis as a rotation axis, for example. The ion source 10 is controlled by the control circuit 12.

The specimen chamber 11 is evacuated by the evacuation device 14. In so doing, the interior of the specimen chamber 11 can be set in a depressurized state. The pressure in the specimen chamber 11 can be measured using the pressure gauge 16.

The specimen stage 20 holds the specimen 2. The shielding member 30 is attached to the specimen stage 20. The shielding member 30 is disposed on the specimen 2. The thickness of the shielding member 30 is approximately 10 μm, for example, while the thickness of the specimen 2 prior to machining is approximately 100 μm, for example. The shielding member 30 is disposed in the center of the specimen 2 in a thickness direction.

The specimen stage 20 includes a swing mechanism for swinging the specimen 2 and the shielding member 30. The swing mechanism tilts the specimen 2 and the shielding member 30 using a swing axis (a tilt axis) as a rotation axis. The swing axis is parallel to the Y axis, for example. The swing mechanism swings the specimen 2 and the shielding member 30 in a fixed period, for example.

The cooler 22 and the heater 24 are attached to the specimen stage 20. In the specimen machining device 100, the specimen 2 can be cooled by the cooler 22 and heated by the heater 24. The temperature of the specimen 2 can be measured by the temperature sensor 26. The temperature sensor 26 is attached to the specimen stage 20, for example.

The specimen 2 held on the specimen stage 20 is plate shaped. The specimen 2 is a rectangular parallelepiped, for example. The specimen 2 will be described below.

The shielding member 30 blocks the ion beam IB. The ion beam IB is emitted from the ion source 10 onto the specimen 2 through the shielding member 30. The shielding member 30 is belt shaped, for example. The shielding member 30 is a shield belt, for example. The shielding member 30 is formed from a material that is not easily milled by the ion beam IB. The shielding member 30 is positioned above the specimen 2 (in a +Z direction).

The transmission illumination device 40 emits illumination light that transmissively illuminates the specimen 2. More specifically, the transmission illumination device 40 emits the illumination light from the back of the specimen 2. The intensity of the illumination light emitted by the transmission illumination device 40 is controlled by the illumination dimming circuit 42.

The transmission illumination device 40, the specimen 2, the optical system 50, and the camera 60 are arranged in that order along the Y axis.

The coaxial illumination device 44 emits illumination light by which the specimen 2 is illuminated by coaxial illumination. More specifically, the coaxial illumination device 44 irradiates the specimen 2 with illumination light along the optical axis of the camera 60. In the example in the figure, the optical system 50 includes a half mirror 52, and using the half mirror 52, the optical axis of the illumination light is aligned with the optical axis of the camera 60. The intensity of the illumination light emitted by the coaxial illumination device 44 is controlled by the illumination dimming circuit 46.

The camera 60 photographs the specimen 2 and the shielding member 30 through the optical system 50. The camera 60 is a digital camera such as a CCD camera or a CMOS camera, for example. The optical system 50 is an optical system through which the camera 60 photographs the specimen 2.

The information processing device 70 acquires an image photographed by the camera 60 and performs processing for determining the completion of machining based on the image. Further, the information processing device 70 calculates an expected completion time of the machining and provides the expected completion time.

Figure 2:
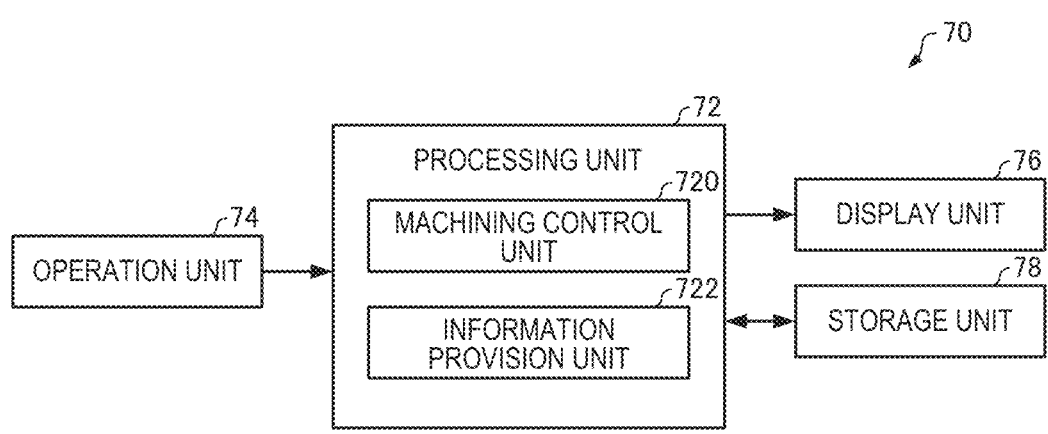
FIG. 2 is a block diagram illustrating a configuration of an information processing device.

FIG. 2 is a block diagram illustrating a configuration of the information processing device 70.

For example, the information processing device 70 includes a processing unit 72, an operation unit 74, a display unit 76, and a storage unit 78.

The operation unit 74 is used by the user to input operation information, and outputs the input operation information to the processing unit 72. The functions of the operation unit 74 can be realized by hardware such as a keyboard, a mouse, a button, a touch panel, or a touch pad.

The display unit 76 displays images generated by the processing unit 72. The functions of the display unit 76 can be realized by an LCD, a CRT, a touch panel that also functions as the operation unit 74, and so on.

The storage unit 78 stores programs and various data for causing a computer to function as respective units of the processing unit 72. The storage unit 78 also functions as a working area of the processing unit 72. The functions of the storage unit 78 can be realized by a hard disk, a RAM (Random Access Memory), or the like.

The functions of the processing unit 72 can be realized by executing a program using hardware such as various types of processor (a CPU (Central Processing Unit), a DSP (Digital Signal Processor), or the like). The processing unit 72 includes a machining control unit 720 and an information provision unit 722.

The machining control unit 720 performs processing for machining the specimen. The information provision unit 722 performs processing for providing the expected machining completion time.

2. Operation of Specimen Machining Device

With the specimen machining device 100, a specimen can be prepared using a bulk machining method for machining a bulk specimen. Further, with the specimen machining device 100, a specimen can be prepared by a two-stage milling method for preparing a specimen to be observed from a cross-sectional direction. The bulk machining method and the two-stage milling method will be described below.

2.1. Bulk Machining Method

Figure 3:
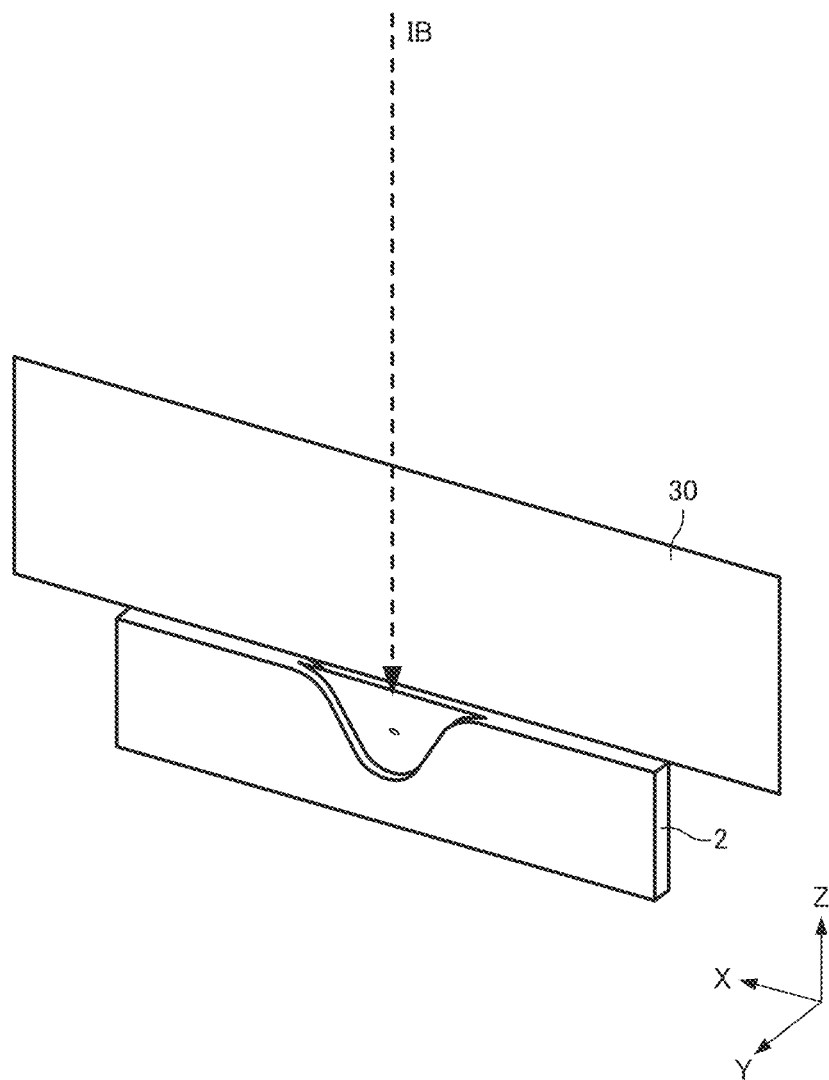
FIG. 3 is a schematic perspective view of a specimen and a shielding member.
Figure 4:
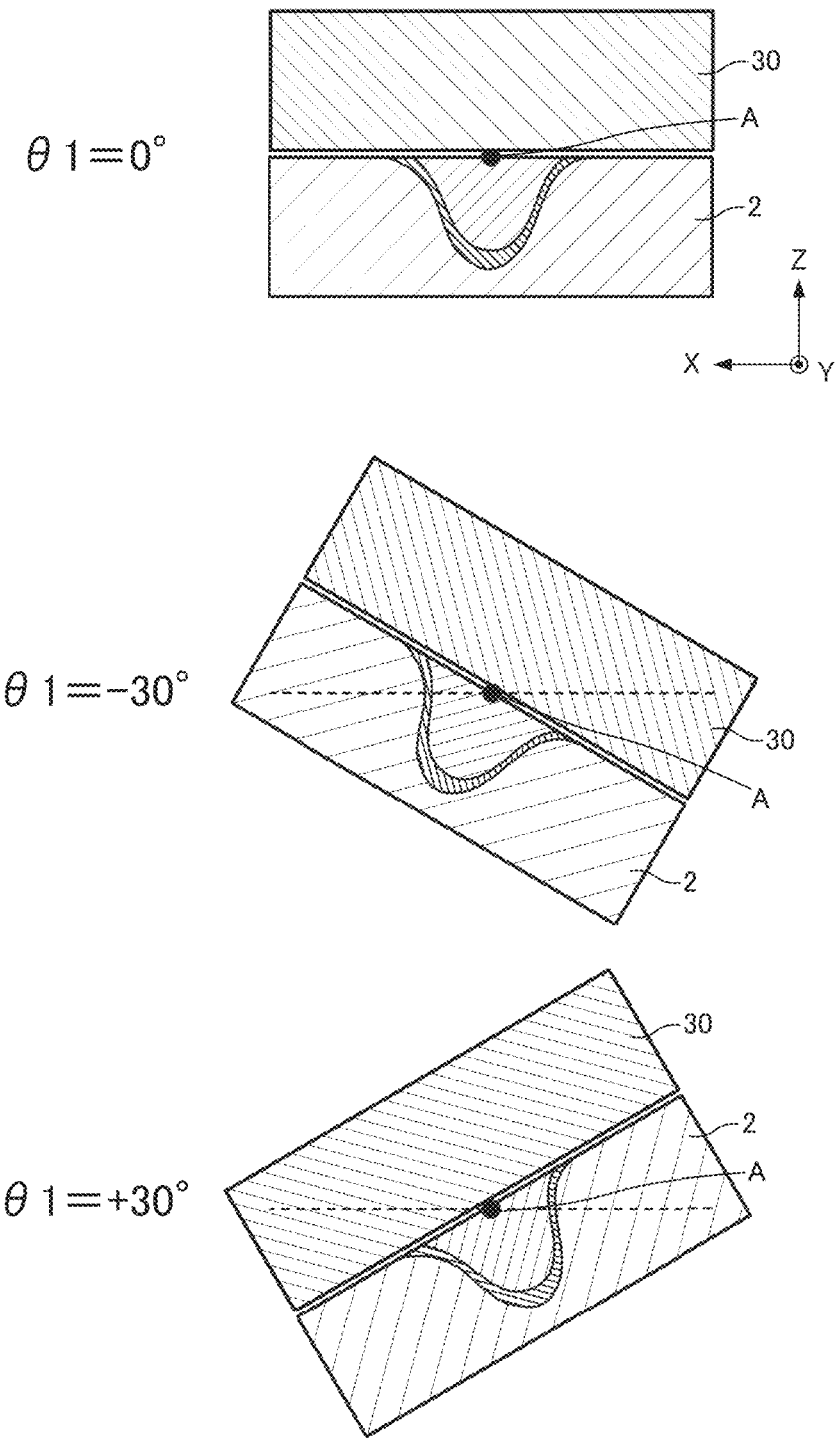
FIG. 4 illustrates an operation for swinging a specimen.
Figure 5:
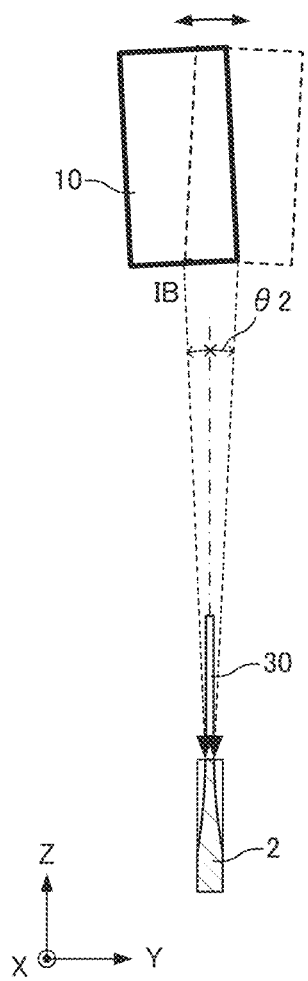
FIG. 5 illustrates an operation of an ion source.

FIGS. 3 to 5 illustrate the bulk machining method. FIG. 3 is a schematic perspective view illustrating the specimen 2 and the shielding member 30. FIG. 4 illustrates the swinging operation of the specimen 2. FIG. 5 illustrates an operation of the ion source 10.

In the specimen machining device 100, as illustrated in FIG. 3, the shielding member 30 is disposed on the specimen 2, and the ion beam IB is emitted from the ion source 10 disposed above the shielding member 30. The specimen 2 is irradiated with the ion beam IB through the shielding member 30.

As illustrated in FIG. 4, when the specimen 2 is machined by being irradiated with the ion beam IB, the swing mechanism of the specimen stage 20 is operated so as to swing the specimen 2 and the shielding member 30 using an axis A as the rotation axis. In other words, the swing mechanism of the specimen stage 20 causes the specimen 2 and the shielding member 30 to perform a reciprocating tilting (rotary) motion using the axis A as the tilting axis (the rotation axis). The axis A is parallel to the Y axis, for example. The axis A is positioned on a boundary between the specimen 2 and the shielding member 30, for example.

Note that FIG. 4 illustrates a point at which a tilt angle $\theta1$ of the specimen 2 is 0°, a point at which the tilt angle $\theta1$ of the specimen 2 is −30°, and a point at which the tilt angle $\theta1$ of the specimen 2 is +30°. Note that in FIG. 4, the tilt angle $\theta1$ is expressed as $\theta1=0°$ when the specimen 2 is parallel to the X axis, and expressed using "+" for counterclockwise and "−" for clockwise.

During machining of the specimen 2, as illustrated in FIG. 5, the ion source 10 is also swung. For example, the ion source 10 is tilted within a predetermined angle range relative to the Z axis. By swinging the ion source 10, the ion beam IB can be emitted from an oblique direction relative to a machining surface of the specimen 2. The ion source 10 is tilted so that an angle of incidence at which the ion beam IB becomes incident on the machining surface of the specimen 2 is approximately 2.5°, for example. In other words, the range of a tilt angle $\theta2$ of the ion source 10 is a range from −2.5° to +2.5°.

Thus, in the specimen machining device 100, machining is performed on the specimen 2 by irradiating the specimen 2 with the ion beam IB while swinging the specimen 2 and swinging the ion source 10.

The camera 60 photographs the specimen 2 during the machining. Images of the specimen 2 photographed by the camera 60 are sent to the information processing device 70 in real time. The information processing device 70 acquires the images photographed by the camera 60 and displays the acquired images on the display unit 76.

Figure 6:
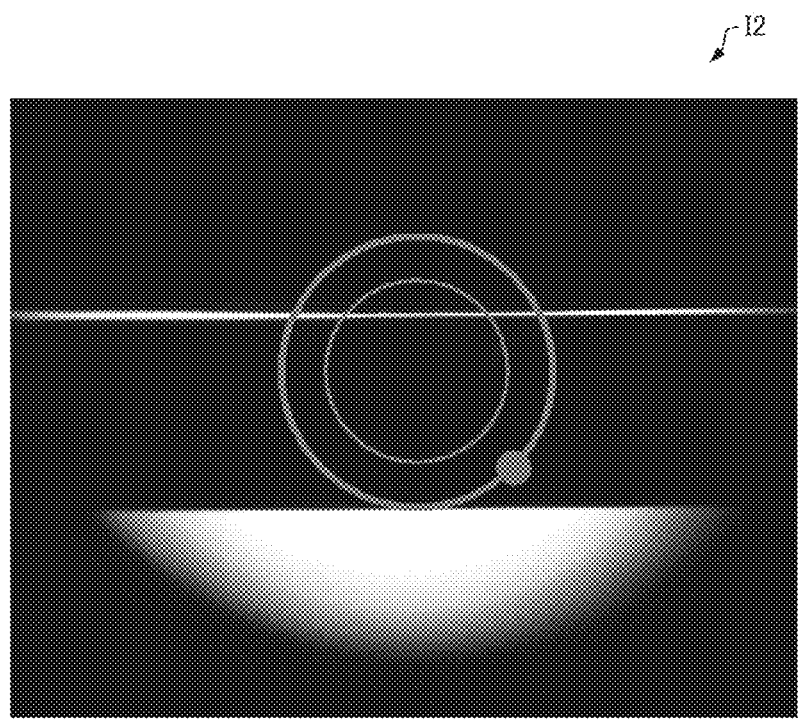
FIG. 6 is an example of an image photographed by a camera.

FIG. 6 is an example of an image I2 photographed by the camera 60. When the specimen 2 is machined using the bulk machining method, the specimen 2 is transmissively illuminated by the illumination light emitted by the transmission illumination device 40. It is therefore possible to confirm light leaking through a gap between the specimen 2 and the shielding member 30 on the image I2. It is also possible to confirm light intruding from the lower side of the specimen 2 on the image I2.

Note that a double circle cursor is displayed on the image I2. This cursor will be described hereafter.

2.2. Two-Stage Milling Method

The two-stage milling method is a method for preparing a specimen that is used to observe, from a cross-sectional direction, a thin film formed on a substrate, a laminated film which is formed on a substrate and on which wiring, a transistor, and so on are formed, or the like, for example. In the two-stage milling method, primary milling is performed to reduce the overall thickness of the specimen, and secondary milling is performed to reduce the thickness of the thin film or laminated film serving as the observation subject to a thickness enabling observation thereof under a transmission electron microscope.

2.2.1. Primary Milling

Figure 7:
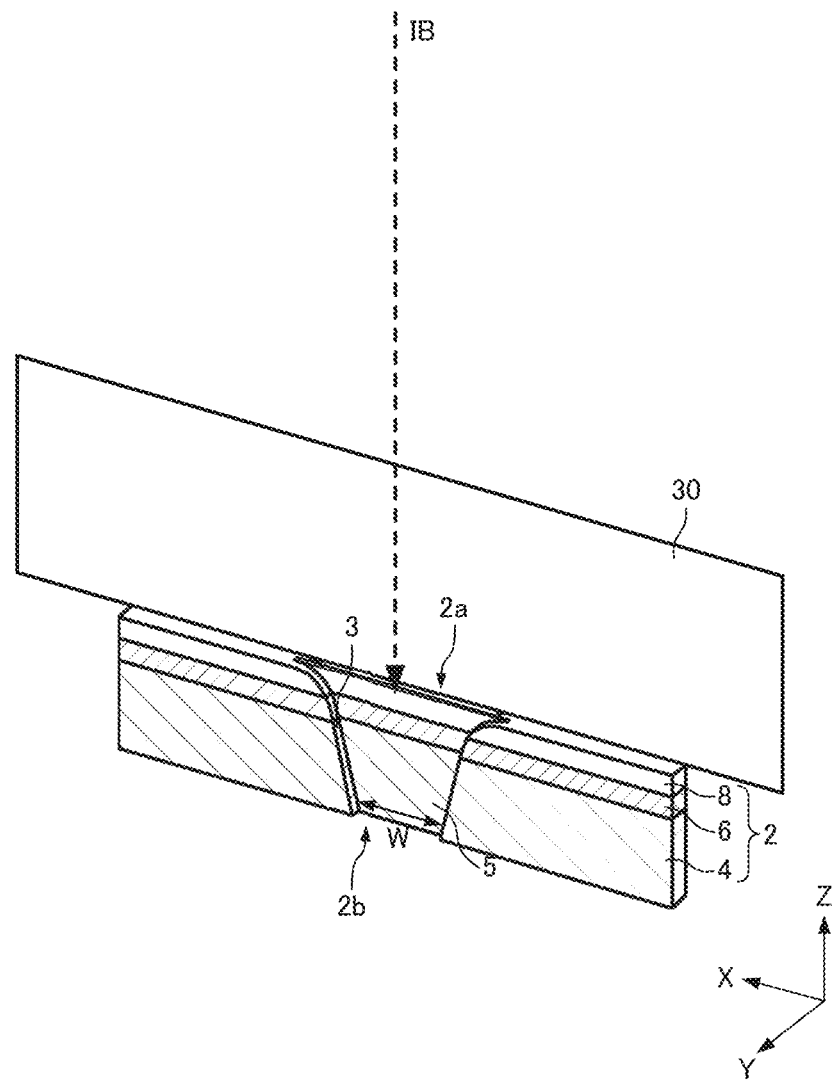
FIG. 7 is a schematic perspective view of a specimen and a shielding member.
Figure 8:
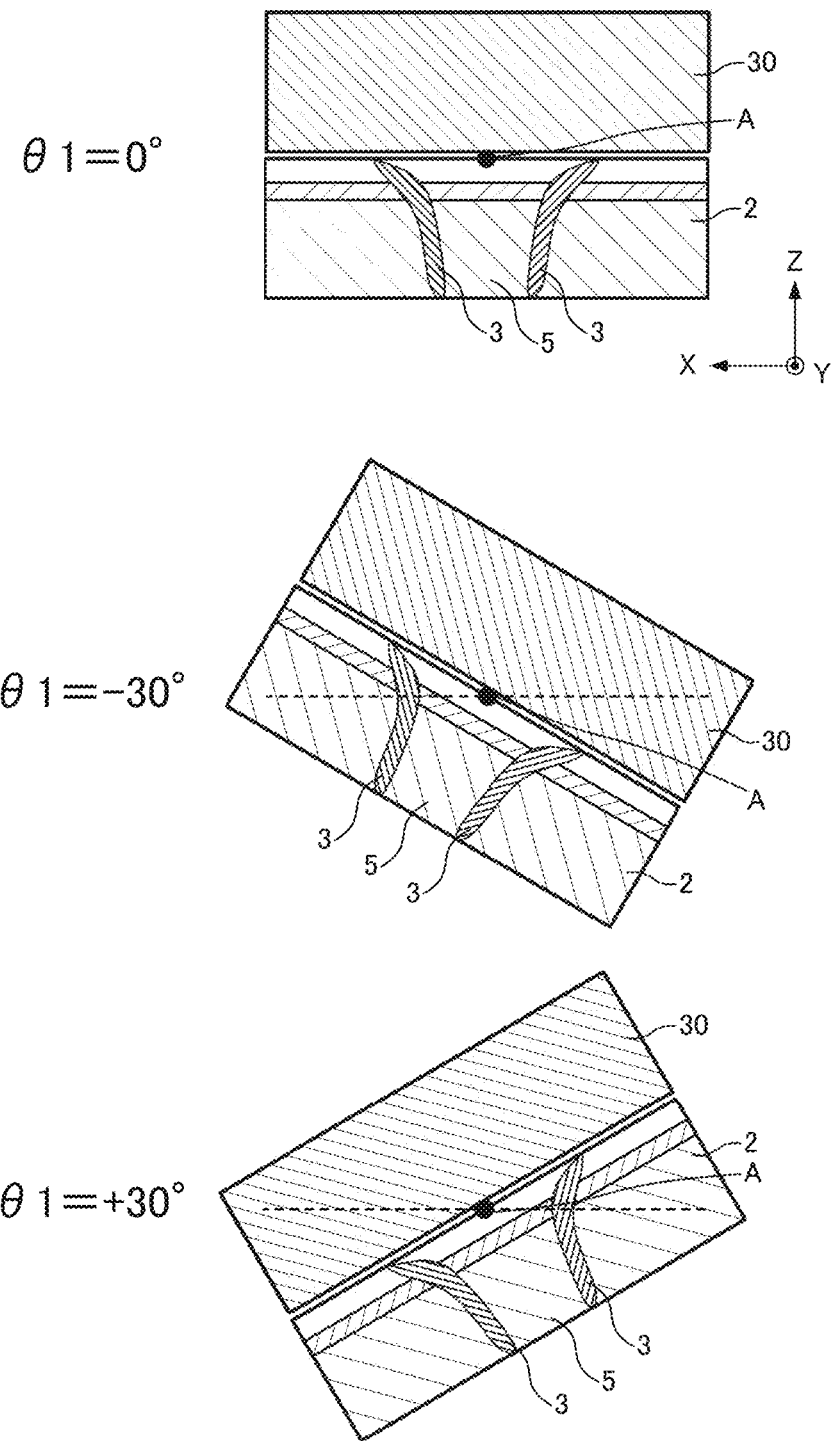
FIG. 8 illustrates an operation for swinging a specimen.

FIGS. 7 and 8 illustrate the primary milling. FIG. 7 is a schematic perspective view of the specimen 2 and the shielding member 30. FIG. 8 illustrates the swinging operation of the specimen 2.

As illustrated in FIG. 7, the specimen 2 includes a substrate 4, a laminated film 6, and a protective member 8. The substrate 4 is a semiconductor substrate such as a silicon substrate or a compound substrate, for example. The laminated film 6 includes wiring, a transistor, and so on, and is formed on the substrate 4 by a semiconductor manufacturing technique, for example. In the example in the figure, a specimen for use with a transmission electron microscope, which is used to observe the cross-section of the laminated film 6 formed on the substrate 4, for example, can be prepared. The protective member 8 is a member for protecting the laminated film 6 during machining, and is constituted by a glass substrate, for example. The protective member 8 is adhered to the laminated film 6 by epoxy resin or the like. The thickness of the protective member 8 is approximately 100 μm, for example.

The specimen 2 is machined into a plate shape in advance so that the height (the Z direction size) thereof is from 500 to 800 μm and the width (the Y direction size) thereof is approximately 100 μm.

Note that the configuration of the specimen 2 is not limited to the example illustrated in FIG. 7, and specimens having various configurations can be machined so as to be observable by a transmission electron microscope using the two-stage milling method.

In the primary milling, the specimen 2 is disposed so that a first end portion 2a of the specimen 2 faces upward and a second end portion 2b of the specimen 2 faces downward. The first end portion 2a of the specimen 2 is the end portion of the specimen 2 on the protective member 8 side, and the second end portion 2b of the specimen 2 is the end portion of the specimen 2 on the substrate 4 side. The specimen 2 is disposed under the shielding member 30 so as to be irradiated by the ion beam IB from the first end portion 2a side of the specimen 2. The specimen 2 is irradiated with the ion beam IB through the shielding member 30.

As illustrated in FIG. 8, when the specimen 2 is machined by being irradiated with the ion beam IB, the swing mechanism of the specimen stage 20 is operated so as to swing the specimen 2 and the shielding member 30 using the axis A as the rotation axis. In other words, the swing mechanism of the specimen stage 20 causes the specimen 2 and the shielding member 30 to perform a reciprocating tilting (rotary) motion using the axis A as the tilting axis (the rotation axis).

As illustrated in FIG. 5, during machining of the specimen 2, the ion source 10 is also swung. For example, the ion source 10 is tilted within a predetermined angle range relative to the Z axis. By swinging the ion source 10, the ion beam IB can be emitted from an oblique direction relative to the machining surface of the specimen 2. The ion source 10 is tilted so that the angle of incidence at which the ion beam IB becomes incident on the machining surface of the specimen 2 is approximately 0.4°, for example. In other words, the range of the tilt angle $\theta2$ of the ion source 10 is a range from −0.4° to +0.4°. The tilt angle $\theta2$ of the ion source 10 can be modified as appropriate in accordance with the material of the specimen 2 and so on, for example.

Thus, in the specimen machining device 100, machining is performed on the specimen 2 by irradiating the specimen 2 with the ion beam IB while swinging the specimen 2 and swinging the ion source 10. In the primary milling, two inclined surfaces 3 and a machined region 5 between the two inclined surfaces 3 are formed as a result of the machining. In the primary milling, machining is performed so that the entire machined region 5 has a substantially identical thickness to the thickness of the shielding member 30. Note that in the primary milling, machining may be performed so that the machined region 5 has a substantially identical thickness to the shielding member 30 and the film thickness thereof increases steadily from the first end portion 2a toward the second end portion 2b.

In the primary milling, the machining is terminated when the second end portion 2b of the specimen 2 reaches a suitable thickness for the secondary milling. In the secondary milling, as will be described below, the specimen 2 is disposed so that the second end portion 2b faces upward and the first end portion 2a faces downward, whereupon the ion beam IB is emitted from the second end portion 2b side. Hence, when the thickness of the specimen 2 on the second end portion 2b side is large, for example, the amount of the ion beam IB emitted onto the second end portion 2b side increases such that the second end portion 2b side is shaved rapidly. As a result, the specimen 2 may disappear before the laminated film 6 is reduced in thickness. It is therefore necessary to set the second end portion 2b of the specimen 2 at a suitable thickness for the secondary milling during the primary milling.

Here, the thickness of the second end portion 2b of the specimen 2 cannot be confirmed from the image photographed by the camera 60. Therefore, a timing at which to terminate the machining of the primary milling is determined using the width of the machined region 5 on the second end portion 2b side of the specimen 2, or in other words a machined width W in FIG. 7, as a guide. In the specimen machining device 100, the machined region 5 of the specimen 2 becomes thinner and the machined width W increases as the machining progresses. Therefore, the thickness of the machined region 5 can be estimated from the machined width W.

For example, by setting the machined width W at approximately from 300 to 600 μm, the thickness of the second end portion 2b of the specimen 2 can be set at approximately 10 μm, which is a suitable thickness for the secondary milling.

The camera 60 photographs the specimen 2 during the machining. Images of the specimen 2 photographed by the camera 60 are sent to the information processing device 70. The information processing device 70 acquires the images photographed by the camera 60 and displays the acquired images on the display unit 76.

Figure 9:
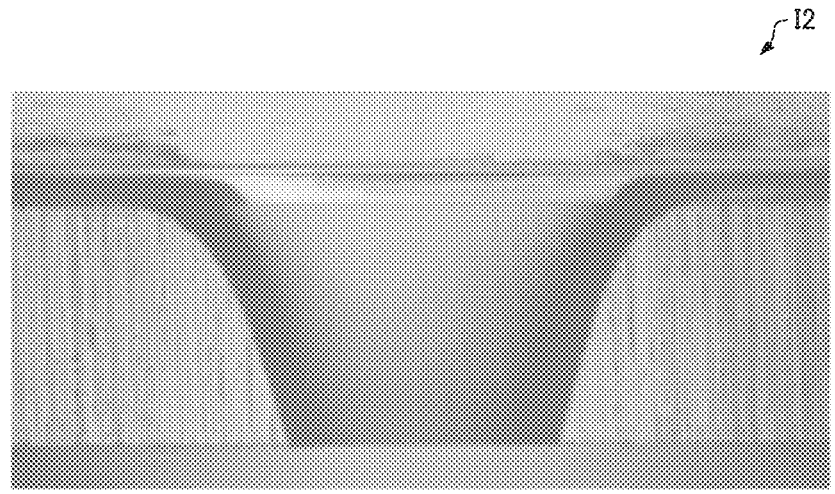
FIG. 9 is an example of an image photographed by a camera.

FIG. 9 is an example of the image I2 photographed by the camera 60. The image I2 illustrated in FIG. 9 is an image acquired by photographing the specimen 2 using the camera 60 when the specimen 2 is illuminated by coaxial illumination and transmission illumination.

The specimen 2 is illuminated by coaxial illumination, and therefore, on the image I2, as illustrated in FIG. 9, the machined region 5 of the specimen 2, an unmachined region of the specimen 2, and the shielding member 30 are light, while the inclined surfaces 3 are dark. The reason for this is that during the coaxial illumination, the illumination light is reflected toward the camera 60 only by surfaces that are perpendicular to the observation direction (the optical axis of the camera 60). The inclined surfaces 3 are not perpendicular to the observation direction, and therefore the illumination light reflected by the inclined surfaces 3 does not travel toward the camera 60. Hence, on the image I2, the inclined surfaces 3 are dark. With coaxial illumination, the orientations of the surfaces of the respective regions of the specimen 2 do not change even when the specimen 2 is swung. With coaxial illumination, therefore, an image on which the inclined surfaces 3 are dark is acquired at all times, even when the specimen 2 is swung during the machining.

The specimen 2 is also illuminated by transmission illumination, and therefore, as illustrated in FIG. 9, the illumination light leaks through the gap between the specimen 2 and the shielding member 30. The illumination light also intrudes from below the specimen 2. Hence, on the image I2, the gap between the specimen 2 and the shielding member 30 and the space below the specimen 2 are light. As a result, on the image I2, only the inclined surfaces 3 are dark.

In the information processing device 70, the two inclined surfaces 3 are extracted from the image I2 using the fact that only the two inclined surfaces 3 are dark, and the machined width W is measured by measuring the distance between the two extracted inclined surfaces 3.

2.2.2. Secondary Milling

Figure 10:
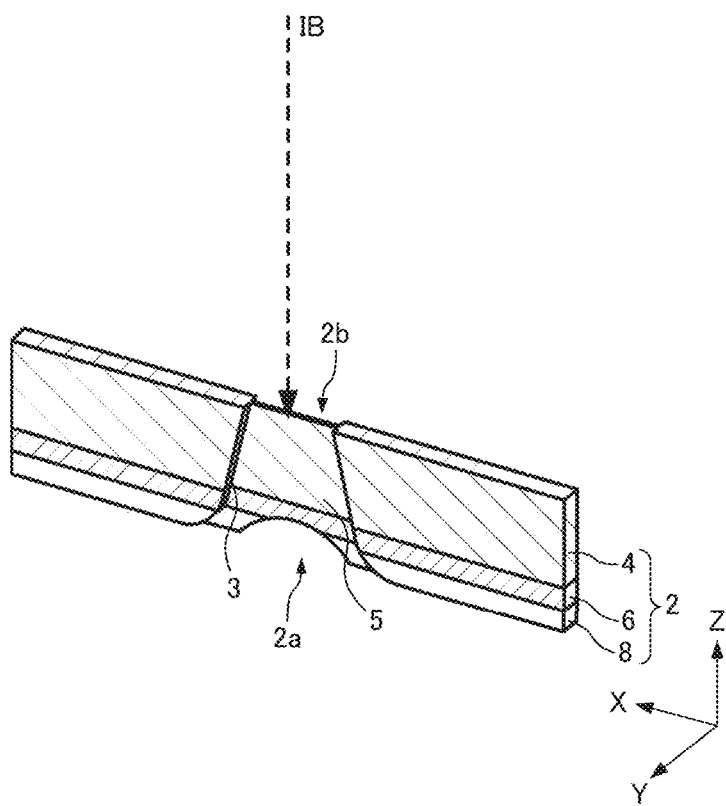
FIG. 10 illustrates secondary milling.

FIG. 10 illustrates the secondary milling.

As illustrated in FIG. 10, in the secondary milling, the specimen 2 is disposed so that the second end portion 2b of the specimen 2 faces upward and the first end portion 2a of the specimen 2 faces downward. In the secondary milling, the ion beam IB is emitted from the second end portion 2b side of the specimen 2. In the secondary milling, the ion beam IB is emitted directly onto the specimen 2, without using the shielding member 30.

In the secondary milling, the specimen 2 is machined until the laminated film 6 on the specimen 2 is formed into a thin film that can be observed by a transmission electron microscope.

3. Specimen Machining Method

3.1. Bulk Machining

3.1.1. Flow of Bulk Machining Processing

Figure 11:
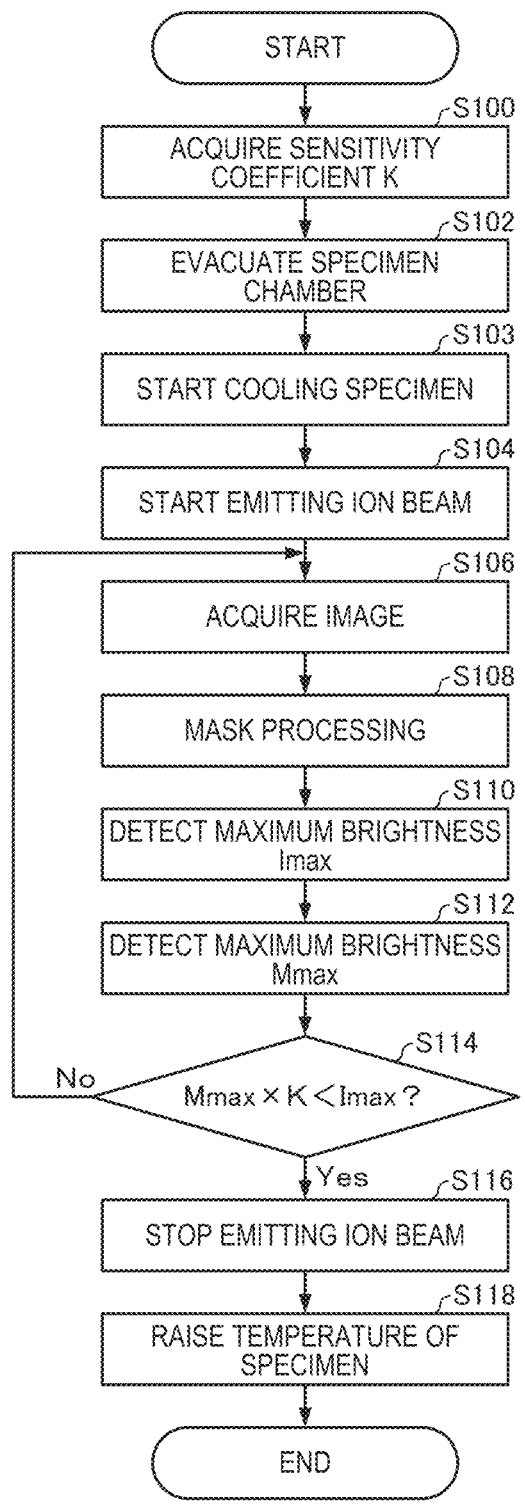
FIG. 11 is a flowchart illustrating an example of bulk machining processing.

In the specimen machining device 100, the machining control unit 720 performs bulk machining processing for machining the specimen 2 using the bulk machining method. FIG. 11 is a flowchart illustrating an example of bulk machining processing.

When the user inputs information indicating a sensitivity coefficient K and machining conditions via the operation unit 74, the machining control unit 720 stores the input information indicating the sensitivity coefficient K and the machining conditions in the storage unit 78 (S100).

The sensitivity coefficient K is a coefficient indicating a sensitivity at which to detect the light passing through the specimen 2. The sensitivity coefficient K takes a value larger than 0% and 100% or less. In other words, $0<K\leq1$. The user can set the sensitivity coefficient K by operating the operation unit 74, for example. The machining control unit 720 acquires information indicating the set sensitivity coefficient K based on operation information from the operation unit 74 and stores the acquired information in the storage unit 78.

For example, when the specimen 2 has a light transmitting property, the sensitivity coefficient K is set at approximately 90% (K=0.9). When the specimen 2 does not have a light transmitting property, the sensitivity coefficient K is set at approximately 50% (K=0.5). Glass is an example of a specimen 2 having a light transmitting property. Silicon, a metal, and so on are examples of specimens 2 not having a light transmitting property.

The user sets the specimen 2 on the specimen stage 20 and sets the shielding member 30 on the specimen 2. Then, when the user inputs an instruction to start the bulk machining processing through the operation unit 74, the machining control unit 720 causes the evacuation device 14 to evacuate the specimen chamber 11 (S102). The machining control unit 720 acquires a measurement result of the pressure in the specimen chamber 11 from the pressure gauge 16 and determines whether or not the pressure in the specimen chamber 11 has reached a set pressure.

Having determined that the pressure in the specimen chamber 11 has reached the set pressure, the machining control unit 720 operates the cooler 22 to start cooling the specimen 2 (S103). The machining control unit 720 then acquires a measurement result of the temperature of the specimen 2 from the temperature sensor 26 and determines whether or not the temperature of the specimen 2 has reached a set temperature.

In the specimen machining device 100, machining is performed on the specimen 2 while cooling the specimen 2. As a result, damage to the specimen 2 caused by the machining can be reduced.

Having determined that the temperature of the specimen 2 has reached the set temperature, the machining control unit 720 starts processing for emitting the ion beam IB (S104). More specifically, the machining control unit 720 generates a control signal for emitting the ion beam IB and sends the generated control signal to the control circuit 12. The control circuit 12 generates a drive signal based on the control signal and outputs the drive signal to the ion source 10. As a result, the specimen 2 is irradiated with the ion beam IB from the ion source 10. At this time, the swing mechanism of the specimen stage 20 swings the specimen 2 and the shielding member 30.

In the specimen machining device 100, as described above, the specimen 2 is machined by irradiating the specimen 2 with the ion beam IB through the shielding member 30 while swinging the specimen 2 and the shielding member 30. While the specimen 2 is being machined, the camera 60 photographs the specimen 2 in real time.

When emission of the ion beam IB is started, the machining control unit 720 acquires the image I2 of the specimen 2, photographed by the camera 60 (S106).

Figure 12:
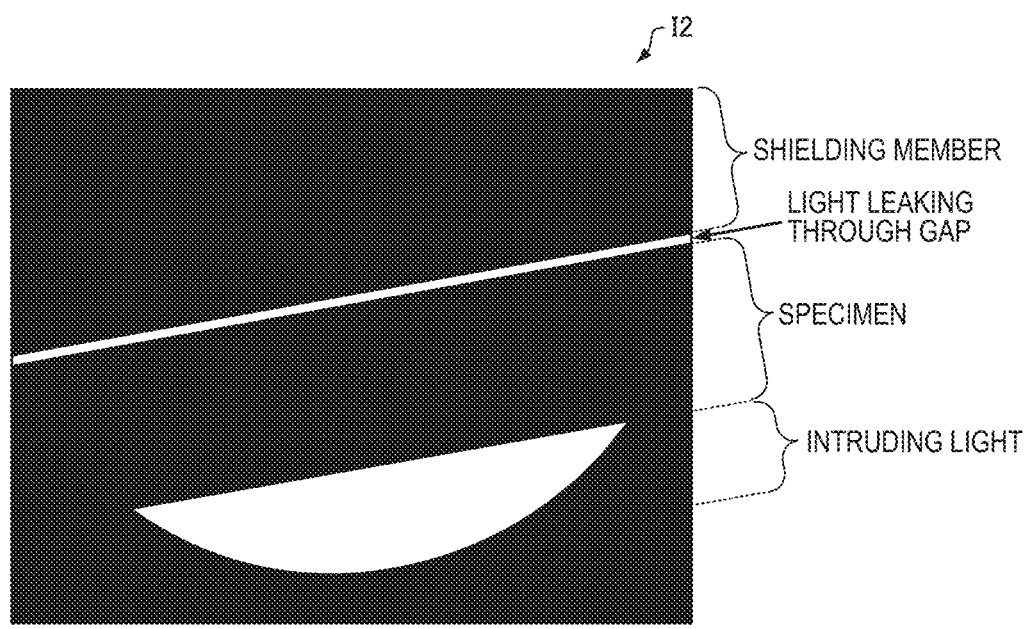
FIG. 12 is an example of an image photographed by a camera.

FIG. 12 schematically illustrates the image I2 photographed by the camera 60.

As illustrated in FIG. 12, an image corresponding to the shielding member 30, an image corresponding to the specimen 2, the light leaking through the gap between the shielding member 30 and the specimen 2, and the light intruding from below the specimen 2 can be confirmed on the image I2.

The machining control unit 720 masks the light leaking through the gap between the specimen 2 and the shielding member 30 and the light intruding from below the specimen 2 on the acquired image I2 (S108).

Figure 13:
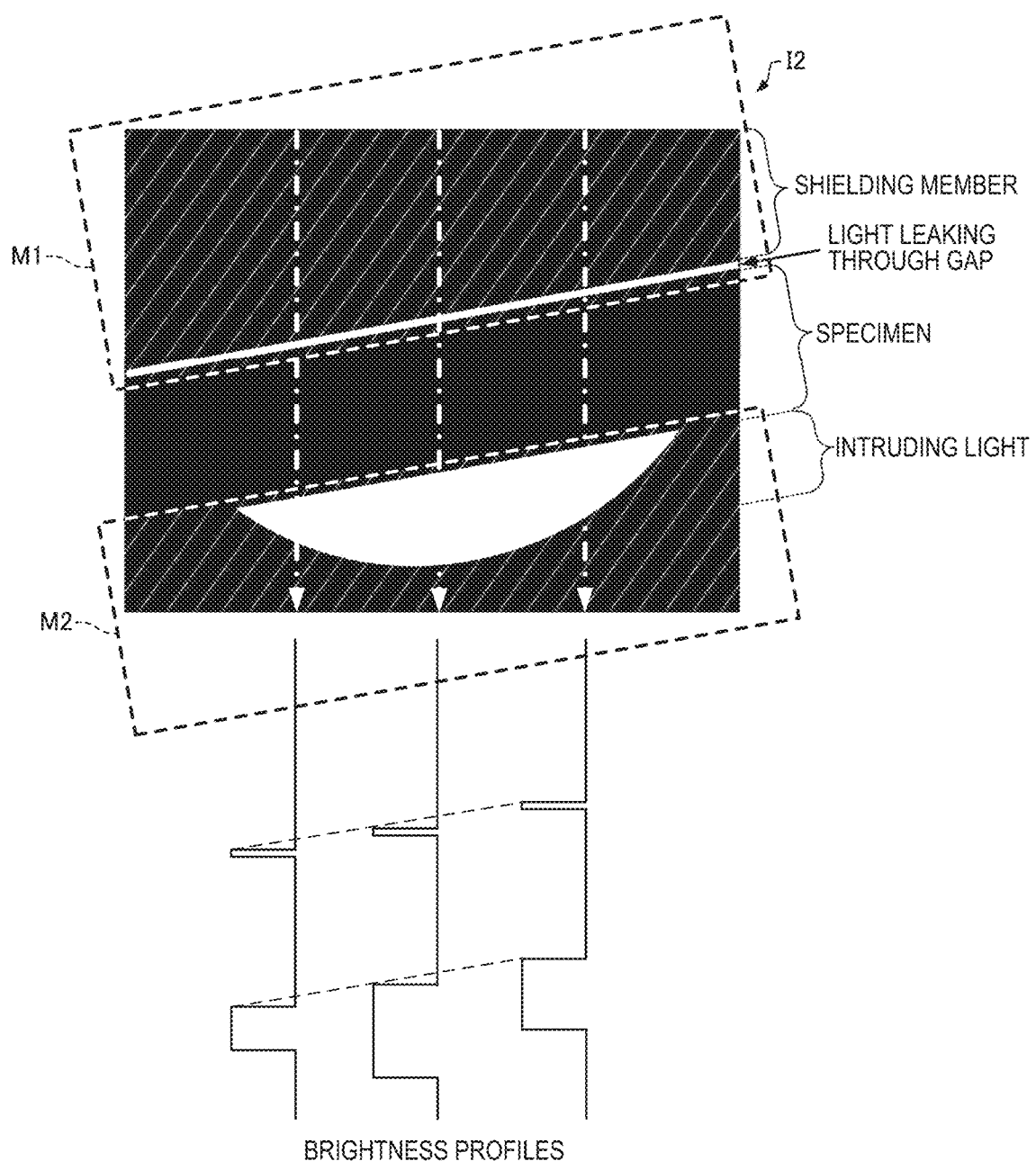
FIG. 13 illustrates mask processing.

FIG. 13 illustrates mask processing performed on the image I2.

The machining control unit 720 masks the light leaking through the gap and the light intruding from below the specimen 2 based on a brightness distribution of the image I2. For example, as illustrated in FIG. 13, the machining control unit 720 acquires a plurality of brightness profiles in a vertical direction of the image I2 and masks the light leaking through the gap and the light intruding from below the specimen 2 based on the brightness profiles. The vertical direction of the image I2 is a direction extending along the Z axis in FIG. 1. In the example in FIG. 13, three brightness profiles are shown, but there are no particular limitations on the number of acquired brightness profiles, and a brightness profile may be acquired for each pixel arranged in a horizontal direction of the image I2.

The shape of a mask region M1 for masking the gap is rectangular, for example. The mask region M1 completely covers the light leaking through the gap. One side of the mask region M1 is parallel with the upper end of the specimen 2. A lower end of the mask region M1 is positioned below the upper end of the specimen 2.

The shape of a mask region M2 for masking the intruding light is rectangular, for example. The mask region M2 completely covers the light intruding from below the specimen 2. One side of the mask region M2 is parallel with the lower end of the specimen 2. An upper end of the mask region M2 is positioned above the lower end of the specimen 2.

The machining control unit 720 calculates the tilt angle of the specimen 2 based on the brightness profiles of the image I2 and tilts the region to be masked in accordance with the tilt angle. For example, as illustrated in FIG. 13, first, the position of the lower end of the shielding member 30 is specified in each of the plurality of brightness profiles, whereupon the tilt angle of the shielding member 30, or in other words the tilt angle of the specimen 2, is determined based on the position of each of the specified lower ends. The size of the gap and a predetermined size are then added to the position of the lower end of the shielding member 30, and the result is set as the edge of the mask region M1. The predetermined size is added in order to include the upper end of the specimen 2 in the mask region M1. The predetermined size can be set as appropriate.

Similarly with regard to the mask region M2, the position of the lower end of the specimen 2 is specified in each of the plurality of brightness profiles, whereupon the size of the gap and a predetermined size are added to the position of the lower end of the specimen 2 and the result is set as the edge of the mask region M2.

In the example in FIG. 13, the tilt angle of the specimen 2 is 10°, and therefore the mask region M1 and the mask region M2 are inclined by 10° relative to the horizontal direction of the image. By masking the light leaking through the gap and the light intruding from below the specimen 2 based on the brightness distribution of the image I2 in this manner, the machining control unit 720 tilts the mask region M1 and the mask region M2 in accordance with the tilt angle of the specimen 2.

By forming the mask region M1 for masking the light leaking through the gap and the mask region M2 for masking the light intruding from below the specimen 2, a region corresponding to the specimen 2 can be extracted from the image I2.

Note that as long as the light leaking through the gap and the light intruding from below the specimen 2 can be masked, the mask processing method is not limited to the method described above.

Next, the machining control unit 720 detects a maximum brightness Imax of a non-masked region, excluding the mask region M1 and the mask region M2, of the image I2 (S110).

Figure 14:
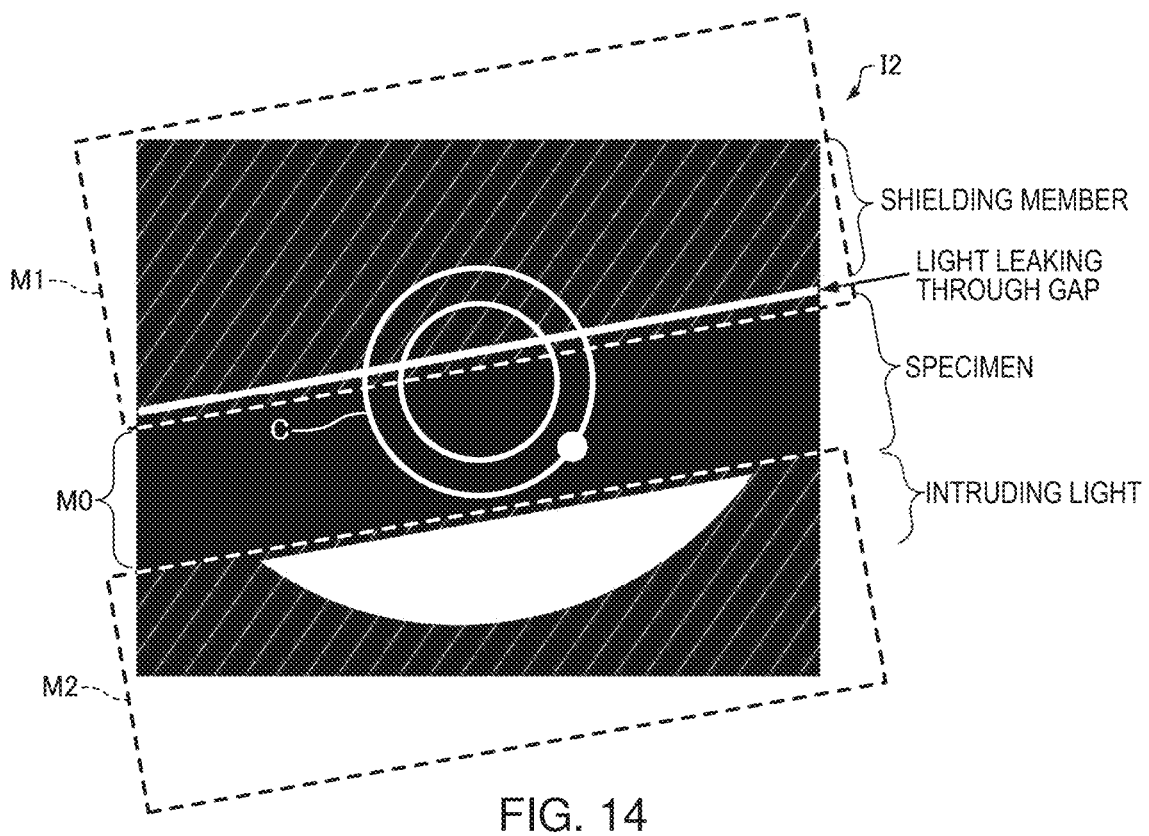
FIG. 14 illustrates processing for detecting the brightness of a non-masked region.

FIG. 14 illustrates processing for detecting the brightness of a non-masked region M0.

On the image I2, the non-masked region M0 is a region excluding the mask region M1 and the mask region M2 and a region corresponding to the specimen 2. Accordingly, the maximum brightness Imax of the non-masked region M0 corresponds to the maximum brightness of the region corresponding to the specimen 2. In other words, in the processing S110 for detecting the maximum brightness Imax, the maximum brightness of the region corresponding to the specimen 2 is detected.

The machining control unit 720 detects the maximum brightness Imax of the non-masked region M0 within a region specified on the image I2 by the cursor C. Note that instead of specifying a region using the cursor C, the maximum brightness Imax of the non-masked region M0 may be detected over the entire image I2.

Next, the machining control unit 720 detects a maximum brightness Mmax of the mask region M1 on the image I2 (S112). The maximum brightness Mmax of the mask region M1 corresponds to the maximum brightness of the light leaking through the gap. In other words, in the processing S112 for detecting the maximum brightness Mmax, the maximum brightness of the light leaking through the gap is detected.

The machining control unit 720 determines whether to terminate the machining based on the maximum brightness Imax and the maximum brightness Mmax (S114).

For example, when the maximum brightness Imax is larger than a value acquired by multiplying the maximum brightness Mmax by the sensitivity coefficient K, or in other words when Mmax×K<Imax is satisfied, the machining control unit 720 determines that the machining is to be terminated. For example, when the sensitivity coefficient K is set at 50% and the brightness of the light passing through the specimen 2 is greater than 50% of the brightness of the light leaking through the gap, it is determined that the machining is to be terminated.

Note that a determination may be made as to whether or not Imax/Mmax>K is satisfied, and it may be determined that the machining is to be terminated when Imax/Mmax>K is satisfied.

After determining that Mmax×K<Imax is not satisfied (No in S114), the machining control unit 720 returns to the processing S106 and acquires an image photographed by the camera 60.

Thus, the machining control unit 720 repeats the processing S106 for acquiring the image, the mask processing S108, the processing S110 for detecting the maximum brightness Imax, the processing S112 for detecting the maximum brightness Mmax, and the processing S114 for determining whether to terminate the machining until it is determined that Mmax×K<Imax is satisfied.

After determining that Mmax×K<Imax is satisfied (Yes in S114), the machining control unit 720 causes the ion source 10 to stop emitting the ion beam IB (S116).

The machining control unit 720 generates a control signal for stopping emission of the ion beam IB and sends the generated control signal to the control circuit 12. The control circuit 12 stops outputting the drive signal based on the control signal. As a result, emission of the ion beam IB by the ion source 10 is stopped.

Figure 15:
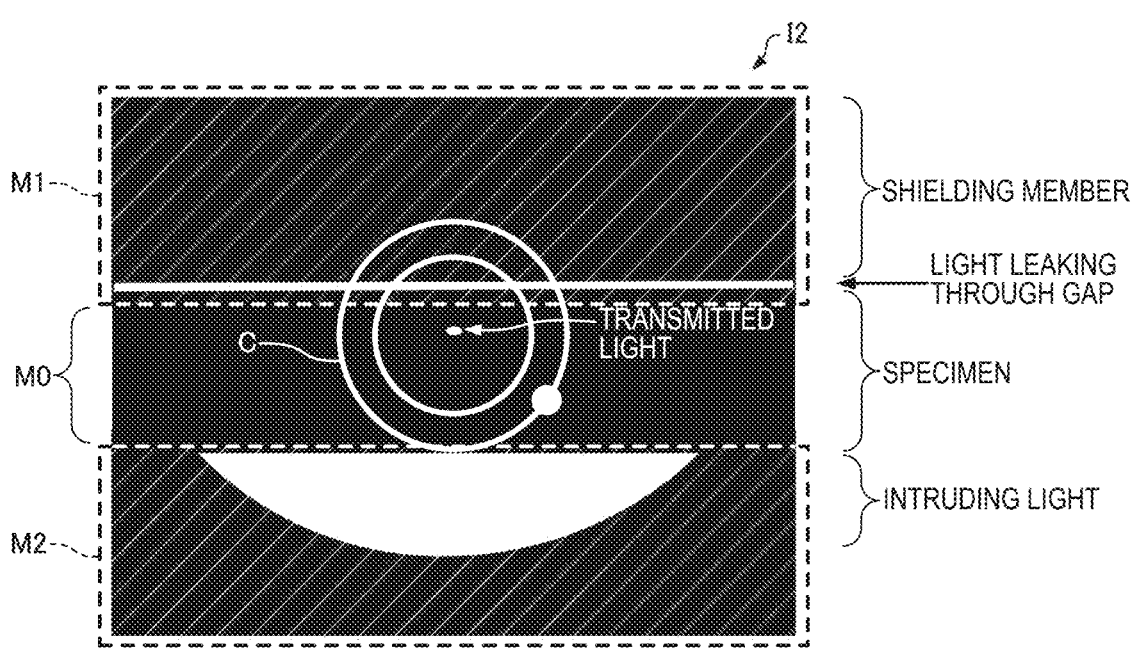
FIG. 15 schematically illustrates an image photographed by the camera.

FIG. 15 schematically illustrates the image I2 photographed by the camera 60.

When the machining progresses such that the machined region of the specimen 2 becomes thinner, the illumination light is transmitted through the specimen 2. When the illumination light is transmitted through the specimen 2, the brightness of the region of the image I2 that corresponds to the transmitted light increases. The machining control unit 720 detects the increase in brightness by detecting the maximum brightness Imax of the image I2 and determines that the machining is to be terminated.

Note that in a case where light is not transmitted even after the machined region of the specimen 2 becomes thinner, a very small hole opens in the specimen 2 as the machining progresses, and when this hole opens, the illumination light is transmitted through the hole, leading to an increase in the brightness of the region corresponding to the hole. Hence, likewise when light is not transmitted even after the machined region of the specimen 2 becomes thinner, it is possible to determine whether to terminate the machining in a similar manner. Moreover, even when the specimen 2 has a light transmitting property, it is possible to detect a difference between the brightness of the gap and the brightness of the light that is transmitted through the specimen 2 having a light transmitting property on the image I2. Therefore, by increasing the sensitivity coefficient K, it is possible to determine whether to terminate the machining in a similar manner even when the specimen 2 has a light transmitting property.

After stopping emission of the ion beam IB, the machining control unit 720 stops the operation of the cooler 22 and operates the heater 24 in order to raise the temperature of the specimen 2 to room temperature (S118). The machining control unit 720 acquires the measurement result of the temperature of the specimen 2 from the temperature sensor 26 and determines whether or not the temperature of the specimen 2 has reached a set temperature (room temperature, for example).

When the temperature of the specimen 2 has reached the set temperature, the machining control unit 720 terminates the bulk machining processing.

Note that in the example in FIG. 11, described above, the processing S103 for cooling the specimen 2 and the processing S118 for raising the temperature of the specimen 2 are performed, but the processing S103 and the processing S118 may be omitted. In other words, although a case in which the machining is performed while cooling the specimen 2 was described above, the machining may be performed at room temperature without cooling the specimen 2.

3.1.2. Control of Ion Beam

When the specimen 2 is machined by irradiating the specimen 2 with the ion beam IB, the specimen 2 is damaged by the ion beam IB such that a damage layer is formed on the specimen 2. In order to reduce the thickness of this damage layer, it is desirable to machine the specimen 2 using a low-energy ion beam IB.

With a low-energy ion beam IB, however, the machining time increases, and it is therefore desirable to change the machining conditions in accordance with the thickness of the specimen 2. For example, while the specimen 2 is in a thick state, machining is performed using a high-energy ion beam IB, and once the specimen 2 has become thinner, machining is performed using a low-energy ion beam IB.

The machining control unit 720 changes an irradiation condition of the ion beam IB based on the acquired image I2. Thus, the machining conditions can be controlled in accordance with the thickness of the specimen 2. The machining conditions include the acceleration voltage of the ion beam IB, the flow rate of a gas introduced into the ion source 10, and so on.

For example, with a specimen that transmits light when the thickness thereof decreases, such as silicon, the brightness of the transmitted light transmitted through the specimen corresponds to the thickness of the specimen 2. Accordingly, the user sets machining conditions corresponding to the brightness of the transmitted light in advance, whereupon the machining control unit 720 detects the brightness of the transmitted light from the image I2 and changes the machining conditions in accordance with the detected brightness of the transmitted light. In this manner, the machining conditions can be changed in accordance with the thickness of the specimen 2.

FIG. 16 is a table illustrating acceleration voltages set in accordance with the brightness of the transmitted light. In FIG. 16, the brightness of the transmitted light transmitted through the specimen 2 is expressed as Imax/Mmax (%).

As illustrated in FIG. 16, the acceleration voltage is set in accordance with the brightness of the transmitted light. Note that by setting transmitted light brightness values corresponding to the status of the specimen in advance, the acceleration voltage may be set from the status of the specimen. For example, by associating "until the specimen starts to become thinner" with "transmitted light brightness 18%", when the user selects "until the specimen starts to become thinner", the acceleration voltage is changed at the point where the brightness of the transmitted light reaches 18%.

After a hole opens in the specimen 2, the acceleration voltage is changed in accordance with the elapsed time as finish machining.

Figure 17:
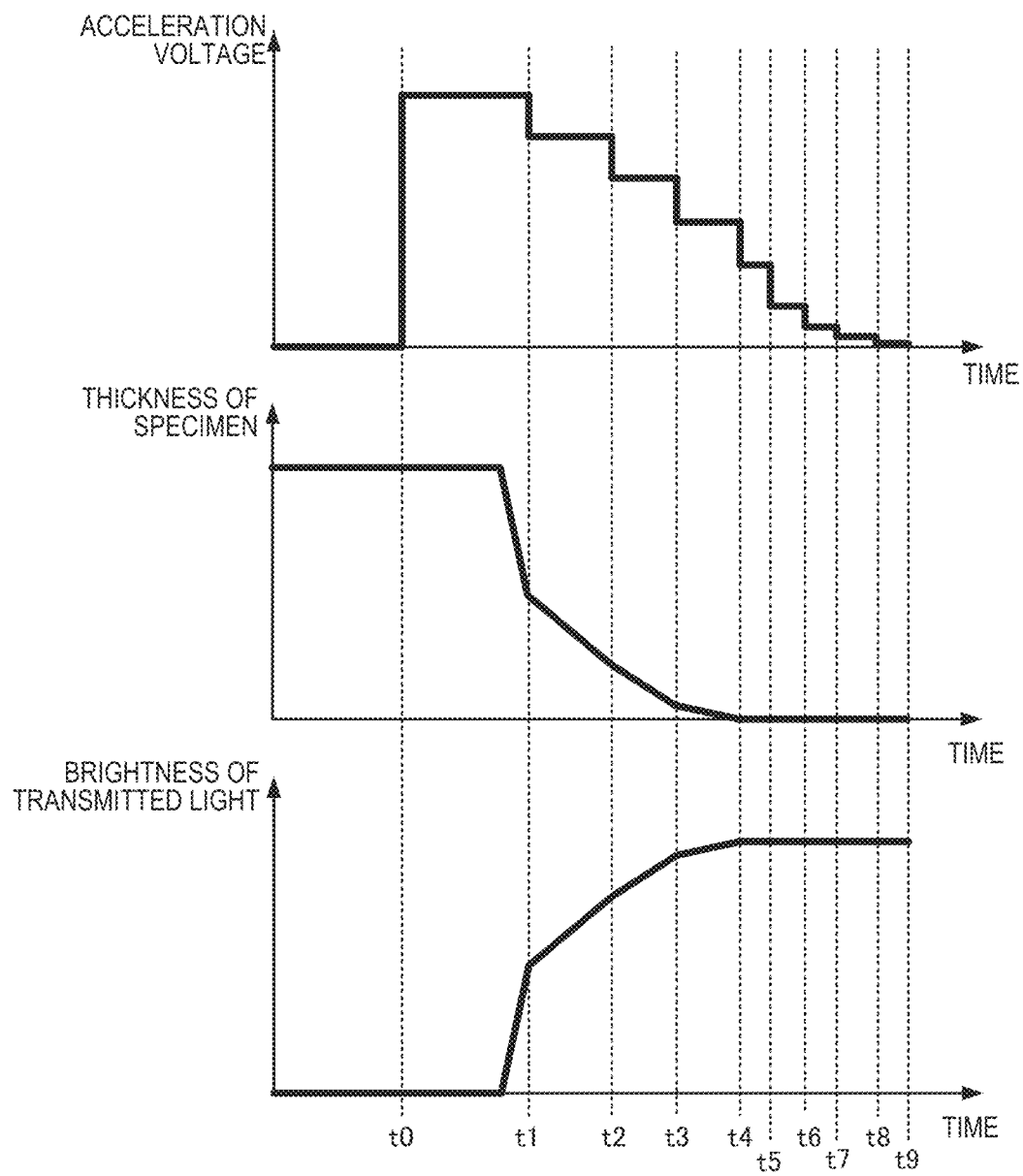
FIG. 17 illustrates machining statuses.

FIG. 17 illustrates statuses of the machining. FIG. 17 illustrates a graph of variation in the acceleration voltage, a graph of variation in the thickness of the specimen 2, and a graph of variation in the brightness of the light (the transmitted light) that is transmitted through the specimen 2.

On the graph of variation in the acceleration voltage, the horizontal axis shows time and the vertical axis shows the acceleration voltage. On the graph of variation in the thickness of the specimen 2, the horizontal axis shows time and the vertical axis shows the thickness of the specimen 2. On the graph of variation in the brightness of the transmitted light, the horizontal axis shows time and the vertical axis shows the brightness of the transmitted light.

When the conditions in the table in FIG. 16 are set, the machining control unit 720 detects the brightness of the transmitted light from the image I2 and changes the acceleration voltage in accordance with the brightness of the transmitted light while following the conditions in the table in FIG. 16.

More specifically, as illustrated in FIG. 17, the machining control unit 720 sets the acceleration voltage at 6.0 kV at a time t0. The machining control unit 720 then detects the brightness (Imax/Mmax) of the transmitted light on the acquired image I2, and when the brightness of the transmitted light reaches 18%, changes the acceleration voltage to 5.0 kV. On the graph in FIG. 17, the acceleration voltage is changed to 5.0 kV at a time t1. Similarly, the machining control unit 720 changes the acceleration voltage to 4.0 kV when the brightness of the transmitted light reaches 20% (a time t2), changes the acceleration voltage to 3.0 kV when the brightness of the transmitted light reaches 23% (a time t3), and changes the acceleration voltage to 2.0 kV when the brightness of the transmitted light reaches 50% (a time t4). At the time t4, a hole opens in the specimen 2.

In accordance with the table in FIG. 16, the machining control unit 720 implements machining at an acceleration voltage of 2.0 kV for five minutes from the time t4 to a time t5, then implements machining at an acceleration voltage of 1.0 kV for five minutes from the time t5 to a time t6. Similarly, the machining control unit 720 implements machining at an acceleration voltage of 0.5 kV for five minutes from the time t6 to a time t7, implements machining at an acceleration voltage of 0.3 kV for five minutes from the time t7 to a time t8, and implements machining at an acceleration voltage of 0.1 kV for five minutes from the time t8 to a time t9.

Note that in the example described above, the conditions are changed based on the intensity of the transmitted light in a case where the specimen 2 transmits light when the thickness thereof decreases, but in a case where the specimen 2 is a metal or the like that does not transmit light even when the thickness thereof decreases, the machining conditions may be changed based on the depth of the machined region 5.

Figure 20:
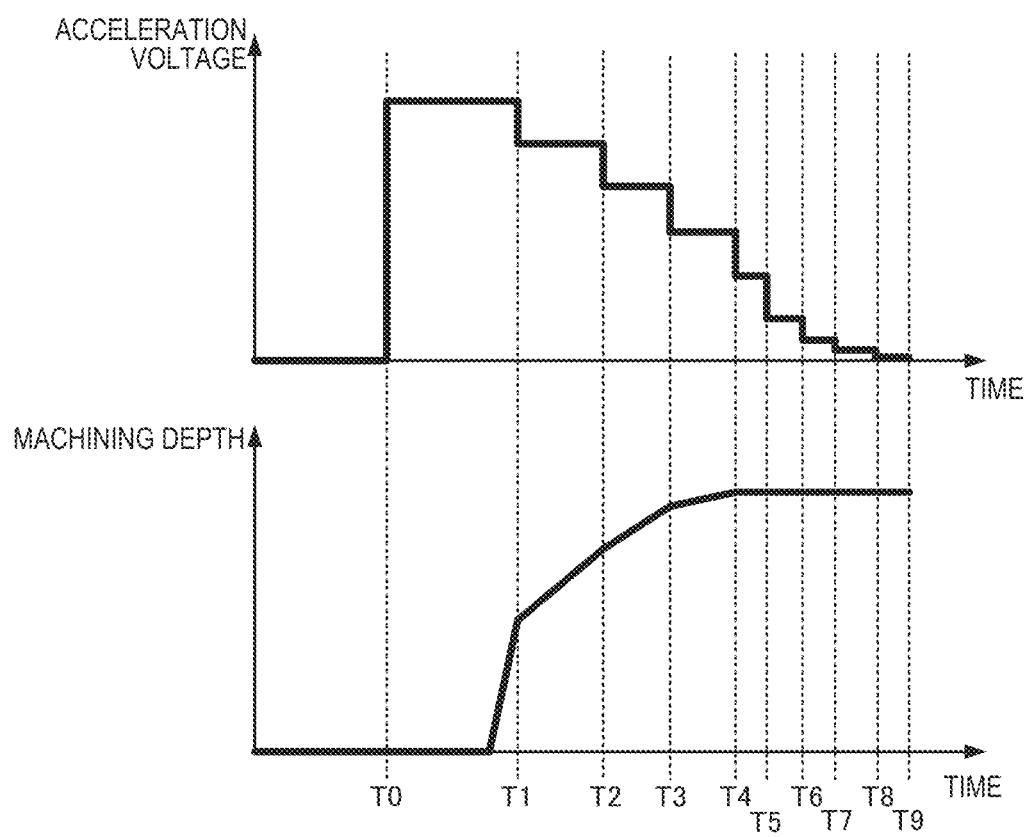
FIG. 20 illustrates machining statuses.

FIG. 18 illustrates a machining depth D serving as the depth of the machined region 5. FIG. 19 is a table illustrating acceleration voltages set in accordance with the machining depth. FIG. 20 illustrates statuses of the machining. An upper graph in FIG. 20 is a graph of variation in the acceleration voltage, on which the horizontal axis shows time and the vertical axis shows the acceleration voltage. A lower graph in FIG. 20 is a graph of variation in the machining depth, on which the horizontal axis shows time and the vertical axis shows the brightness of the transmitted light.

In a case where the specimen 2 is a metal or the like that does not transmit light even when the thickness thereof decreases, the machining conditions may be changed in accordance with the machining depth D serving as the depth of the machined region 5, as illustrated in FIG. 18. The machining depth D corresponds to the thickness of the specimen 2, and therefore the thickness of the specimen 2 can be estimated from the machining depth D.

In FIG. 19, the machining depth D is expressed as a ratio of the current machining depth to the machining depth at the point where a hole opens. The machining depth at the point where a hole opens is substantially identical providing the machining conditions remain the same, and therefore the machining depth can be standardized using past machining depths at which a hole opened as a reference.

In FIG. 19, the conditions are set so that the acceleration voltage is changed in accordance with the machining depth D up to a point immediately before a hole opens in the specimen, and thereafter, the acceleration voltage is changed in accordance with the brightness of the transmitted light.

Figure 30:
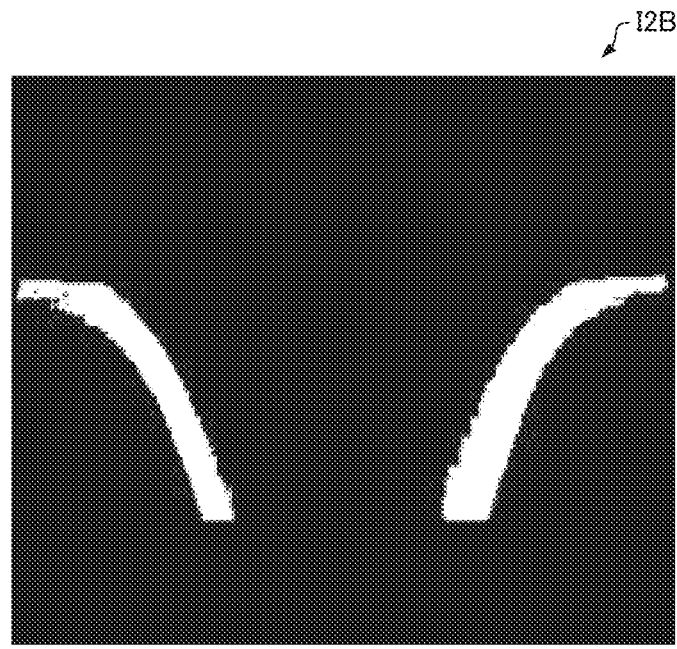
FIG. 30 schematically illustrates a binarized image.

The machining control unit 720 measures the machining depth D from the image I2 and changes the acceleration voltage in accordance with the machining depth D while following the conditions in the table in FIG. 19. The machining depth D can be measured by binarizing the image I2 and extracting the inclined surfaces 3 surrounding the machined region 5, for example. As illustrated in FIG. 30, to be described below, when the specimen 2 is subjected to coaxial illumination, only the inclined surfaces 3 become dark, and therefore, by executing binarization processing on the image I2 that is acquired by subjecting the specimen 2 to coaxial illumination, the inclined surfaces 3 can be extracted.

3.1.3. GUI

The machining control unit 720 displays the machining conditions and the progress status of the machining on a GUI (Graphical User Interface) screen.

Figure 21:
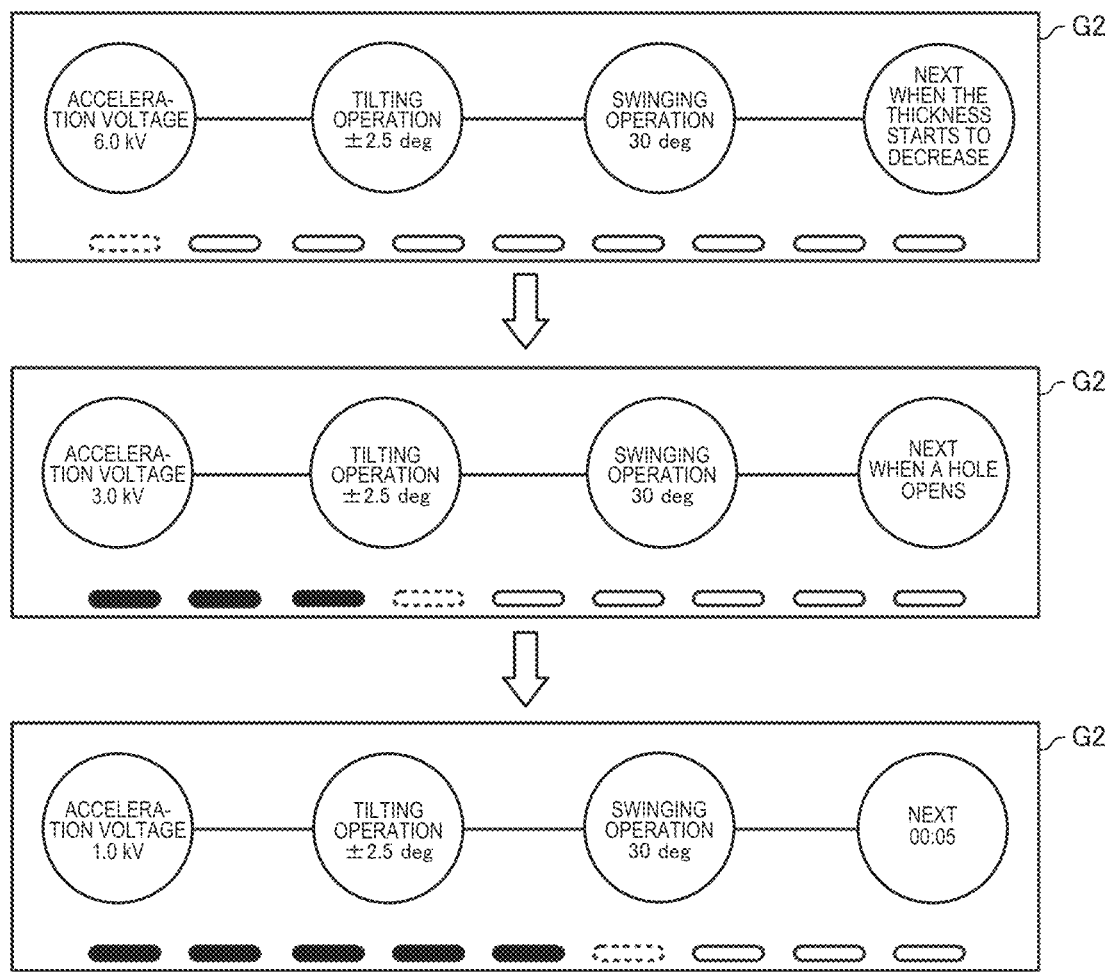
FIG. 21 schematically illustrates examples of a GUI screen.

FIG. 21 schematically illustrates examples of a GUI screen G2 displayed during the bulk machining processing.

As illustrated in FIG. 21, the acceleration voltage, the tilt angle θ2 of the ion source 10, the tilt angle (the swing angle) θ1 of the specimen 2, and a condition for advancing to the next step are displayed on the GUI screen G2. The GUI screen G2 also displays an indicator indicating the progress status of the machining. For example, regions indicating steps not yet implemented are lit, a region indicating a step currently being implemented flashes, and regions indicating steps that have been implemented are extinguished. As a result, the progress status of the machining can be ascertained visually. Note that the manner in which the progress status is indicated is not limited to the example of the indicator in FIG. 21.

As illustrated in FIG. 21, the respective items on the GUI screen G2 are updated when the machining advances to the next step.

Note that in the example in FIG. 21, "when the thickness starts to decrease", "when a hole opens", and so on are displayed as the conditions for advancing to the next step, but numerical values such as "brightness 18%" and "brightness 50%" may be displayed instead.

3.1.4. Provision of Expected Completion Time

The information provision unit 722 provides information about an expected bulk machining processing completion time, which is an expected completion time of the bulk machining processing.

As illustrated in FIG. 11, the bulk machining processing includes a step for evacuating the specimen chamber 11, a step for cooling the specimen 2, a step for machining the specimen 2, and a step for raising the temperature of the specimen 2. The information provision unit 722 predicts the expected completion time of each step and calculates the time at which the entire bulk machining processing will be completed (the expected bulk machining processing completion time) from the sum of the predicted times. Processing for calculating the expected completion time of each step will be described below.

(1) Calculation of Expected Evacuation Completion Time

The information provision unit 722 calculates an expected evacuation completion time at which evacuation of the specimen chamber 11 is expected to end and provides the calculated expected evacuation completion time. The expected evacuation completion time is the expected time required for the specimen chamber 11 to reach a set pressure (a set pressure value) from an atmospheric pressure.

Figure 22:
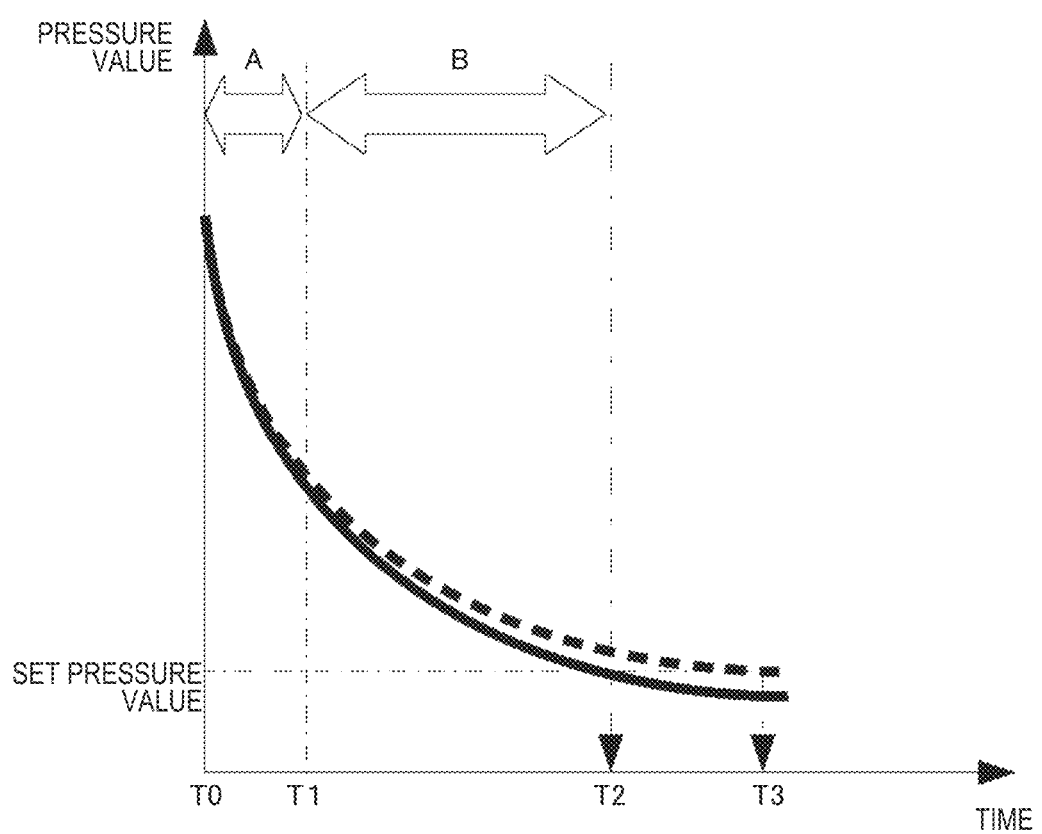
FIG. 22 is a graph of variation in the pressure in a specimen chamber.

FIG. 22 is a graph of variation in the pressure in the specimen chamber 11. On the graph in FIG. 22, the horizontal axis shows time and the vertical axis shows the pressure in the specimen chamber 11. In FIG. 22, data (past evacuation information) relating to past values of the pressure in the specimen chamber 11 are indicated by a dotted line, and data (current evacuation information) relating to the pressure in the specimen chamber 11 acquired from the current measurement result are indicated by a solid line.

Before starting evacuation and immediately after starting evacuation, a pressure decrease speed cannot be calculated from the current measurement result. Therefore, the information provision unit 722 acquires past evacuation information about the specimen chamber 11 and determines the expected evacuation completion time based on the past evacuation information.

The past evacuation information is stored in the storage unit 78. For example, the past evacuation information is information indicating the speed at which the pressure decreased when the specimen chamber 11 was evacuated using the evacuation device 14 in the past. Note that the past evacuation information may be data indicating the pressure decrease speed during processing performed once in the past or data indicating an average value of the pressure decrease speed during processing performed a plurality of times in the past. The past evacuation information may also be the time taken to evacuate the specimen chamber 11 in the past.

For example, the information provision unit 722 acquires information indicating the past pressure decrease speed from the storage unit 78 and calculates the expected evacuation completion time based on the acquired information. The information provision unit 722 then displays the calculated expected evacuation completion time on the display unit 76.

The pressure gauge 16 outputs a measurement result of the pressure in the specimen chamber 11 at fixed time intervals, and the information provision unit 722 acquires the output measurement result. The speed at which the pressure in the specimen chamber 11 decreases can be calculated from the pressure measurement result. Hence, when the information provision unit 722 acquires the measurement result of the pressure in the specimen chamber 11, the information provision unit 722 calculates the pressure decrease speed from the measurement result and calculates the expected evacuation completion time based on the calculated pressure decrease speed. For example, the information provision unit 722 determines a function indicating a relationship between the pressure and time by plotting measurement results of the pressure in the specimen chamber 11 on a graph, and calculates the expected evacuation completion time from the function.

Note that when the number of pressure measurements is small, the pressure decrease speed cannot be determined accurately. Hence, the pressure decrease speed may be calculated when the pressure has been measured a preset number of times or after a preset time has elapsed.

In the example in FIG. 22, the information provision unit 722 calculates an expected evacuation completion time T3 based on the past evacuation information prior to a time T0 at which evacuation of the specimen chamber 11 is started and over a period A extending from the time T0 to a time T1.

Over a period B extending from the time T1 to an evacuation completion time T2, the information provision unit 722 acquires information indicating the measurement result of the pressure in the specimen chamber 11 from the pressure gauge 16, calculates the expected evacuation completion time by calculating the pressure decrease speed based on the information about the measurement result, and updates the expected evacuation completion time. For example, the information provision unit 722 calculates the pressure decrease speed based on the information about the measurement result and updates the expected evacuation completion time each time a measurement result is output from the pressure gauge 16.

The information provision unit 722 may display the expected evacuation completion time calculated based on the past evacuation information and the expected evacuation completion time calculated based on the measurement result separately on the display unit 76. For example, the respective expected evacuation completion times may be distinguished by varying the colors of characters and numerals used to express the expected evacuation completion times. Alternatively, characters and symbols for distinguishing between the respective expected evacuation completion times may be displayed together therewith.

The information provision unit 722 stores information indicating the calculated pressure decrease speed in the storage unit 78. At this time, the irradiation condition of the ion beam, the material of the specimen 2, and information about the set pressure may be stored in the storage unit 78 in association with the information about the pressure decrease speed.

(2) Calculation of Expected Cooling Completion Time

The information provision unit 722 calculates an expected cooling completion time at which cooling of the specimen 2 is expected to end and displays the calculated expected cooling completion time on the display unit 76. The expected cooling completion time is the expected time required for the specimen 2 to be cooled from room temperature to a set temperature.

Figure 23:
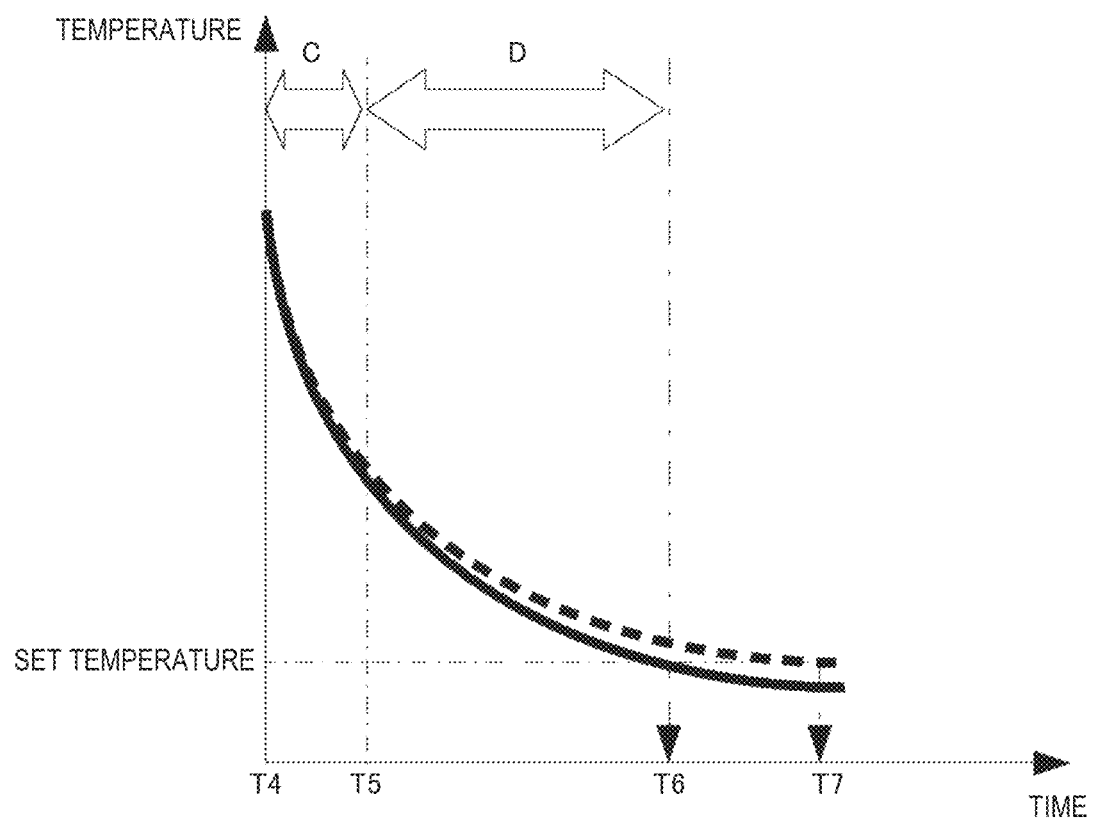
FIG. 23 is a graph of variation in the temperature of a specimen.

FIG. 23 is a graph of variation in the temperature of the specimen 2. On the graph in FIG. 23, the horizontal axis shows time and the vertical axis shows the temperature of the specimen 2. In FIG. 23, data (past cooling information) relating to past temperatures of the specimen 2 are indicated by a dotted line, and data (current cooling information) relating to the temperature of the specimen 2 acquired from the current measurement result are indicated by a solid line.

Before starting to cool the specimen 2 and immediately after starting to cool the specimen 2, the speed at which the specimen 2 is cooled cannot be calculated from the current measurement result. Therefore, the information provision unit 722 acquires past cooling information about the specimen 2 and determines the expected cooling completion time based on the past cooling information.

The past cooling information is stored in the storage unit 78. For example, the past cooling information is information indicating the cooling speed at which the specimen 2 was cooled using the cooler 22 in the past. Note that the past cooling information may be data indicating the cooling speed during processing performed once in the past or data indicating an average value of the cooling speed during processing performed a plurality of times in the past. The past cooling information may also be the time taken to cool the specimen 2 in the past.

The information provision unit 722 acquires information indicating the past cooling speed from the storage unit 78 and calculates the expected cooling completion time based on the acquired information. The information provision unit 722 then displays the calculated expected cooling completion time on the display unit 76.

The temperature sensor 26 outputs a measurement result of the temperature of the specimen 2 at fixed time intervals, and the information provision unit 722 acquires the output measurement result. The speed at which the specimen 2 is cooled by the cooler 22 can be calculated from the measurement result of the temperature of the specimen 2. Hence, when the information provision unit 722 acquires the measurement result of the temperature of the specimen 2, the information provision unit 722 calculates the cooling speed from the measurement result and calculates the expected cooling completion time based on the calculated cooling speed.

Note that when the number of temperature measurements is small, the cooling speed cannot be determined accurately. Hence, the cooling speed may be calculated when the temperature has been measured a preset number of times or after a preset time has elapsed.

In the example in FIG. 23, the information provision unit 722 calculates an expected cooling completion time T7 based on the past cooling information prior to a time T4 at which cooling of the specimen 2 is started and over a period C from the time T4 to a time T5.

Over a period D extending from the time T5 to a cooling completion time T6, the information provision unit 722 acquires information indicating the measurement result of the temperature of the specimen 2 from the temperature sensor 26, calculates the expected cooling completion time by calculating the cooling speed based on the information about the measurement result, and updates the expected cooling completion time. For example, the information provision unit 722 calculates the cooling speed based on the information about the measurement result and updates the expected cooling completion time each time a measurement result is output from the temperature sensor 26.

The information provision unit 722 stores information indicating the calculated cooling speed in the storage unit 78. At this time, the irradiation condition of the ion beam, the material of the specimen 2, and information about the set temperature of the specimen 2 may be stored in the storage unit 78 in association with the information about the cooling speed.

(3) Calculation of Expected Rough Machining Completion Time

As illustrated in FIG. 16, for example, the step for machining the specimen 2 includes rough machining up to the point at which a hole opens in the specimen 2, and finish machining following the point at which a hole opens in the specimen 2. The information provision unit 722 calculates an expected rough machining completion time up to completion of the rough machining, and displays the calculated expected rough machining completion time on the display unit 76. The expected rough machining completion time is the expected time from the start of rough machining of the specimen 2 to the end of the rough machining.

Figure 24:
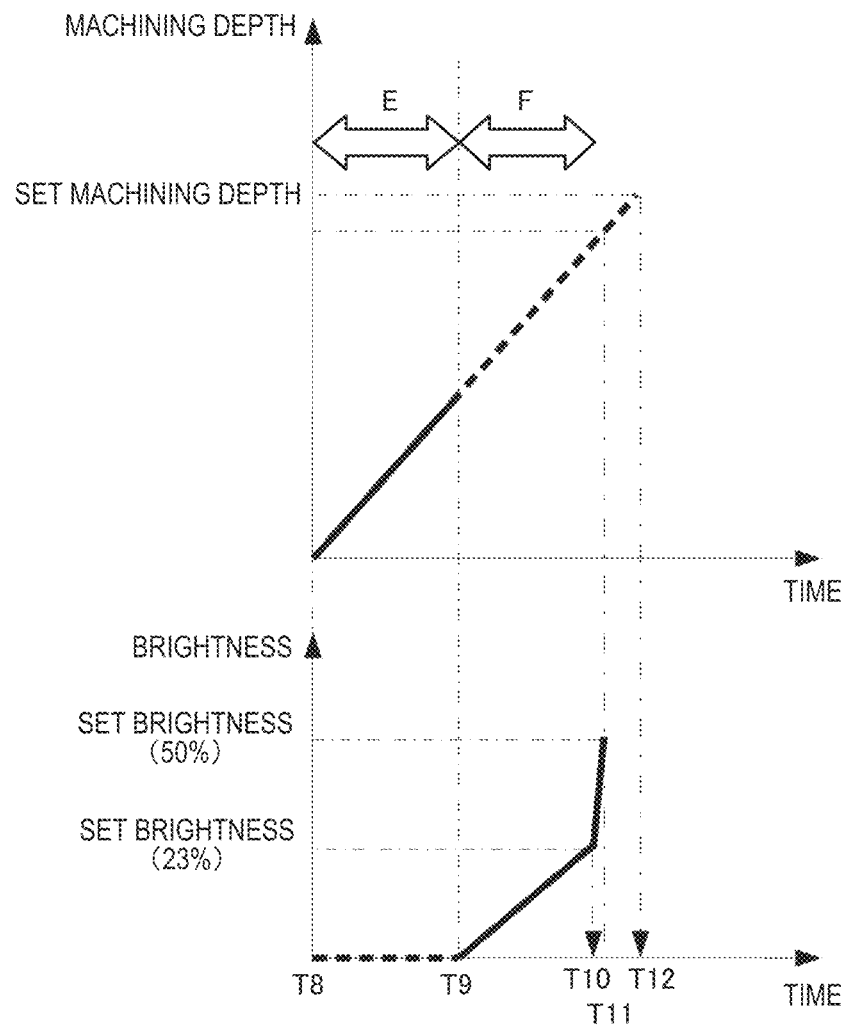
FIG. 24 is a graph of variation in a machining depth.

FIG. 24 is a graph of variation in the machining depth D. On the graph in FIG. 24, the horizontal axis shows time and the vertical axis shows the machining depth D. In FIG. 24, data (current machining information) relating to the machining depth D acquired from the current measurement result are indicated by a solid line.

Prior to the start of rough machining of the specimen 2, the machining speed cannot be calculated from the current measurement result. Hence, the information provision unit 722 acquires past machining information and determines the expected rough machining completion time based on the past machining information.

The past machining information is stored in the storage unit 78. For example, the past machining information is information indicating the machining speed at which the specimen 2 was machined in the past. Note that the past machining information may be data indicating the machining speed during processing performed once in the past, or data indicating an average value of the machining speed during processing performed a plurality of times in the past. The past machining information may also be the time taken to machine the specimen 2 in the past.

Note that the past machining information is stored in association with the machining conditions (the irradiation condition of the ion beam, the material of the specimen 2, and so on), and the information provision unit 722 acquires the past machining information that matches the current machining conditions.

The information provision unit 722 acquires information about the past machining speed from the storage unit 78 and calculates the expected rough machining completion time based on the acquired information. The information provision unit 722 then displays the calculated expected rough machining completion time on the display unit 76.

When rough machining is started, the machining depth D can be measured from the image I2. The information provision unit 722 acquires the image I2, measures the machining depth D from the image I2, and calculates the machining speed based on the measurement result of the machining depth D. The machining speed is the slope of the graph illustrated in FIG. 24. The information provision unit 722 calculates the time (the expected rough machining completion time) required to reach a set machining depth from the calculated machining speed. Note that the set machining depth may be the machining depth at which a hole opened in the specimen 2 in the past. In this case, the information provision unit 722 reads data indicating the machining depth at which a hole opened in the specimen 2 in the past, the data being stored in the storage unit 78, and calculates the expected rough machining completion time.

Note that when the number of measurement points of the machining depth D is small, the machining speed cannot be determined accurately. Hence, the machining speed may be calculated when the image I2 has been acquired and the machining depth D has been measured a preset number of times.

When the machining progresses such that the specimen 2 becomes thinner and it becomes possible to measure the brightness of the transmitted light transmitted through the specimen 2, the information provision unit 722 calculates the machining speed based on the brightness of the transmitted light and calculates the expected rough machining completion time therefrom. For example, the brightness of the transmitted light can be detected from the image I2 by transmissively illuminating the specimen 2. The information provision unit 722 may switch calculation of the expected rough machining completion time from calculation using the machining depth D to calculation using the brightness of the transmitted light based on a function indicating a relationship between the machining depth D and the elapsed time, for example.

In the example in FIG. 24, prior to a time T8 at which machining of the specimen 2 is started, the information provision unit 722 calculates an expected rough machining completion time T12 based on the past machining information. Over a period E from the time T8 to a time T9, the information provision unit 722 calculates the machining speed by measuring the machining depth D based on the image I2, and updates the expected rough machining completion time T12. When light transmitted through the specimen 2 is detected on the image I2 at the time T9, the information provision unit 722 calculates the machining speed based on the brightness of the transmitted light and updates the expected rough machining completion time over a period F extending from the time T9 to a machining completion time T11.

Note that here, the expected rough machining completion time is set as the time taken for a hole to open in the specimen 2, but the expected rough machining completion time may be set at a time immediately before a hole opens in the specimen 2 (the time at which the brightness reaches 23%). As illustrated in FIG. 24, the reason for this is that immediately before a hole opens, or in other words when the brightness of the transmitted light reaches approximately 23%, the brightness increases rapidly in a short amount of time such that a hole opens instantly in the specimen 2.

Figure 25:
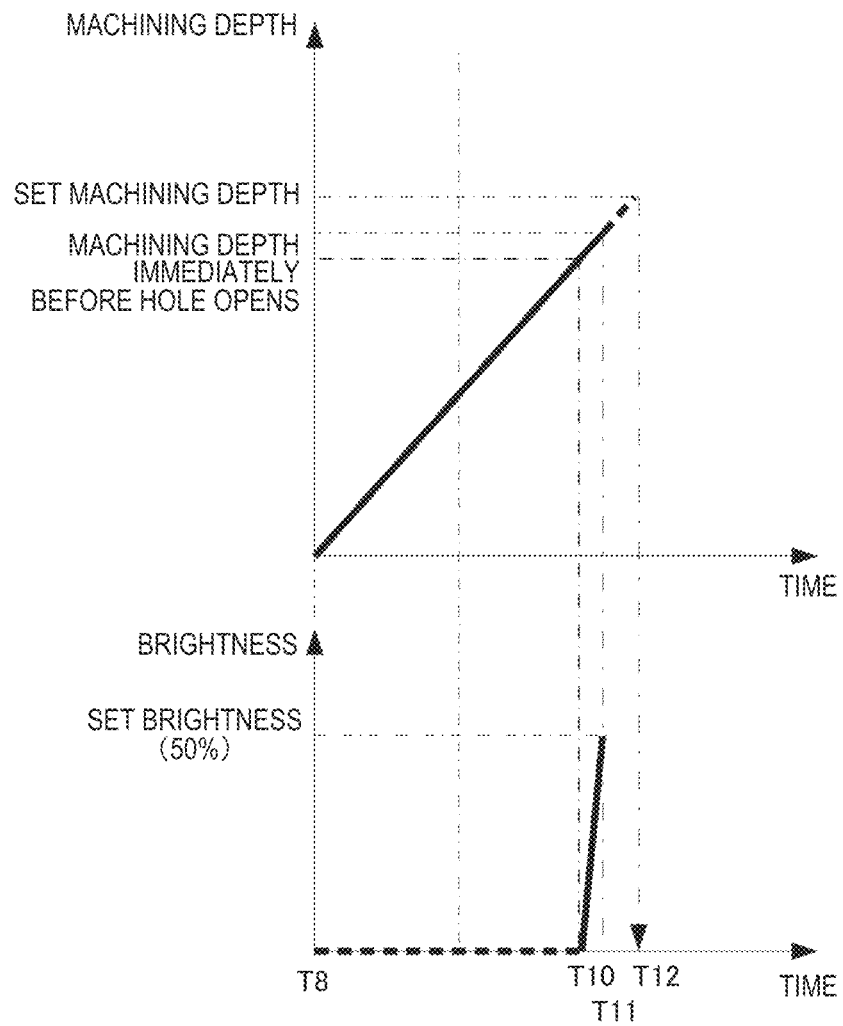
FIG. 25 illustrates a graph of variation in a machining depth and a graph of variation in the brightness of a transmitted light.

FIG. 25 illustrates a graph of variation in the machining depth and a graph of variation in the brightness of the transmitted light. When the specimen 2 is made of metal or the like and does not transmit light, the time immediately before a hole opens may be predicted from a function indicating the relationship between the machining depth D and the elapsed time, and at the predicted time, coaxial illumination may be changed to transmission illumination and the expected rough machining completion time may be calculated based on the brightness of the transmitted light.

Alternatively, although not shown in the figures, the expected rough machining completion time may be calculated from the machining depth D alone.

(4) Calculation of Expected Finish Machining Completion Time

As illustrated in FIG. 16, finish machining of the specimen 2 is set in accordance with the machining time, and therefore the information provision unit 722 calculates an expected finish machining completion time by calculating a difference between the set machining time and the elapsed time.

(5) Calculation of Expected Temperature Raising Completion Time

The information provision unit 722 calculates an expected temperature raising completion time at which raising of the temperature of the specimen 2 is to be completed, and displays the calculated expected temperature raising completion time on the display unit 76. The expected temperature raising completion time is the time expected to be taken to raise the temperature of the specimen 2 from the set temperature to room temperature.

Figure 26:
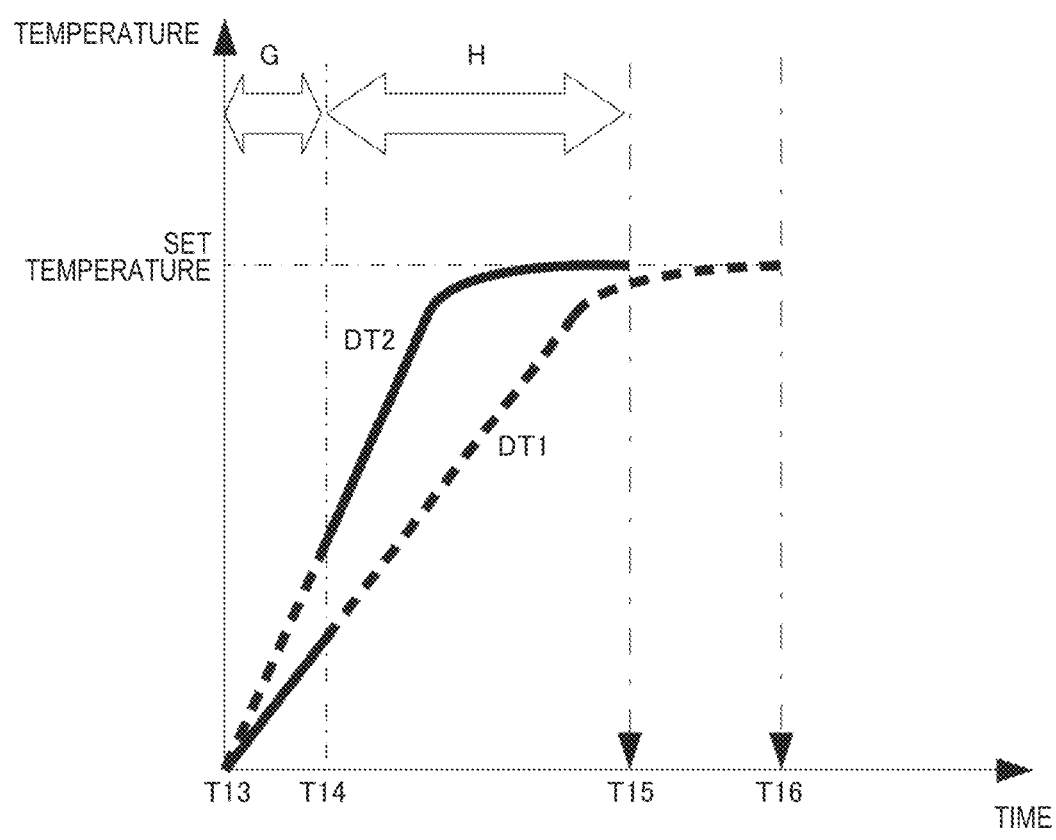
FIG. 26 is a graph of variation in the temperature of a specimen.

FIG. 26 is a graph of variation in the temperature of the specimen 2. On the graph in FIG. 26, the horizontal axis shows time and the vertical axis shows the temperature of the specimen 2. In FIG. 26, data DT1 are data (past temperature raising information) indicating past temperatures of the specimen 2, and data DT2 are data (current temperature raising information) indicating the temperature of the specimen 2 acquired from the current measurement result.

Before and immediately after starting to raise the temperature of the specimen 2, the speed at which the temperature of the specimen 2 is raised cannot be calculated from the current measurement result. Therefore, the information provision unit 722 acquires past temperature raising information about the specimen 2 and determines the expected temperature raising completion time based on the past temperature raising information.

The past temperature raising information is stored in the storage unit 78. For example, the past temperature raising information is information indicating the temperature raising speed at which the temperature of the specimen 2 was raised using the heater 24 in the past. Note that the past temperature raising information may be data indicating the temperature raising speed during processing performed once in the past or data indicating an average value of the temperature raising speed during processing performed a plurality of times in the past. The past temperature raising information may also be the time taken to raise the temperature of the specimen 2 in the past.

The information provision unit 722 acquires information indicating the past temperature raising speed from the storage unit 78 and calculates the expected temperature raising completion time based on the acquired information. The information provision unit 722 then displays the calculated expected temperature raising completion time on the display unit 76.

The temperature sensor 26 outputs a measurement result of the temperature of the specimen 2 at fixed time intervals, and the information provision unit 722 acquires the output measurement result. The speed at which the temperature of the specimen 2 is raised by the heater 24 can be calculated from the measurement result of the temperature of the specimen 2. Hence, when the information provision unit 722 acquires the measurement result of the temperature of the specimen 2, the information provision unit 722 calculates the temperature raising speed from the measurement result and calculates the expected temperature raising completion time based on the calculated temperature raising speed.

Note that when the number of temperature measurements is small, the temperature raising speed cannot be determined accurately. Hence, the temperature raising speed may be calculated when the temperature has been measured a preset number of times or after a preset time has elapsed.

In the example in FIG. 26, the information provision unit 722 calculates an expected temperature raising completion time T16 based on the past temperature raising information prior to a time T13 at which raising of the temperature of the specimen 2 is started and over a period G from the time T13 to a time T14. In other words, before raising of the temperature of the specimen 2 is started and over the period G, the information provision unit 722 calculates the expected temperature raising completion time T16 based on the data DT1.

Over a period H extending from the time T14 to a temperature raising completion time T15, the information provision unit 722 acquires information indicating the measurement result of the temperature of the specimen 2 from the temperature sensor 26, calculates the expected temperature raising completion time by calculating the temperature raising speed based on the information about the measurement result, and updates the expected temperature raising completion time. In other words, over the period H, the information provision unit 722 calculates the expected temperature raising completion time based on the data DT2. For example, the information provision unit 722 calculates the temperature raising speed based on the information about the measurement result and updates the expected temperature raising completion time each time a measurement result is output from the temperature sensor 26.

The information provision unit 722 stores information indicating the calculated temperature raising speed in the storage unit 78. At this time, the irradiation condition of the ion beam, the material of the specimen 2, and information about the set temperature of the specimen 2 may be stored in the storage unit 78 in association with the information about the temperature raising speed.

(6) Bulk Machining Processing Expected Completion Time

The information provision unit 722 calculates the expected evacuation completion time, the expected cooling completion time, the expected rough machining completion time, the expected finish machining completion time, and the expected temperature raising completion time in the manner described above, and determines the bulk machining processing expected completion time, which is the time taken to complete all of the steps of the bulk machining processing, by calculating the sum of these times. The information provision unit 722 then displays the determined bulk machining processing expected completion time on the display unit 76.

Figure 27:
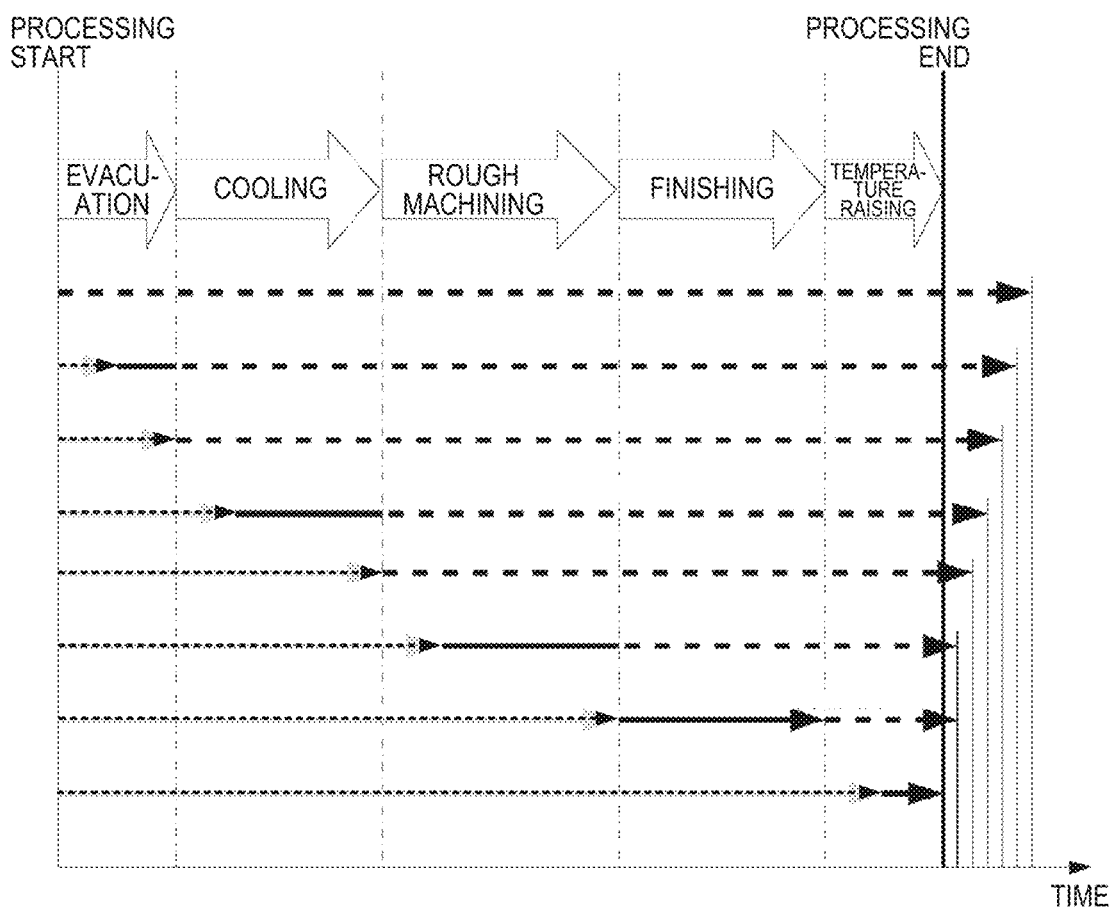
FIG. 27 illustrates processing for calculating an expected bulk machining processing completion time.

FIG. 27 illustrates processing for calculating the bulk machining processing expected completion time. In FIG. 27, dotted line arrows indicate the elapsed time, solid lines indicate the expected completion times of the respective steps as calculated from the measurement results, and broken line arrows indicate the expected completion times acquired from the past information.

As illustrated in FIG. 27, the information provision unit 722 calculates the bulk machining processing expected completion time by combining the expected completion times based on past information with the expected completion times based on current information, which are acquired from the measurement results.

Figure 28:
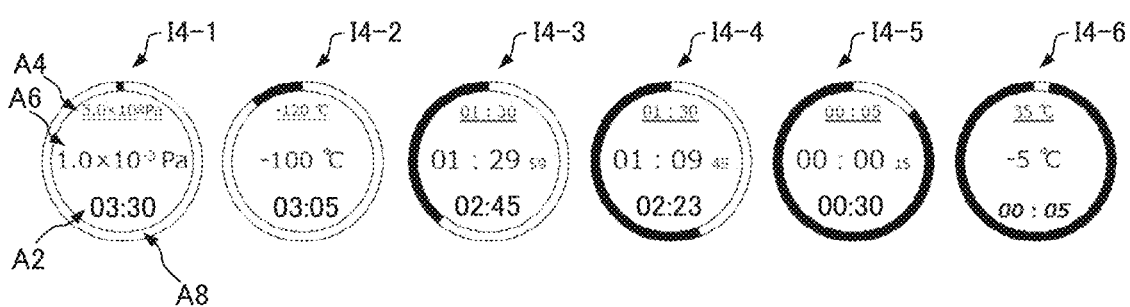
FIG. 28 illustrates an example of display of an expected bulk machining processing completion time.

FIG. 28 illustrates an example of display of the bulk machining processing expected completion time.

As illustrated in FIG. 28, the information provision unit 722 displays on the display unit 76 an image I4 including a region A2 in which the bulk machining processing expected completion time is displayed, a region A4 in which the set temperature, a set emission time of the ion beam, and the set pressure are displayed in accordance with each step, and a region A6 in which the measurement results are displayed. Further, an indicator A8 indicating the progress of the bulk machining processing is displayed in a frame part of the image I4.

An image I4-1 in FIG. 28 is a display example of the evacuation step. An image I4-2 is a display example of the cooling step. An image I4-3 and an image I4-4 are display examples of the rough machining step. An image I4-5 is a display example of the finish machining step. An image I4-6 is a display example of the temperature raising step. Note that in order to distinguish between the steps, the colors of the characters and background may be varied for each step. For example, the colors of the characters and background may be varied between the cooling step and the temperature raising step.

As illustrated in FIG. 28, the information provision unit 722 displays information corresponding to each step on the display unit 76 as the image I4.

The bulk machining processing expected completion time, or in other words the time remaining until all of the processing is complete, is displayed in the region A2, but instead, the time at which all of the processing will be completed may be displayed.

3.2. Primary Milling 3.2.1. Flow of Primary Milling Processing

Figure 29:
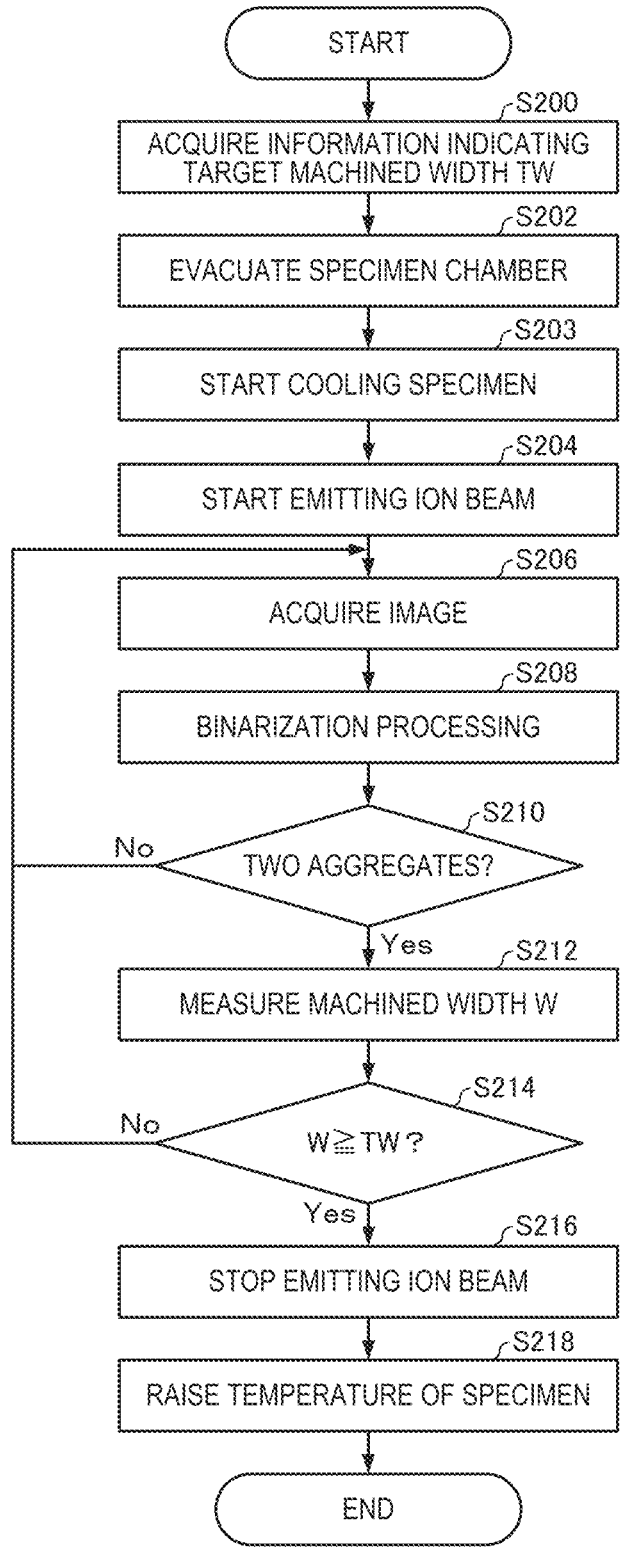
FIG. 29 is a flowchart illustrating an example of primary milling processing.

In the specimen machining device 100, the machining control unit 720 performs primary milling processing for machining the specimen 2 by means of primary milling. FIG. 29 is a flowchart illustrating an example of the primary milling processing. Note that description of similar processing to that of the bulk machining processing in FIG. 11 has been omitted.

When the user inputs information indicating a target machined width TW and the machining conditions through the operation unit 74, the machining control unit 720 stores the input information indicating the target machined width TW and the machining conditions in the storage unit 78 (S200).

The user then sets the specimen 2 on the specimen stage 20 and sets the shielding member 30 on the specimen 2. Then, when the user inputs an instruction to start the primary milling processing through the operation unit 74, the machining control unit 720 causes the evacuation device 14 to evacuate the specimen chamber 11 (S202).

Having determined that the pressure in the specimen chamber 11 has reached the set pressure, the machining control unit 720 operates the cooler 22 in order to start cooling the specimen 2 (S203).

Having determined that the temperature of the specimen 2 has reached the set temperature, the machining control unit 720 starts processing for emitting the ion beam IB (S204).

When emission of the ion beam IB is started, the machining control unit 720 acquires the image I2 of the specimen 2 photographed by the camera 60 (S206). The machining control unit 720 acquires the image I2 photographed by the camera 60 at a point where the specimen 2 is horizontal. In so doing, the tilt of the specimen 2 does not have to be taken into account in the image processing to be described below.

Next, the machining control unit 720 measures the machined width W on the image I2.

More specifically, first, the machining control unit 720 binarizes the image I2 (S208). For example, the image I2 is binarized by setting a threshold such that the lowest brightness peak is selected from a brightness histogram of the image I2. Thus, a binarized image can be generated.

FIG. 30 schematically illustrates a binarized image I2B.

Here, the specimen 2 is subjected to coaxial illumination and transmission illumination, and therefore, on the image I2, only the inclined surfaces 3 are dark. Accordingly, the inclined surfaces 3 can be extracted by selecting the lowest brightness peak from the brightness histogram of the image I2 so as to binarize the image I2.

Next, the machining control unit 720 identifies aggregates of white pixels corresponding to the inclined surfaces 3 on the binarized image I2B and determines whether or not the number of aggregates is two (S210). In the initial stage of the machining, the machined region 5 has not yet reached the second end portion 2b of the specimen 2, and therefore the number of aggregates is one. Once the machined region 5 has reached the second end portion 2b of the specimen 2, the number of aggregates is two. After determining that the number of aggregates is not two (No in S210), the machining control unit 720 returns to the processing S206 for acquiring the image I2.

Having determined that the number of aggregates is two (Yes in S210), the machining control unit 720 measures the machined width W by measuring the distance between the two aggregates (S212).

Figure 31:
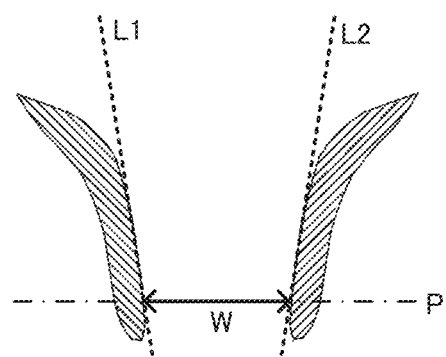
FIG. 31 illustrates processing for measuring a machined width.

FIG. 31 illustrates processing for measuring the machined width W.

First, as illustrated in FIG. 31, respective edges of the two aggregates are approximated by straight lines, whereby an approximate line L1 and an approximate line L2 are drawn. A position P for measuring the machined width W is then specified on the binarized image I2B, whereupon the distance between the approximate line L1 and the approximate line L2 is measured in the position P. In so doing, the machined width W can be measured. The position P for measuring the machined width W is set in advance and specified by position coordinates in the vertical direction of the binarized image I2B, for example.

Next, the machining control unit 720 determines whether or not the measured machined width W equals to or greater than the target machined width TW (S214). In other words, the machining control unit 720 determines whether or not W≥TW is satisfied.

Having determined that W≥TW is not satisfied (No in S214), the machining control unit 720 returns to the processing S206 for acquiring the image I2.

The machining control unit 720 repeats the processing S206 for acquiring the image, the binarization processing S208, the processing S210 for determining whether or not the number of aggregates is two, the processing S212 for measuring the machined width W, and the processing S214 for determining whether or not W≥TW is satisfied until W≥TW is determined to be satisfied.

Having determined that W≥TW is satisfied (Yes in S214), the machining control unit 720 causes the ion source 10 to stop emitting the ion beam IB (S216). The machining control unit 720 then halts the operation of the cooler 22 and then operates the heater 24 so as to raise the temperature of the specimen 2 to room temperature (S218).

When the temperature of the specimen 2 reaches the set temperature, the machining control unit 720 terminates the primary milling processing.

3.2.2. Ion Beam Control

Figure 32:
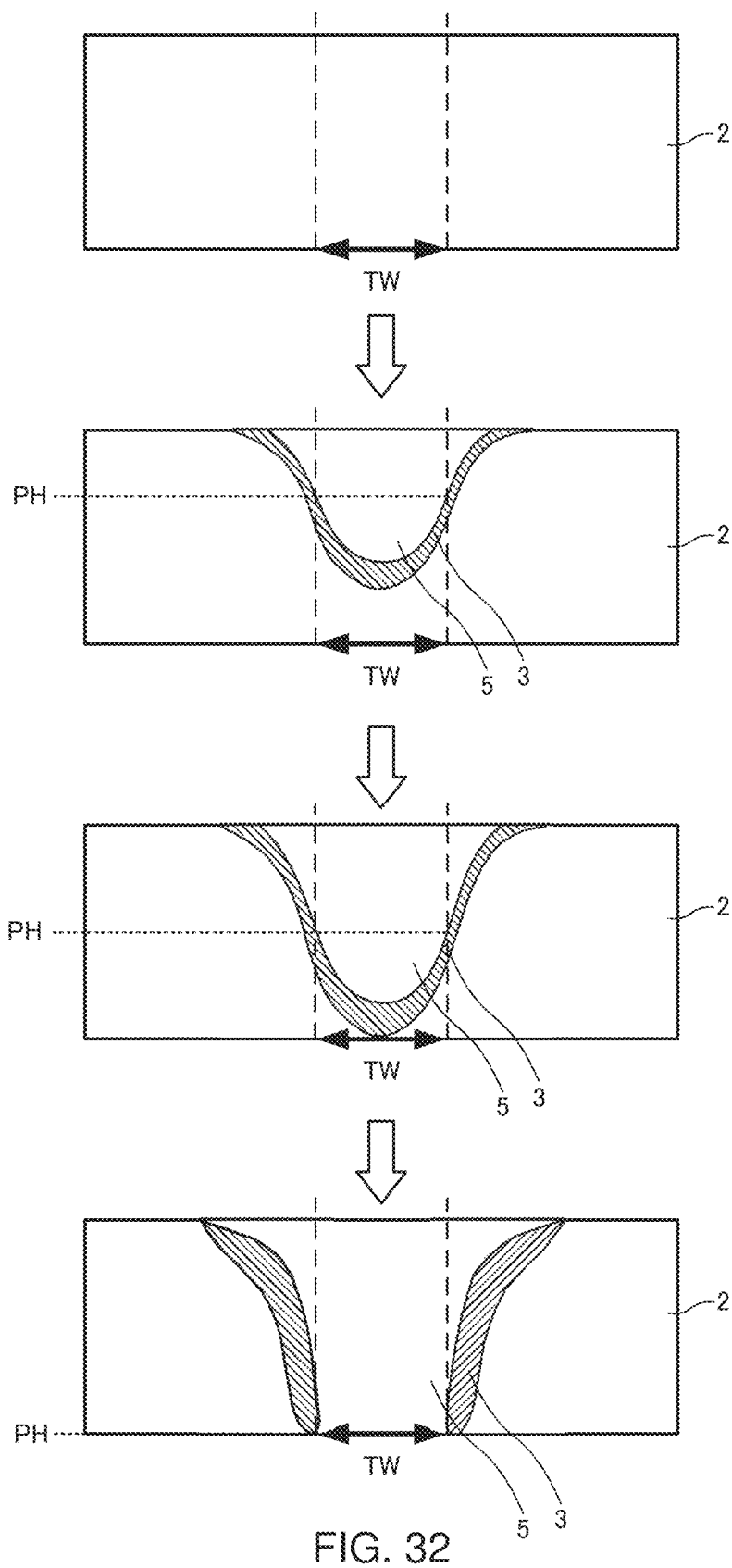
FIG. 32 illustrates a machining status during primary milling.

FIG. 32 illustrates a status of the machining during the primary milling.

As illustrated in FIG. 32, as the machining progresses, the machined region 5 expands such that a position PH at which the width of the machined region 5 reaches the target machined width TW moves. The machining control unit 720 detects the position PH from the image I2 and changes the machining conditions in accordance with the position PH. As a result, the machining conditions can be changed in accordance with the thickness of the specimen 2.

FIG. 33 is a table illustrating acceleration voltages set in accordance with the position PH. In FIG. 33, the position PH is acquired by standardizing the distance from the first end portion 2a by the thickness (the distance between the first end portion 2a and the second end portion 2b) of the specimen 2. In other words, position PH=100% means that the target machined width TW has been reached in the position of the second end portion 2b.

As illustrated in FIG. 33, the acceleration voltage is set in accordance with the position PH. Note that by setting positions PH corresponding to the status of the specimen in advance, the acceleration voltage may be set from the status of the specimen. For example, by associating "until the specimen starts to become thinner" with "position PH=50%", when the user selects "until the specimen starts to become thinner", the acceleration voltage is changed at the point where the position PH reaches 50%.

After the specimen 2 has become thinner, the acceleration voltage is changed in accordance with the elapsed time as finish machining.

FIG. 34 illustrates statuses of the machining during the primary milling. An upper graph in FIG. 34 is a graph of variation in the acceleration voltage, and a lower graph in FIG. 34 is a graph of variation in the position PH. On both graphs, the horizontal axis shows time and the vertical axis shows the position PH.

When the conditions in the table in FIG. 33 are set, the machining control unit 720 detects the position PH from the image I2 and changes the acceleration voltage in accordance with the position PH while following the conditions in the table in FIG. 33.

More specifically, as illustrated in FIG. 34, the machining control unit 720 sets the acceleration voltage at 6.0 kV at a time t0. The machining control unit 720 then detects the position PH on the acquired image I2, and when the position PH reaches 50%, changes the acceleration voltage to 5.0 kV. On the graphs in FIG. 34, the acceleration voltage is changed to 5.0 kV at a time t1. Similarly, the machining control unit 720 changes the acceleration voltage to 4.0 kV when the position PH reaches 75% (a time t2), changes the acceleration voltage to 3.0 kV when the position PH reaches 90% (a time t3), and changes the acceleration voltage to 2.0 kV when the position PH reaches 100% (a time t4). At the time t4, the specimen 2 is the same thickness as the shielding member 30.

In accordance with the table in FIG. 33, the machining control unit 720 implements machining at an acceleration voltage of 2.0 kV for five minutes from the time t4 to a time t5, then implements machining at an acceleration voltage of 1.0 kV for five minutes from the time t5 to a time t6. Similarly, the machining control unit 720 implements machining at an acceleration voltage of 0.5 kV for five minutes from the time t6 to a time t7, implements machining at an acceleration voltage of 0.3 kV for five minutes from the time t7 to a time t8, and implements machining at an acceleration voltage of 0.1 kV for five minutes from the time t8 to a time t9.

Note that by setting a maximum emission time, which is the upper limit time of emission of the ion beam IB, at each acceleration voltage, excessive emission of the ion beam IB can be prevented.

3.2.3. GUI

The machining control unit 720 displays the machining conditions and the progress status of the machining on a GUI screen.

Figure 35:
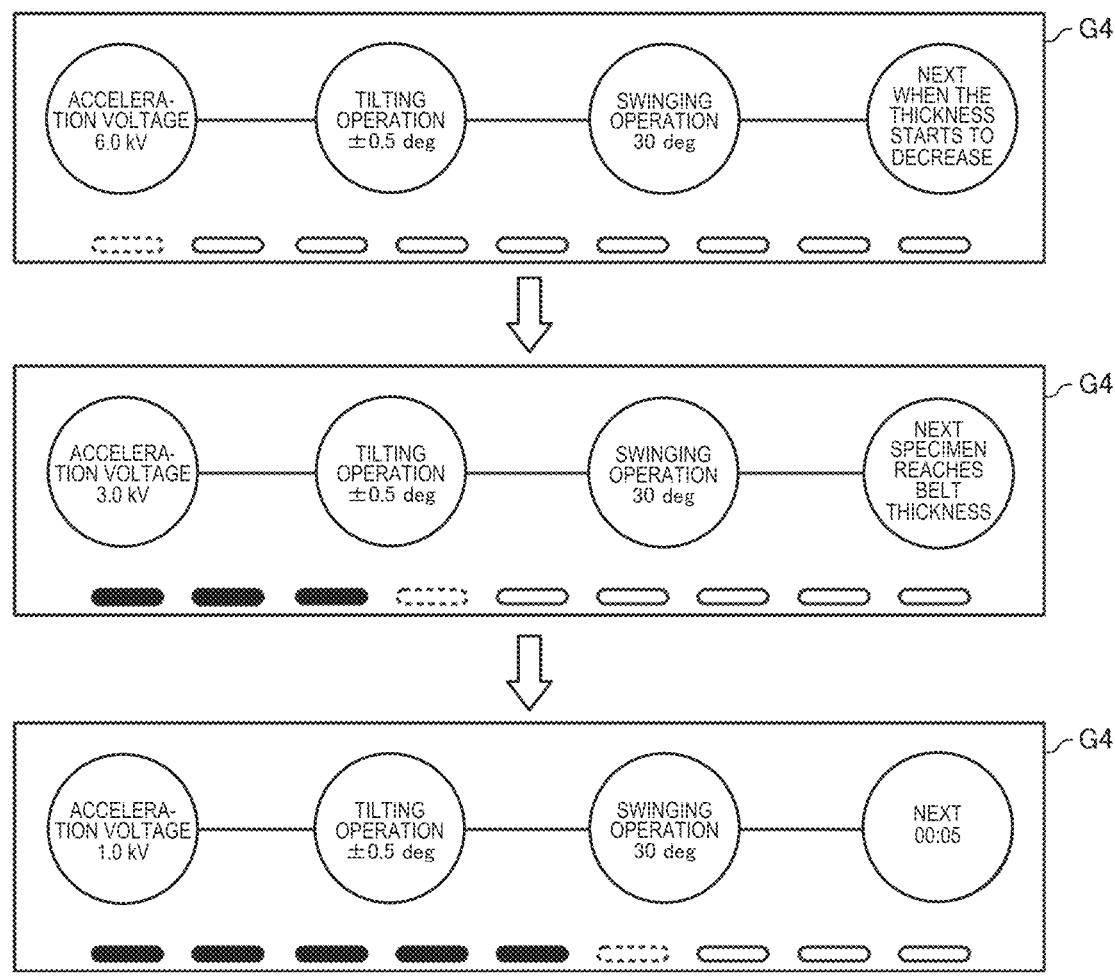
FIG. 35 schematically illustrates examples of a GUI screen.

FIG. 35 schematically illustrates examples of a GUI screen G4 displayed during the primary milling processing.

As illustrated in FIG. 35, the acceleration voltage, the tilt angle θ2 of the ion source 10, the tilt angle (the swing angle) θ1 of the specimen 2, and the condition for advancing to the next step are displayed on the GUI screen G4. The GUI screen G4 also displays an indicator indicating the progress status of the machining. Each of the items on the GUI screen G4 is updated when the machining advances to the next step.

3.2.4. Provision of Expected Completion Time

The information provision unit 722 provides information indicating a primary milling processing expected completion time, which is the expected completion time of the primary milling processing.

As illustrated in FIG. 29, the primary milling processing includes a step for evacuating the specimen chamber 11, a step for cooling the specimen 2, a step for machining the specimen, and a step for raising the temperature of the specimen 2. The information provision unit 722 predicts the expected completion time of each step and calculates the time at which the entire primary milling processing will be completed from the sum of the predicted times.

Note that processing for calculating the primary milling processing expected completion time is similar to that of the bulk machining processing described above except for calculation of the expected rough machining completion time during the step for machining the specimen. Accordingly, only the processing for calculating the expected rough machining completion time will be described below.

Figure 36:
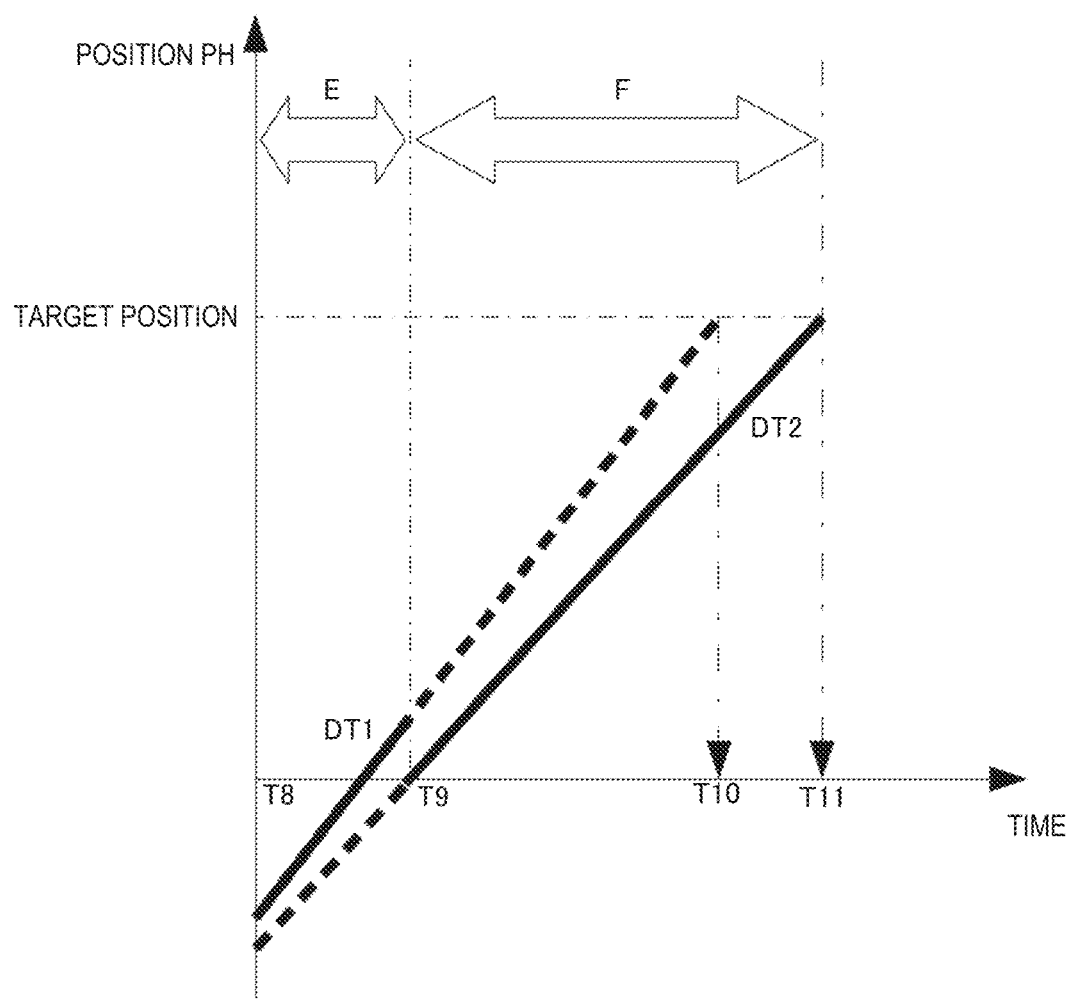
FIG. 36 is a graph of variation in the position.

FIG. 36 is a graph of variation in the position PH. On the graph in FIG. 36, the horizontal axis shows time and the vertical axis shows the position PH. In FIG. 36, data DT1 are data (past machining information) indicating past positions PH, and data DT2 are data (current machining information) indicating the position PH acquired from the current measurement result.

Before starting rough machining of the specimen 2, the machining speed cannot be calculated from the current measurement result. Therefore, the information provision unit 722 acquires past machining information and determines the expected rough machining completion time based on the past machining information.

Moreover, even after rough machining of the specimen 2 is started, the position PH cannot be measured until the machined region 5 expands. Therefore, until it becomes possible to measure the position PH, the information provision unit 722 determines the expected rough machining completion time based on the past machining information.

Once it has become possible to measure the position PH from the image I2, the information provision unit 722 calculates the machining speed from the measurement result of the position PH and calculates the expected rough machining completion time based on the machining speed.

In the example in FIG. 36, prior to the time T8 at which machining of the specimen 2 is started, the information provision unit 722 calculates an expected rough machining completion time T10 based on the past machining information. Further, likewise over the period E from the time T8 to the time T9, the information provision unit 722 calculates the expected rough machining completion time T10 based on the past machining information. In other words, before the machining is started and over the period E, the information provision unit 722 calculates the expected rough machining completion time based on the data DT1.

When it becomes possible to measure the position PH at the time T9, the information provision unit 722 calculates the expected rough machining completion time by measuring the position PH based on the image I2 and updates the expected rough machining completion time over a period F extending from the time T9 to a machining completion time T11. In other words, over the period F, the information provision unit 722 calculates the expected rough machining completion time based on the data DT2.

Figure 37:
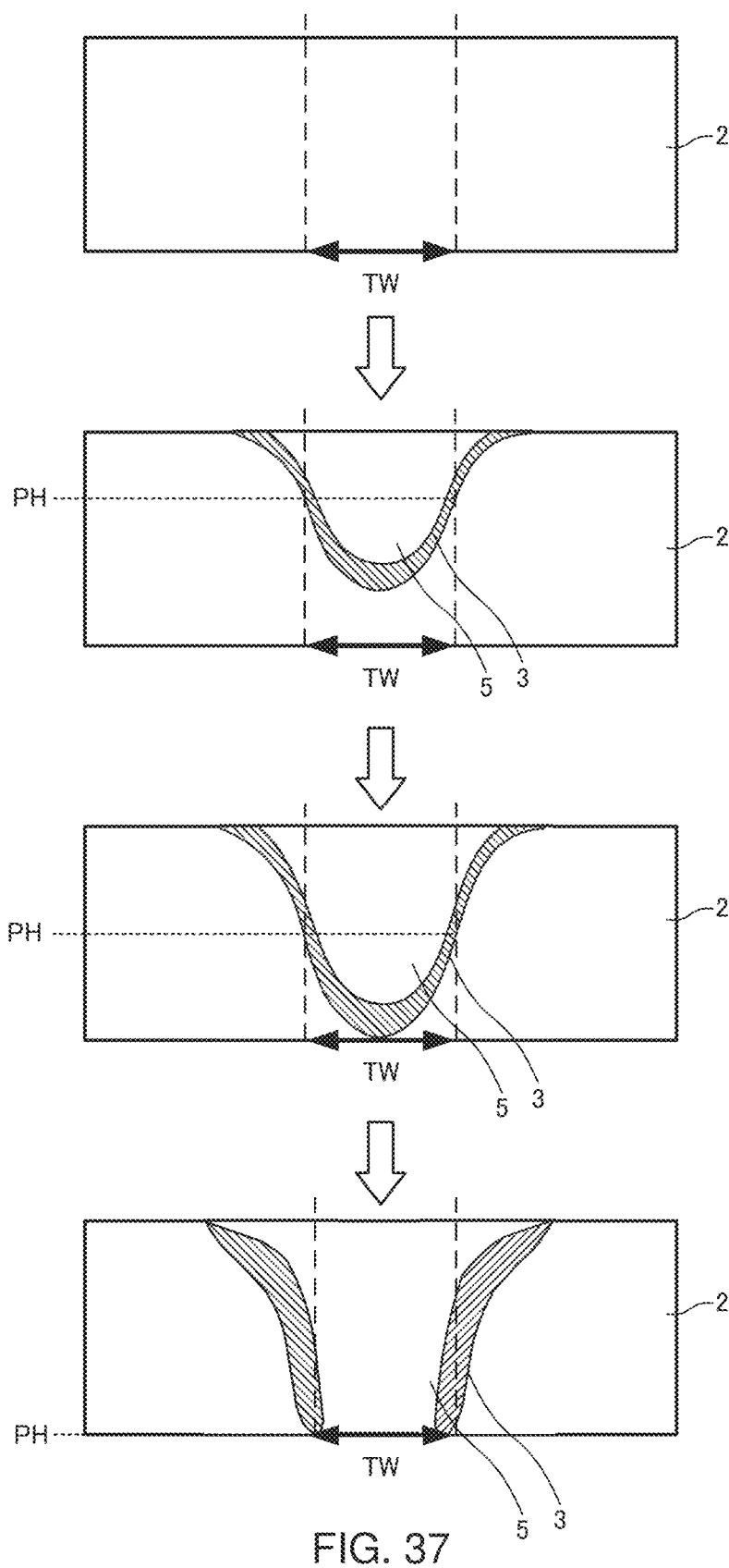
FIG. 37 illustrates an example of a method for measuring the position.

FIG. 37 illustrates an example of a method for measuring the position PH. In the example in FIG. 32, the position PH is the position at which the machined width W reaches the target machined width TW, or in other words the position at which the distance between the inside edges of the inclined surfaces 3 reaches the target machined width TW, but as illustrated in FIG. 37, the position PH may also be the position at which the distance between the outside edges of the inclined surfaces 3 reaches the target machined width TW.

Figure 38:
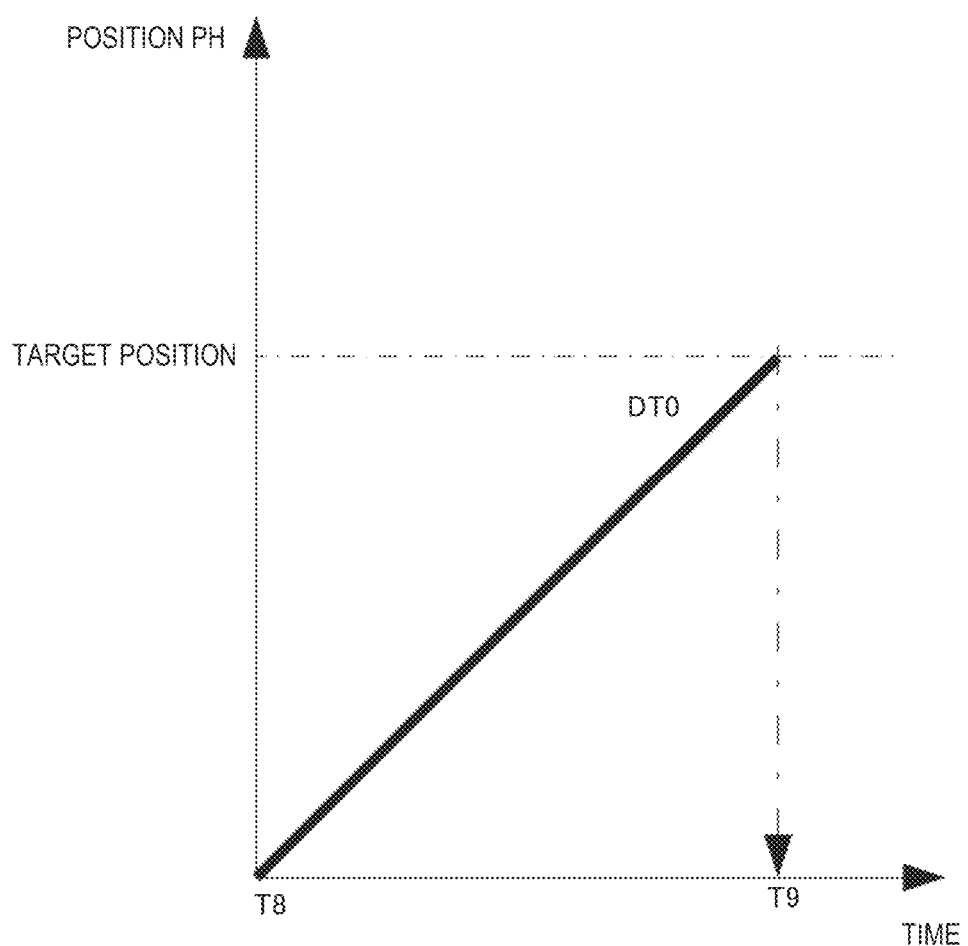
FIG. 38 is a graph of variation in the position.

FIG. 38 is a graph of variation in the position PH. In FIG. 38, the position PH is set as the position at which the distance between the outside edges of the inclined surfaces 3 reaches the target machined width TW.

As illustrated in FIG. 38, by setting the position PH as the position at which the distance between the outside edges of the inclined surfaces 3 reaches the target machined width TW, the machining speed can be calculated by measuring the position PH from the image I2 from immediately after the start of machining.

In the example in FIG. 38, the information provision unit 722 calculates the machining speed by measuring the position PH based on the image I2 and calculates the expected rough machining completion time over a period extending from the machining start time T8 to the machining completion time T9. For example, the information provision unit 722 creates data DT0 by plotting the distance between the outside edges of the inclined surfaces 3, and calculates the expected rough machining completion time therefrom.

Figure 39:
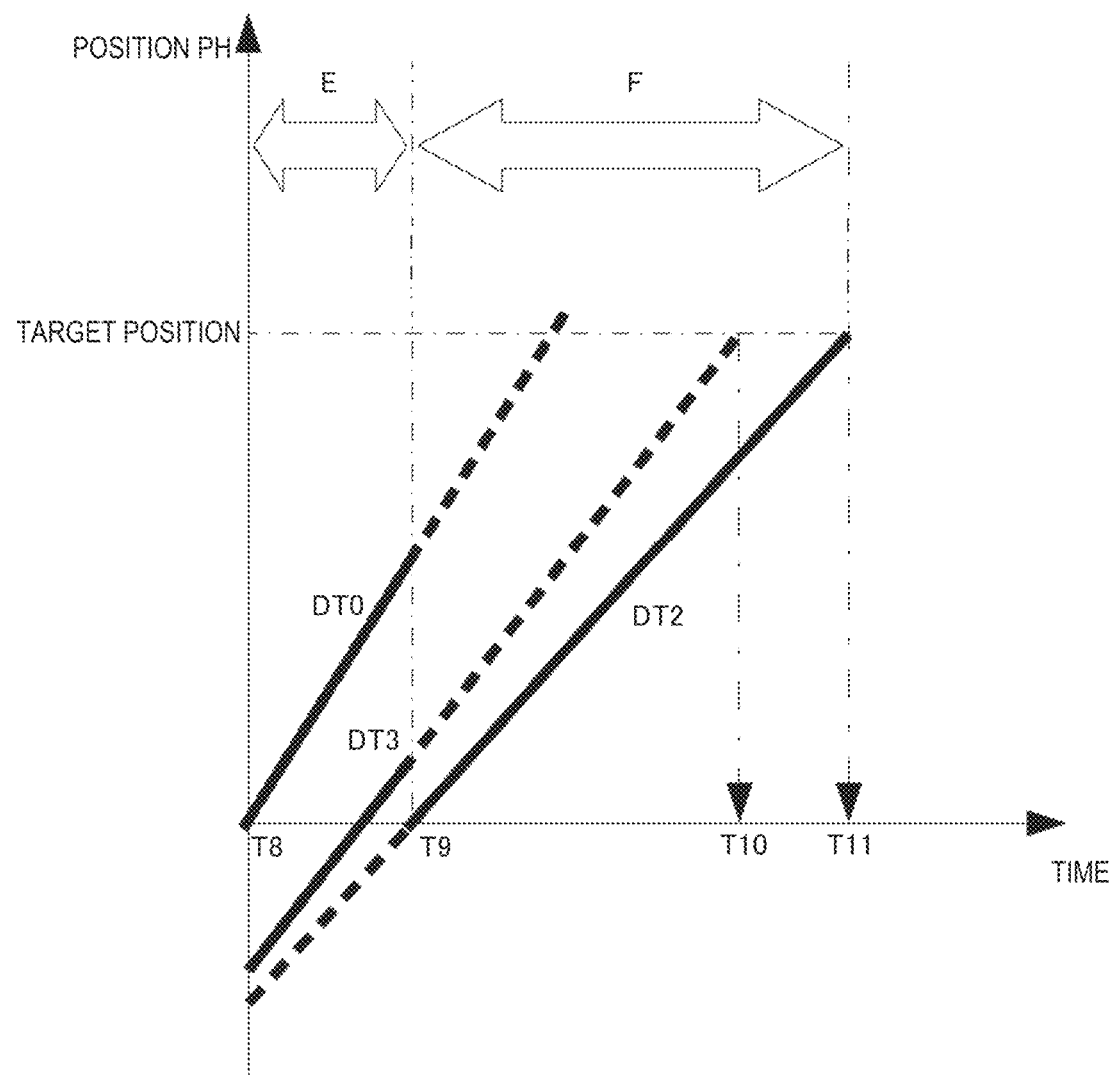
FIG. 39 is a graph of variation in the position.

FIG. 39 is a graph of variation in the position PH. In FIG. 39, data DT0 are data acquired in a case where the position PH is set as the position at which the distance between the outside edges of the inclined surfaces 3 reaches the target machined width TW, data DT2 are data acquired in a case where the position PH is set as the position at which the distance between the inside edges of the inclined surfaces 3 reaches the target machined width TW, and data DT3 are data determined from the data DT0 in a case where the position PH is set as the position at which the distance between the inside edges of the inclined surfaces 3 reaches the target machined width TW.

As illustrated in FIG. 39, the expected rough machining completion time may be updated by combining a case in which the position PH is set as the position at which the distance between the outside edges of the inclined surfaces 3 reaches the target machined width TW and a case in which the position PH is set as the position at which the distance between the inside edges of the inclined surfaces 3 reaches the target machined width TW.

In the example in FIG. 39, over the period E extending from the machining start time T8 to the machining completion time T9, the information provision unit 722 measures the distance between the outside edges of the inclined surfaces 3, estimates the distance between the inside edges of the inclined surfaces 3 from the measurement result, and calculates the expected rough machining completion time therefrom. The relationship between the distance between the outside edges of the inclined surfaces 3 and the distance between the inside edges of the inclined surfaces 3 can be ascertained from the past machining information, for example. In other words, over the period E, the information provision unit 722 determines the data DT3 from the data DT0 and calculates the expected rough machining completion time based on the data DT3.

Over a period F from the time T9 to the machining completion time T11, the information provision unit 722 measures the position PH by measuring the distance between the inside edges of the inclined surfaces 3, calculates the machining speed from the measurement result, and calculates the expected rough machining completion time based on the machining speed. In other words, over the period F, the information provision unit 722 calculates the expected rough machining completion time based on the data DT2.

3.3. Secondary Milling

3.3.1. Flow of Secondary Milling Processing

Figure 40:
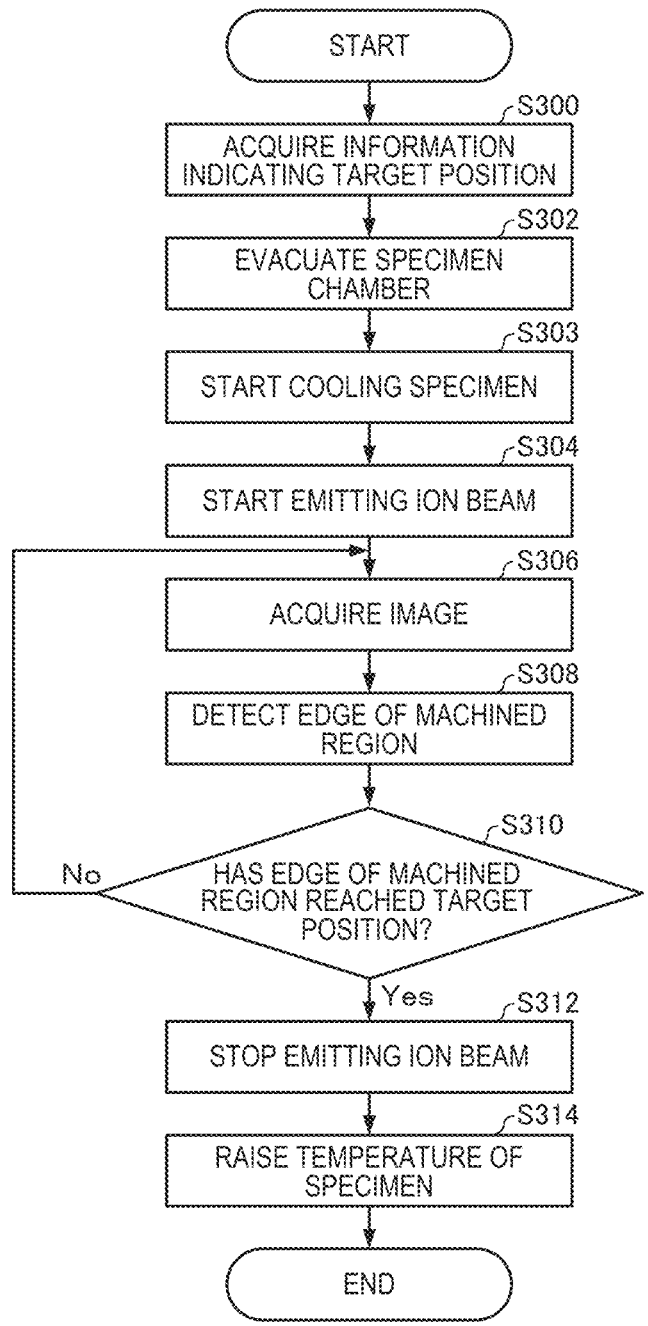
FIG. 40 is a flowchart illustrating an example of secondary milling processing.

In the specimen machining device 100, the machining control unit 720 performs secondary milling processing for machining the specimen 2 by means of secondary milling. FIG. 40 is a flowchart illustrating an example of the secondary milling processing. Note that description of similar processing to that of the bulk machining processing in FIG. 11 has been omitted.

When the user inputs information indicating a target position TP and the machining conditions through the operation unit 74, the machining control unit 720 stores the input information indicating the target position TP and the machining conditions in the storage unit 78 (S300).

The user sets the specimen 2 on the specimen stage 20. Then, when the user inputs an instruction to start the secondary milling processing through the operation unit 74, the machining control unit 720 causes the evacuation device 14 to evacuate the specimen chamber 11 (S302).

Having determined that the pressure in the specimen chamber 11 has reached the set pressure, the machining control unit 720 operates the cooler 22 in order to start cooling the specimen 2 (S303).

Having determined that the temperature of the specimen 2 has reached the set temperature, the machining control unit 720 starts processing for emitting the ion beam IB (S304).

When machining is started, the machining control unit 720 acquires the image I2 of the specimen 2 photographed by the camera 60 (S306). The machining control unit 720 acquires the image I2 photographed by the camera 60 at a point where the specimen 2 is horizontal. In so doing, the tilt of the specimen 2 does not have to be taken into account in the image processing to be described below.

The machining control unit 720 detects the edges of the machined region 5 on the image I2 (S308).

FIG. 41 illustrates processing for detecting a lower end edge E of the machined region 5. Lines on which brightness profiles are acquired in order to detect the lower end edge E of the machined region 5 are shown in FIG. 41 by broken lines.

As illustrated in FIG. 41, the machining control unit 720 acquires a plurality of brightness profiles in the vertical direction of the image I2 and identifies the position of the lower end edge E of the machined region 5. On the vertical direction brightness profiles of the image I2, the brightness varies greatly at the lower end edge E of the machined region 5, and therefore the edge E is detected from this brightness variation. The machining control unit 720 identifies an edge E0 having the shortest distance to the target position TP from the detection results of the edge E on the plurality of brightness profiles. The machining control unit 720 then calculates a distance L between the edge E0 and the target position TP.

Next, the machining control unit 720 determines whether or not the edge E0 of the machined region 5 has reached the target position TP (S310).

After determining that the edge E0 of the machined region 5 has not reached the target position TP (No in S310), the machining control unit 720 returns to the processing S306 for acquiring the image I2.

The machining control unit 720 repeats the processing S306 for acquiring the image, the processing S308 for detecting the edge E0 of the machined region 5, and the processing S310 for determining whether or not the edge E0 of the machined region 5 has reached the target position TP until the edge E0 reaches the target position TP.

Having determined that the edge E0 of the machined region 5 has reached the target position TP (Yes in S310), the machining control unit 720 causes the ion source 10 to stop emitting the ion beam IB (S312). The machining control unit 720 then halts the operation of the cooler 22 and then operates the heater 24 so as to raise the temperature of the specimen 2 to room temperature (S314).

When the temperature of the specimen 2 reaches the set temperature, the machining control unit 720 terminates the secondary milling processing.

3.3.2. Ion Beam Control

During secondary milling, the machining control unit 720 detects the position of the edge E0 from the image I2 and changes the machining conditions in accordance with the position of the edge E0.

FIG. 42 is a table illustrating acceleration voltages set in accordance with the position of the edge E0. In FIG. 42, the distance L between the edge E0 and the target position TP is standardized by the distance between the edge E0 prior to machining and the target position TP. Here, this standardized value is referred to as a remaining film thickness. For example, a remaining film thickness of 0% means that the edge E0 has reached the target position TP.

As illustrated in FIG. 42, the acceleration voltage is set in accordance with the remaining film thickness. After the edge E0 reaches the target position TP, the acceleration voltage is changed in accordance with the elapsed time.

Figure 43:
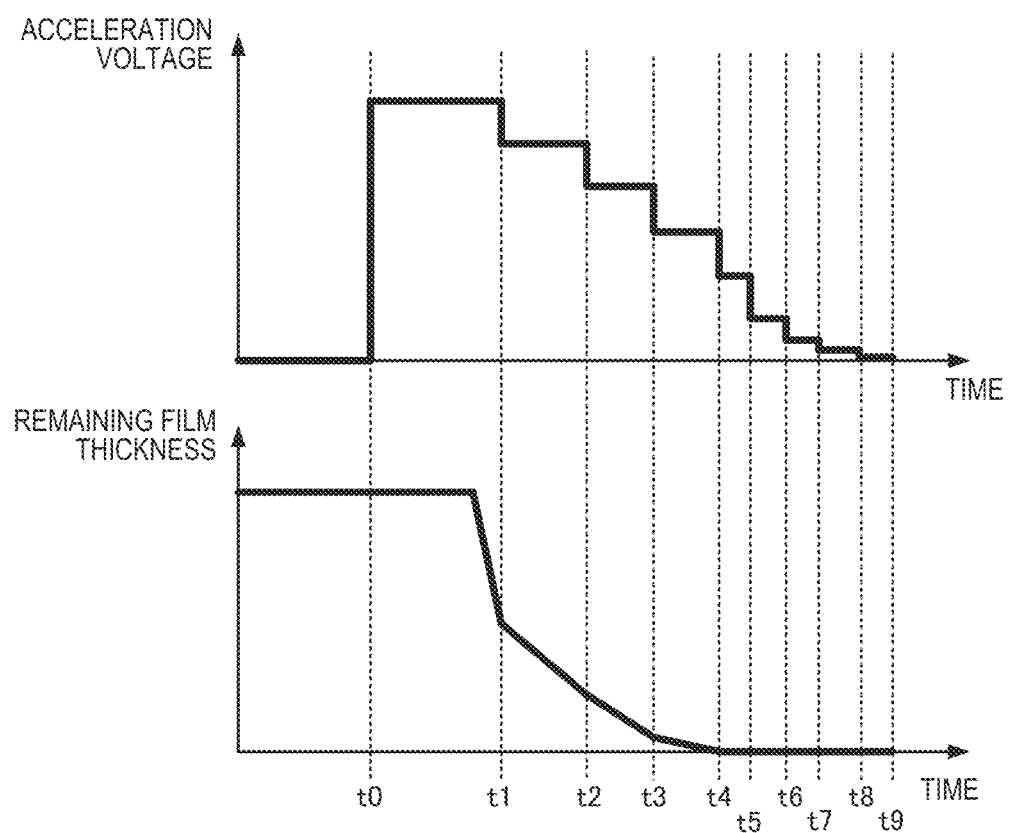
FIG. 43 illustrates machining statuses during secondary milling.

FIG. 43 illustrates a status of the machining during secondary milling. An upper graph in FIG. 43 is a graph of variation in the acceleration voltage, on which the horizontal axis shows time and the vertical axis shows the acceleration voltage. A lower graph in FIG. 43 is a graph of variation in the remaining film thickness, on which the horizontal axis shows time and the vertical axis shows the remaining film thickness.

When the conditions in the table in FIG. 42 are set, the machining control unit 720 detects the edge E0 from the image I2, determines the remaining film thickness, and changes the acceleration voltage in accordance with the remaining film thickness while following the conditions in the table in FIG. 42.

More specifically, as illustrated in FIG. 43, the machining control unit 720 sets the acceleration voltage at 6.0 kV at a time t0. The machining control unit 720 then detects the edge E0 on the acquired image I2, and when the remaining film thickness reaches 90%, changes the acceleration voltage to 5.0 kV. On the graphs in FIG. 43, the acceleration voltage is changed to 5.0 kV at a time t1. Similarly, the machining control unit 720 changes the acceleration voltage to 4.0 kV when the remaining film thickness reaches 50% (a time t2), changes the acceleration voltage to 3.0 kV when the remaining film thickness reaches 10% (a time t3), and changes the acceleration voltage to 2.0 kV when the remaining film thickness reaches 0% (a time t4). At the time t4, the edge E0 reaches the target position TP.

In accordance with the table in FIG. 42, the machining control unit 720 implements machining at an acceleration voltage of 2.0 kV for five minutes from the time t4 to a time t5, then implements machining at an acceleration voltage of 1.0 kV for five minutes from the time t5 to a time t6. Similarly, the machining control unit 720 implements machining at an acceleration voltage of 0.5 kV for five minutes from the time t6 to a time t7, implements machining at an acceleration voltage of 0.3 kV for five minutes from the time t7 to a time t8, and implements machining at an acceleration voltage of 0.1 kV for five minutes from the time t8 to a time t9.

3.3.3. GUI

The machining control unit 720 displays the machining conditions and the progress status of the machining on a GUI screen.

Figure 44:
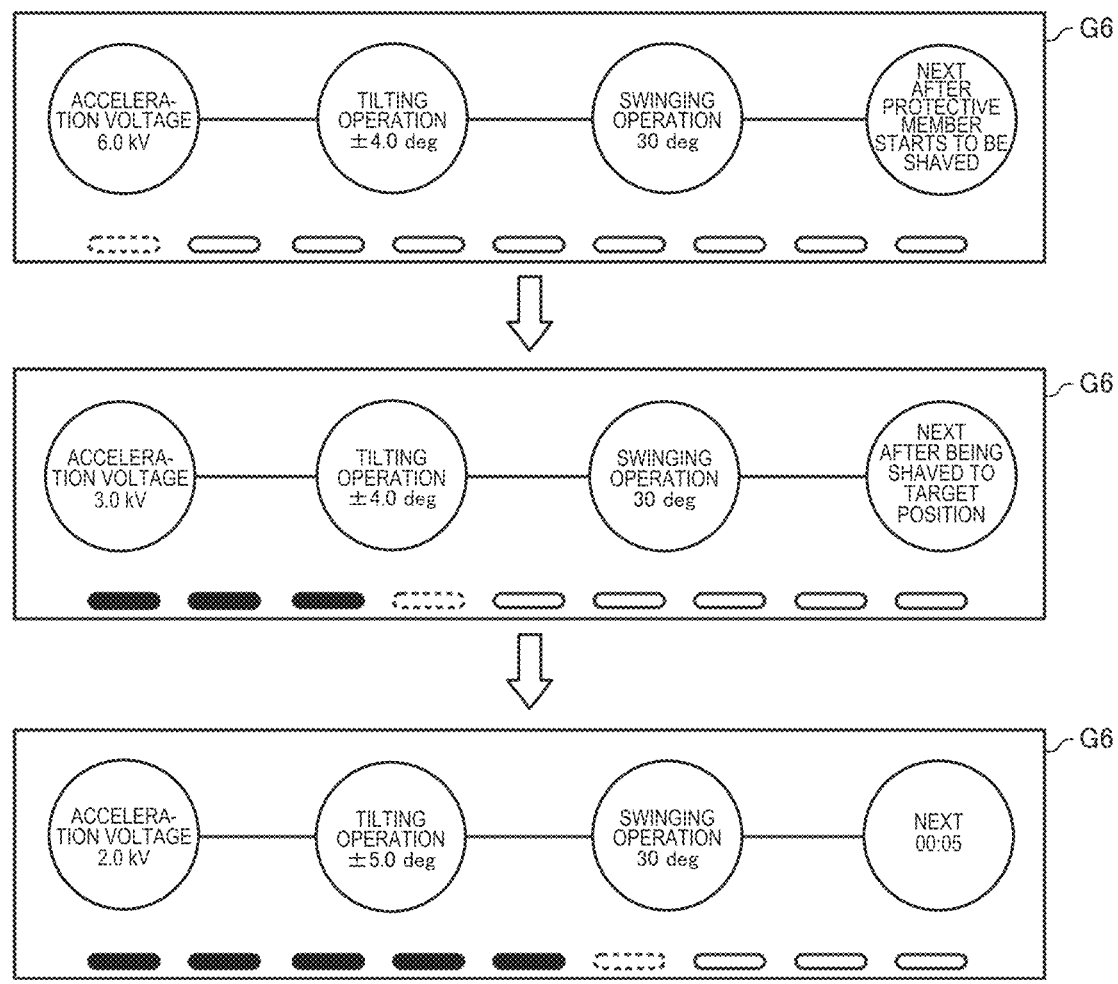
FIG. 44 schematically illustrates examples of a GUI screen.

FIG. 44 schematically illustrates examples of a GUI screen G6 displayed during the secondary milling processing.

As illustrated in FIG. 44, the acceleration voltage, the tilt angle θ2 of the ion source 10, the tilt angle (the swing angle) 01 of the specimen 2, and the condition for advancing to the next step are displayed on the GUI screen G6. The GUI screen G6 also displays an indicator indicating the progress status of the machining. Each of the items on the GUI screen G6 is updated when the machining advances to the next step.

3.3.4. Provision of Expected Completion Time

The information provision unit 722 provides information indicating a secondary milling processing expected completion time, which is the expected completion time of the secondary milling processing.

As illustrated in FIG. 40, the secondary milling processing includes a step for evacuating the specimen chamber 11, a step for cooling the specimen 2, a step for machining the specimen, and a step for raising the temperature of the specimen 2. The information provision unit 722 predicts the expected completion time of each step and calculates the time at which the entire secondary milling processing will be completed from the sum of the predicted times.

Note that processing for calculating the secondary milling processing expected completion time is similar to that of the bulk machining processing described above except for calculation of the expected rough machining completion time during the step for machining the specimen. Accordingly, only the processing for calculating the expected rough machining completion time will be described below.

Figure 45:
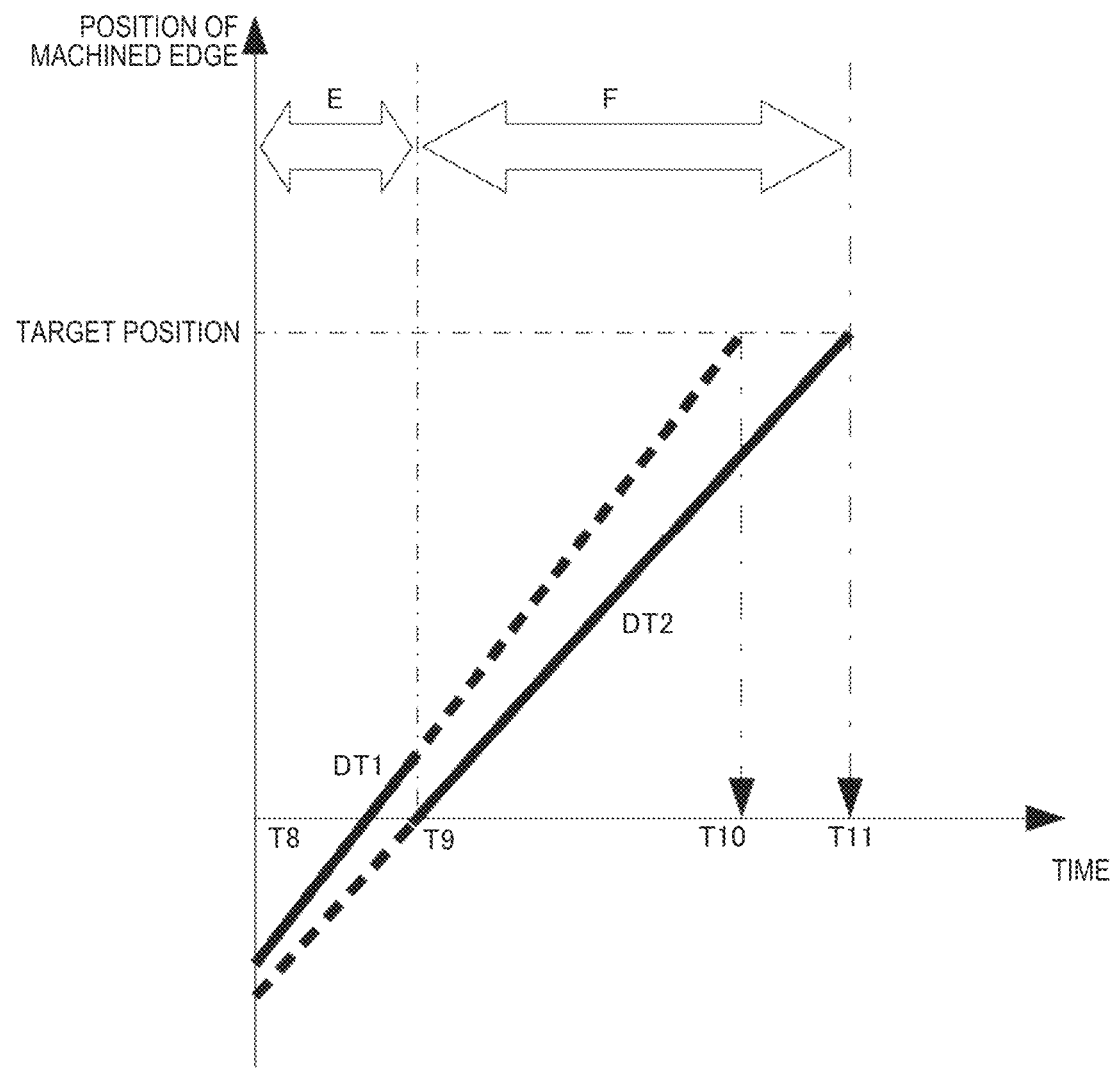
FIG. 45 is a graph of variation in the position of an edge.

FIG. 45 is a graph of variation in the edge E0. On the graph in FIG. 45, the horizontal axis shows time and the vertical axis shows the position of the edge E0. In FIG. 45, data DT1 are data (past machining information) indicating past positions of the machined edge E0, and data DT2 are data (current machining information) indicating the position of the machined edge E0 acquired from the current measurement result.

Before starting rough machining of the specimen 2, the machining speed cannot be calculated from the current measurement result. Therefore, the information provision unit 722 acquires past machining information and determines the expected rough machining completion time based on the past machining information.

Moreover, even after rough machining of the specimen 2 is started, the position of the edge E0 cannot be measured until the machined region 5 expands to a certain extent. Therefore, until it becomes possible to measure the position of the edge E0, the information provision unit 722 acquires the past machining information and determines the expected rough machining completion time based on the past machining information.

Once it has become possible to measure the position of the edge E0 from the image I2, the information provision unit 722 calculates the machining speed from the measurement result of the position of the edge E0 and calculates the expected rough machining completion time based on the machining speed.

In the example in FIG. 45, prior to the time T8 at which machining of the specimen 2 is started, the information provision unit 722 calculates the expected rough machining completion time T10 based on the past machining information. Further, likewise over the period E from the time T8 to the time T9, the information provision unit 722 calculates the expected rough machining completion time T10 based on the past machining information. In other words, before machining of the specimen 2 is started and over the period E, the information provision unit 722 calculates the expected rough machining completion time based on the data DT1.

When it becomes possible to measure the position of the edge E0 at the time T9, the information provision unit 722 calculates the expected rough machining completion time by measuring the position of the edge E0 based on the image I2 and updates the expected rough machining completion time over the period F extending from the time T9 to the machining completion time T11. In other words, over the period F, the information provision unit 722 calculates the expected rough machining completion time based on the data DT2.

4. Effects

In the specimen machining device 100, the information provision unit 722 performs processing for calculating the expected machining completion time based on past machining information, processing for acquiring the image I2, processing for calculating the machining speed based on the acquired image I2, and processing for updating the expected machining completion time based on the machining speed. With the specimen machining device 100, therefore, it is possible to provide the expected machining completion time from immediately after the start of the machining, enabling a reduction in the frequency with which the user checks the device, and as a result, the operation efficiency can be improved. Furthermore, in the specimen machining device 100, the expected machining completion time is updated by acquiring the image I2 during the machining, and therefore the expected machining completion time can be provided with high accuracy.

The specimen machining device 100 includes the storage unit 78 storing the past machining information, and therefore the past machining information can be compared with the machining information acquired from the image I2 during the machining. Thus, an error in the device can be detected, and as a result, a rough indication of the timing of maintenance, for example, can be ascertained.

In the specimen machining device 100, the information provision unit 722 performs processing for displaying the expected machining completion time on the display unit 76. With the specimen machining device 100, therefore, the user can easily ascertain the expected machining completion time.

In the specimen machining device 100, the past machining information is information indicating past machining speeds. Therefore, with the specimen machining device 100, the expected machining completion time can be provided from immediately after the start of the machining.

The specimen machining device 100 includes the evacuation device 14 for evacuating the specimen chamber 11, the pressure gauge 16 for measuring the pressure in the specimen chamber 11, and the storage unit 78 for storing past evacuation information relating to the specimen chamber 11, and the information provision unit 722 performs processing for calculating an expected evacuation completion time required for the specimen chamber 11 to reach the set pressure from an atmospheric pressure based on the past evacuation information, processing for acquiring information indicating a measurement result of the pressure in the specimen chamber 11 from the pressure gauge 16, processing for calculating the decrease speed of the pressure based on the acquired measurement result of the pressure in the specimen chamber 11, and processing for updating the expected evacuation completion time based on the pressure decrease speed.

Hence, in the specimen machining device 100, the expected evacuation completion time can be provided from immediately after the start of evacuation of the specimen chamber 11, enabling a reduction in the frequency with which the user checks the device, and as a result, the operation efficiency can be improved. Furthermore, with the specimen machining device 100, the expected evacuation completion time is updated by acquiring the measurement result of the pressure in the specimen chamber 11 during evacuation of the specimen chamber 11, and therefore the expected evacuation completion time can be provided with high accuracy.

The specimen machining device 100 includes the cooler 22 for cooling the specimen 2, the temperature sensor 26 for measuring the temperature of the specimen 2, and the storage unit 78 for storing past cooling information relating to the specimen 2, and the information provision unit 722 performs processing for calculating the expected cooling completion time required for the temperature of the specimen 2 to be cooled to the set temperature based on the past cooling information, processing for acquiring information indicating a measurement result of the temperature of the specimen 2 from the temperature sensor 26, processing for calculating the cooling speed based on the acquired measurement result of the temperature of the specimen 2, and processing for updating the expected cooling completion time based on the cooling speed.

Hence, in the specimen machining device 100, the expected cooling completion time can be provided from immediately after the start of cooling of the specimen 2, enabling a reduction in the frequency with which the user checks the device, and as a result, the operation efficiency can be improved. Furthermore, with the specimen machining device 100, the expected cooling completion time is updated by acquiring the measurement result of the temperature of the specimen 2 during cooling of the specimen 2, and therefore the expected cooling completion time can be provided with high accuracy.

In the specimen machining device 100, the machining control unit 720 changes the irradiation condition under which the ion source 10 emits the ion beam IB based on the acquired image I2. With the specimen machining device 100, therefore, the machining conditions can be changed automatically, enabling an improvement in operation efficiency. For example, in the specimen machining device 100, the acceleration voltage can be changed in accordance with the thickness of the specimen 2, and in so doing, damage to the specimen 2 can be reduced, making it possible to prepare a high-quality specimen for use in a transmission electron microscope or a scanning electron microscope. Furthermore, in the specimen machining device 100, specimens can be machined repeatedly under the same machining conditions, and therefore high-quality specimens can be prepared repeatedly, regardless of the experience of the user.

The specimen machining device 100 includes the shielding member 30 that is disposed on the specimen 2 in order to block the ion beam IB, and the transmission illumination device 40 that emits illumination light that is transmitted through and illuminates the specimen 2, and the camera 60 photographs the specimen 2 that is illuminated by the illumination light transmitted therethrough. Further, during the processing for setting the irradiation condition of the ion beam IB, the machining control unit 720 detects the brightness of the light leaking through the gap between the specimen 2 and the shielding member 30 on the acquired image I2, detects the brightness of a region corresponding to the specimen 2 on the acquired image I2, and changes the irradiation condition based on the brightness of the light leaking through the gap and the brightness of the region corresponding to the specimen 2. Thus, in the specimen machining device 100, the irradiation condition is changed by comparing the brightness of the region corresponding to the specimen 2 with the brightness of the light leaking through the gap, and as a result, the thickness of the specimen 2 can be ascertained accurately, making it possible to accurately determine the timing at which to change the irradiation condition of the ion beam IB.

In the specimen machining device 100, during the processing for setting the irradiation condition, the machining control unit 720 measures the machined width W on the acquired image I2 and changes the irradiation condition based on the measured machined width W. Hence, with the specimen machining device 100, the thickness of the specimen 2 can be ascertained accurately by estimating the thickness of the specimen 2 from the machined width W, and as a result, the timing at which to change the irradiation condition of the ion beam IB can be determined accurately.

5. Modified Example

5.1. Specimen Machining Device

In the above embodiment, a case in which the specimen machining device 100 is an Ion Slicer (registered trademark)

for preparing a thin film specimen was described, but the specimen machining device 100 may also be a Cross Section Polisher (registered trademark) for machining a cross-section of a specimen, for example.

Figure 46:
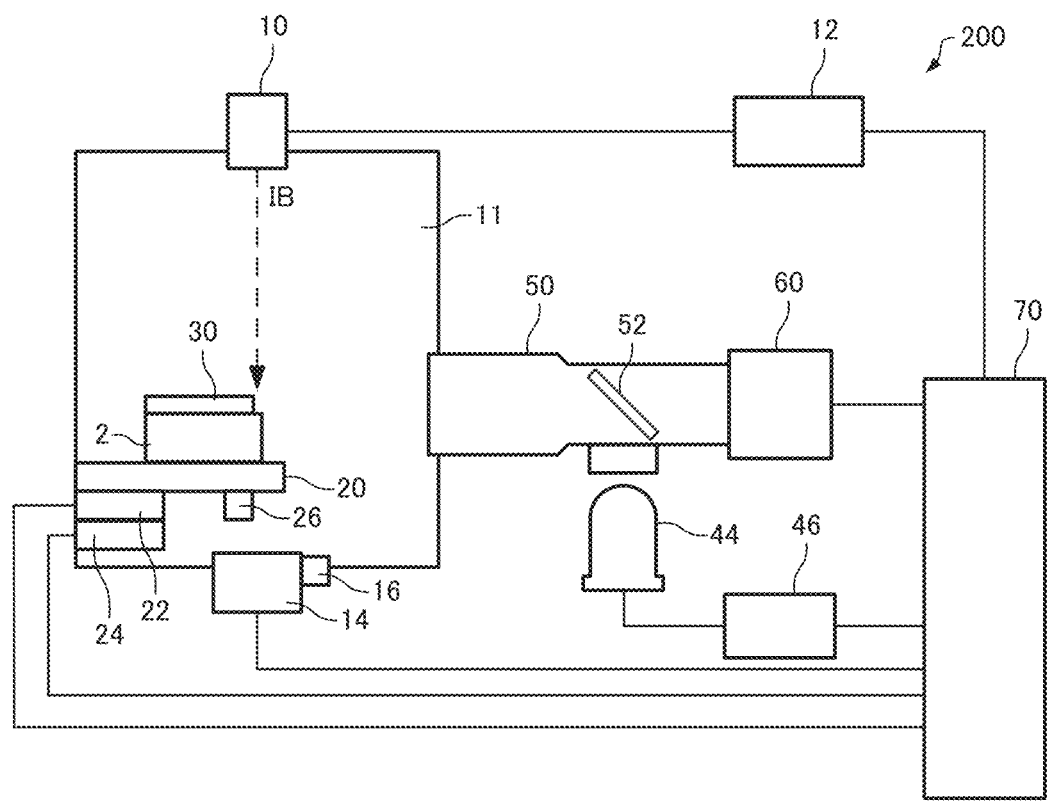
FIG. 46 is a diagram illustrating a configuration of a specimen machining device according to a modified example.

FIG. 46 is a diagram illustrating the configuration of a specimen machining device 200 according to a modified example. In the specimen machining device 200 illustrated in FIG. 46, members having similar functions to the constituent members of the specimen machining device 100 illustrated in FIG. 1 have been allocated identical reference numerals, and detailed description thereof has been omitted.

In the specimen machining device 200, the shielding member 30 is a plate-shaped shielding plate disposed directly on top of the specimen 2. When the ion beam IB is emitted from the ion source 10, a part of the specimen 2 that projects from the shielding member 30 is sputtered such that a cross-section of the specimen 2 is exposed in a position on an end surface of the shielding member 30. Thus, a cross-section specimen can be prepared. Note that in the specimen machining device 200, the specimen 2 is swung during the machining, but the ion source 10 is not swung.

Figure 47:
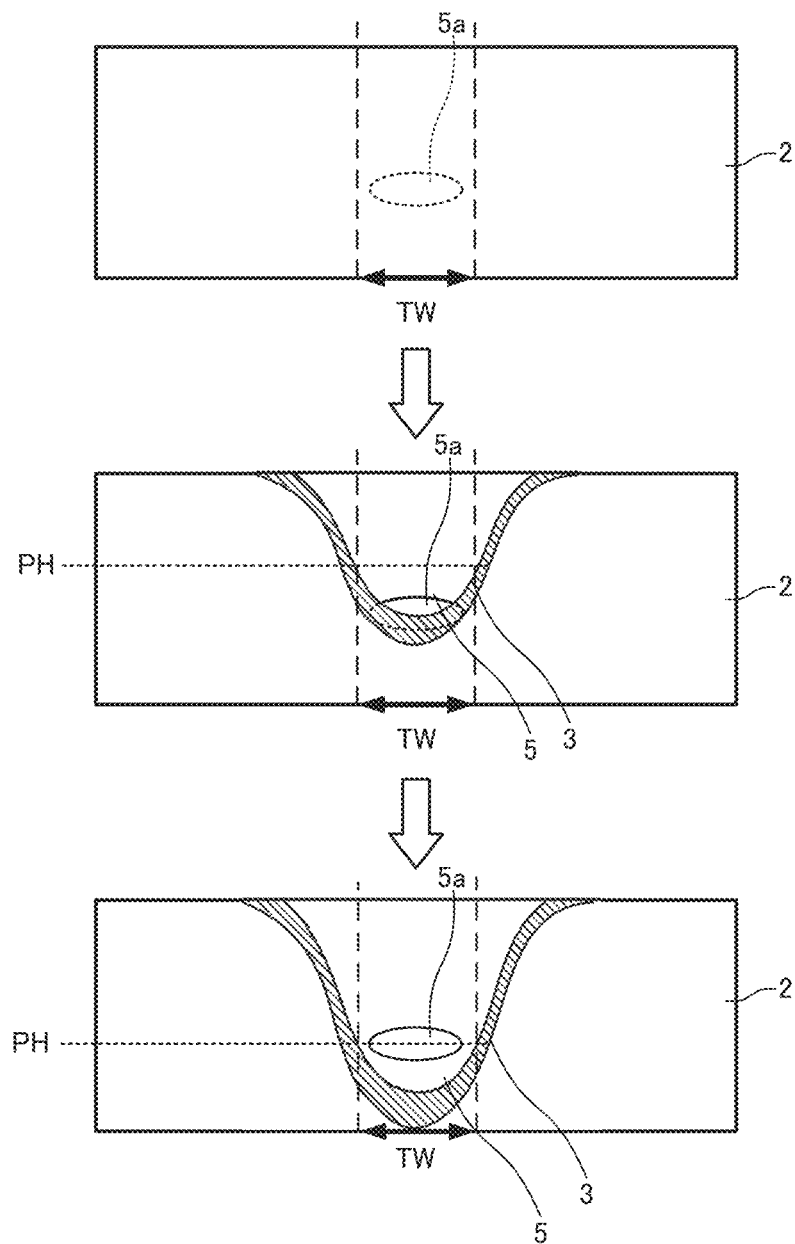
FIG. 47 illustrates a status of cross-section machining.

FIG. 47 illustrates a status of cross-section machining by the specimen machining device 200. When the position PH reaches the position of a target region 5a, the machining control unit 720 performs processing for halting emission of the ion beam IB. The position of the target region 5a may be set as desired.

5.2. Specimen Machining Method

5.2.1. Ion Beam Control

In the specimen machining device 200, the machining conditions are changed in accordance with the position PH at which the width of the machined region 5 reaches the target machined width TW, similarly to the method for controlling the ion beam IB during primary milling.

FIG. 48 is a table illustrating acceleration voltages set in accordance with the position PH. In FIG. 48, the position PH is acquired by standardizing the distance from the first end portion 2a by the distance between the first end portion 2a and the position of the target region 5a. In other words, position PH=100% means that the position of the target region 5a has reached the target machined width TW.

As illustrated in FIG. 48, the acceleration voltage is set in accordance with the position PH. When the position of the target region 5a reaches the target machined width TW (when position PH=100%), the acceleration voltage is changed in accordance with the elapsed time as finish machining.

FIG. 49 illustrates a status of the cross-section machining. An upper graph in FIG. 49 is a graph of variation in the acceleration voltage, on which the horizontal axis shows time and the vertical axis shows the acceleration voltage. A lower graph in FIG. 49 is a graph of variation in the position PH, on which the horizontal axis shows time and the vertical axis shows the position PH.

When the conditions in the table in FIG. 48 are set, the machining control unit 720 detects the position PH from the image I2 and changes the acceleration voltage in accordance with the position PH while following the conditions in the table in FIG. 48.

More specifically, as illustrated in FIG. 49, the machining control unit 720 sets the acceleration voltage at 6.0 kV at a time t0. The machining control unit 720 then detects the position PH on the acquired image I2, and when the position PH reaches 50%, changes the acceleration voltage to 5.0 kV.

On the graphs in FIG. 49, the acceleration voltage is changed to 5.0 kV at a time t1. Similarly, the machining control unit 720 changes the acceleration voltage to 4.0 kV when the position PH reaches 75% (a time t2), changes the acceleration voltage to 3.0 kV when the position PH reaches 90% (a time t3), and changes the acceleration voltage to 2.0 kV when the position PH reaches 100% (a time t4). At the time t4, the position of the target region 5a reaches the target machined width TW.

In accordance with the conditions of the table in FIG. 48, the machining control unit 720 implements machining at an acceleration voltage of 2.0 kV for five minutes from the time t4 to a time t5, then implements machining at an acceleration voltage of 1.0 kV for five minutes from the time t5 to a time t6. Similarly, the machining control unit 720 implements machining at an acceleration voltage of 0.5 kV for five minutes from the time t6 to a time t7, implements machining at an acceleration voltage of 0.3 kV for five minutes from the time t7 to a time t8, and implements machining at an acceleration voltage of 0.1 kV for five minutes from the time t8 to a time t9.

5.2.2. GUI

Figure 50:
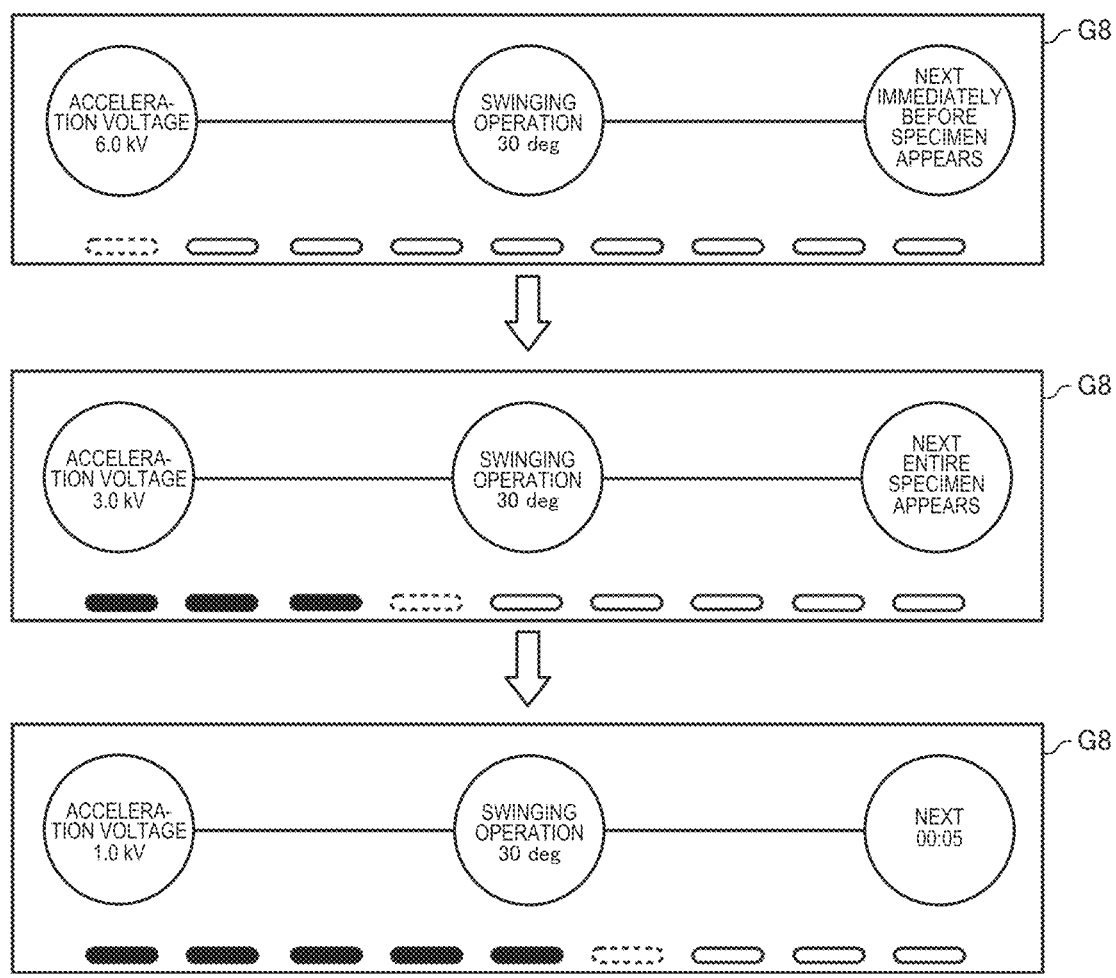
FIG. 50 schematically illustrates examples of a GUI screen.

FIG. 50 schematically illustrates examples of a GUI screen G8 displayed during the cross-section machining processing.

As illustrated in FIG. 50, the acceleration voltage, the tilt angle (the swing angle) 01 of the specimen 2, and the condition for advancing to the next step are displayed on the GUI screen G8. The GUI screen G8 also displays an indicator indicating the progress status of the machining. Each of the items on the GUI screen G8 is updated when the machining advances to the next step.

5.2.3. Provision of Expected Completion Time

The information provision unit 722 provides information indicating a cross-section machining processing expected completion time, which is the expected completion time of the cross-section machining processing.

Similarly to the primary milling processing, the cross-section machining processing includes a step for evacuating the specimen chamber 11, a step for cooling the specimen 2, a step for machining the specimen 2, and a step for raising the temperature of the specimen 2. The information provision unit 722 predicts the expected completion time of each step and calculates the time at which the entire cross-section machining processing will be completed from the sum of the predicted times.

Note that processing for calculating the cross-section machining processing expected completion time is similar to that of the bulk machining processing described above except for calculation of the expected rough machining completion time during the step for machining the specimen. Accordingly, only the processing for calculating the expected rough machining completion time will be described below.

The processing for calculating the expected rough machining completion time is similar to the processing performed during the primary milling processing, as illustrated in FIGS. 36, 38, and 39. More specifically, during the cross-section machining processing, the information provision unit 722 calculates the expected rough machining completion time based on past machining information during the period in which the position PH cannot be measured and calculates the expected rough machining completion time based on the image I2 during the period in which the position PH can be measured.

5.2.4. Modified Example

In the embodiment described above, the specimen machining device 200 determines the timing at which the machining will be completed, modifies the machining conditions, and calculates the expected rough machining completion time based on the position PH. Instead, however, the specimen machining device 200 may determine the timing at which the machining will be completed, modify the machining conditions, and calculate the expected rough machining completion time based on the machining depth, i.e., the depth of the machined region 5, for example.

Figure 51:
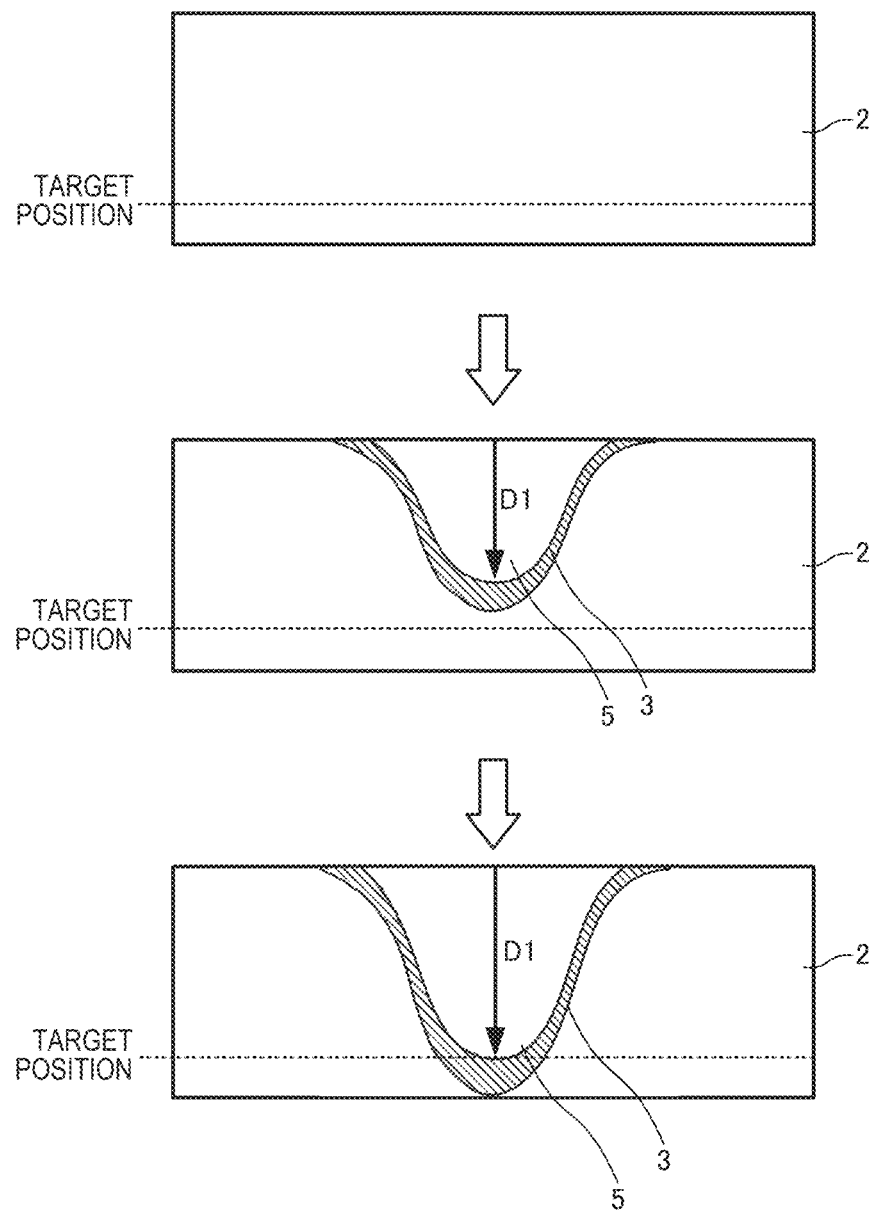
FIG. 51 illustrates an example of a method for measuring a machining depth.

FIG. 51 illustrates an example of a method for measuring a machining depth D1 during the cross-section machining processing.

In the example in FIG. 51, the machining depth D1 serving as the depth of the machined region 5 is set as the deepest position of the inside edge of the inclined surfaces 3.

The machining control unit 720 halts emission of the ion beam IB when the machining depth D1 illustrated in FIG. 51 reaches a target position. Further, the machining control unit 720 changes the machining conditions (the acceleration voltage) based on the machining depth D1.

Figure 52:
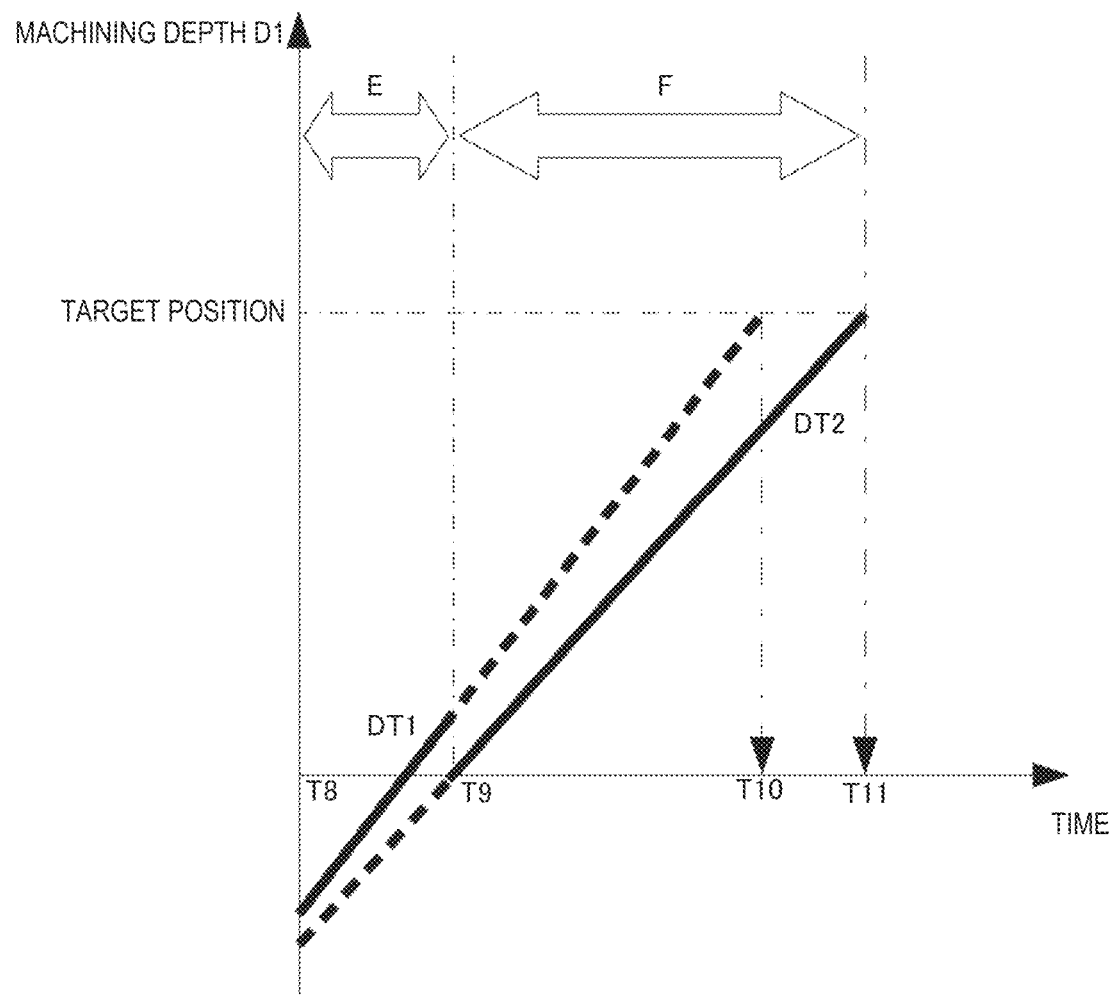
FIG. 52 is a graph of variation in a machining depth.

FIG. 52 is a graph of variation in the machining depth D1. On the graph in FIG. 52, the horizontal axis shows time and the vertical axis shows the machining depth D1. In FIG. 52, data DT1 are data (past machining information) indicating past machining depths D1, and data DT2 are data (current machining information) indicating the machining depth D1 acquired from the current measurement result.

Until it becomes possible to measure the machining depth D1, the information provision unit 722 acquires the past machining information and determines the expected rough machining completion time based on the past machining information. When it becomes possible to measure the machining depth D1 from the image I2, the information provision unit 722 calculates the machining speed from the measurement result of the machining depth D1 and calculates the expected rough machining completion time based on the machining speed.

In the example in FIG. 52, the information provision unit 722 calculates the expected rough machining completion time T10 based on the past machining information prior to the time T8 at which machining of the specimen 2 is started. Further, likewise over the period E from the time T8 to the time T9, the information provision unit 722 calculates the expected rough machining completion time T10 based on the past machining information. In other words, before machining of the specimen 2 is started and over the period E, the information provision unit 722 calculates the expected rough machining completion time based on the data DT1.

When it becomes possible to measure the machining depth D1 at the time T9, the information provision unit 722 calculates the expected rough machining completion time by measuring the machining depth D1 based on the image I2 and updates the expected rough machining completion time over the period F extending from the time T9 to the machining completion time T11. In other words, over the period F, the information provision unit 722 calculates the expected rough machining completion time based on the data DT2.

Figure 53:
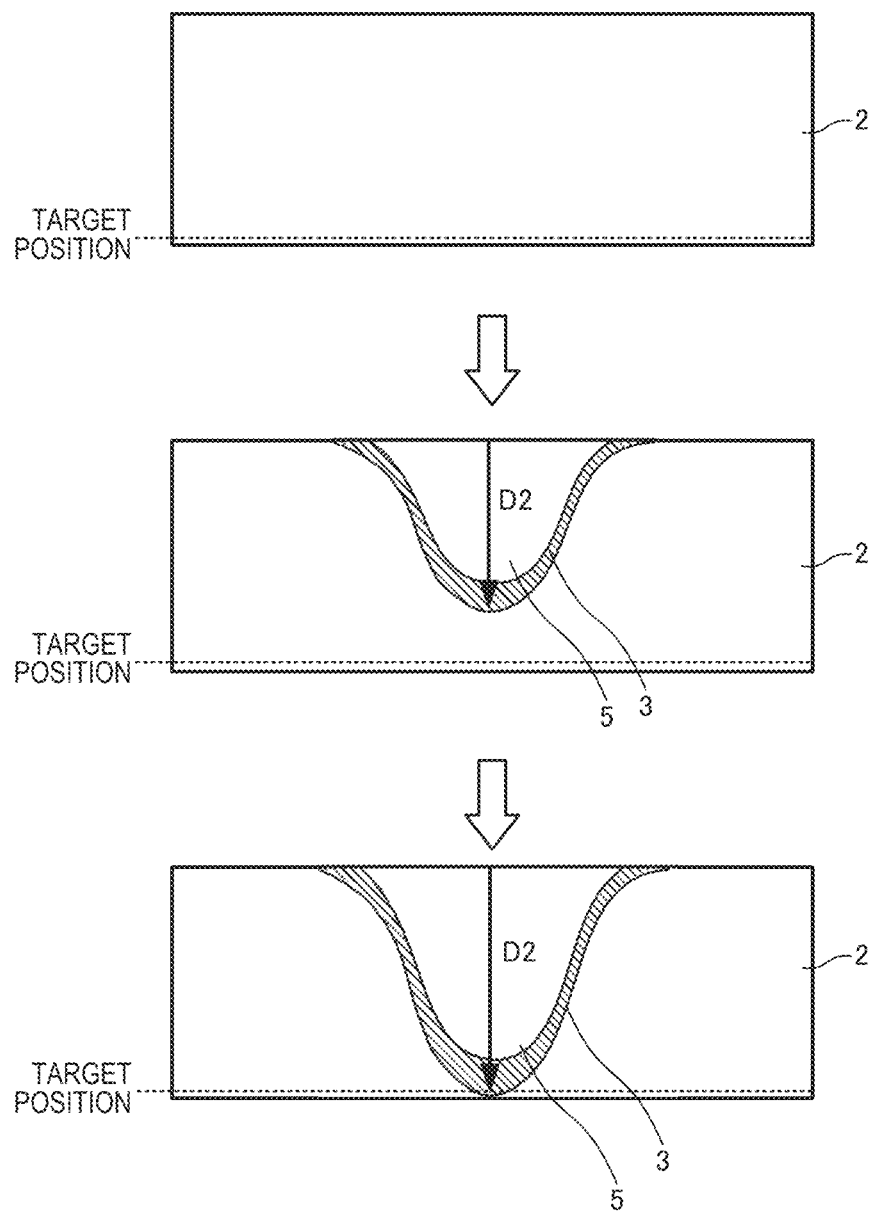
FIG. 53 illustrates an example of a method for measuring a machining depth.

FIG. 53 illustrates an example of a method for measuring a machining depth D2 during the cross-section machining processing. In the example in FIG. 51, the machining depth D1 was set as the deepest position of the inside edge of the inclined surfaces 3, but as illustrated in FIG. 53, the machining depth D2 may be set as the deepest position of the outside edge of the inclined surfaces 3.

When the machining depth D2 illustrated in FIG. 53 reaches a target position, the machining control unit 720 halts emission of the ion beam IB. Further, the machining control unit 720 changes the machining conditions based on the machining depth D2.

Figure 54:
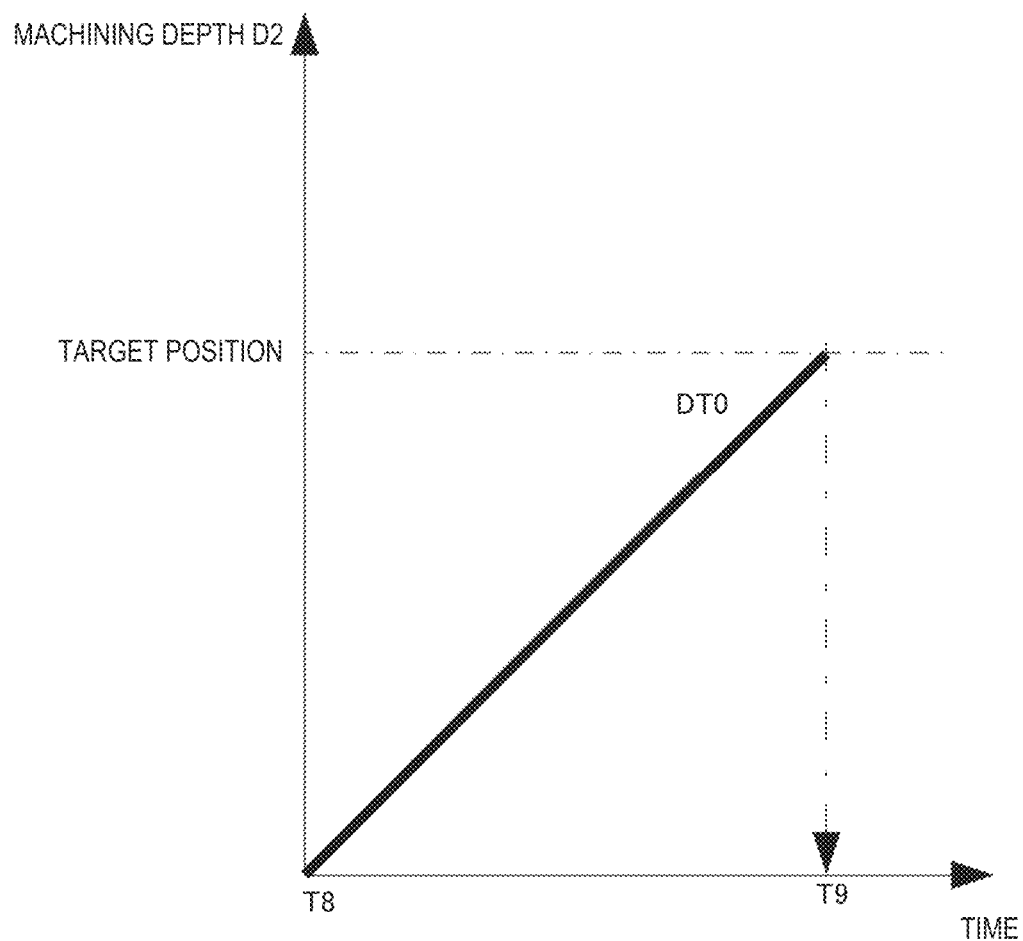
FIG. 54 is a graph of variation in a machining depth.

FIG. 54 is a graph of variation in the machining depth D2. On the graph in FIG. 54, the horizontal axis shows time and the vertical axis shows the machining depth D2. In FIG. 54, data DT0 are data (current machining information) indicating the machining depth D2 determined from the current measurement result.

As illustrated in FIG. 54, by measuring the machining depth D2 from the image I2 and calculating the expected rough machining completion time therefrom, the expected rough machining completion time can be calculated based on the image I2 from immediately after the start of the machining.

In the example in FIG. 54, the information provision unit 722 calculates the machining speed by measuring the machining depth D2 based on the image I2 and updates the expected rough machining completion time over a period extending from the machining start time T8 to the machining completion time T9. For example, the information provision unit 722 creates the data DT0 by plotting the machining depth D2, and calculates the expected rough machining completion time therefrom.

Figure 55:
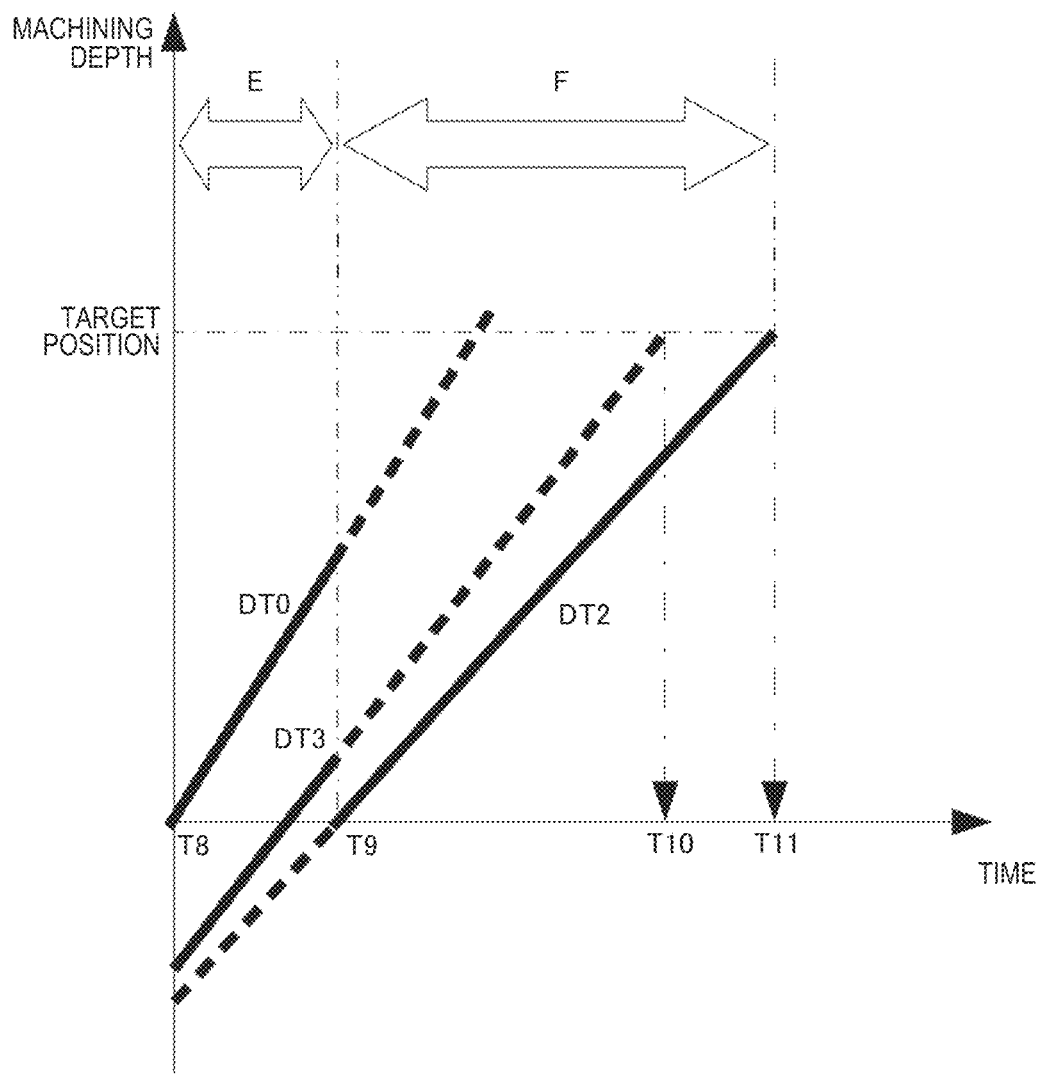
FIG. 55 is a graph of variation in a machining depth.

FIG. 55 is a graph of variation in the machining depth.

As illustrated in FIG. 55, the expected rough machining completion time may be updated by combining a case in which the expected rough machining completion time is calculated based on the machining depth D1 and a case in which the expected rough machining completion time is calculated based on the machining depth D2.

In the example in FIG. 55, over the period E extending from the machining start time T8 to the time T9, the information provision unit 722 measures the machining depth D2, estimates the machining depth D1 from the measurement result, and calculates the expected rough machining completion time therefrom. The relationship between the machining depth D1 and the machining depth D2 can be ascertained from the past machining information, for example. In other words, over the period E, the information provision unit 722 determines the data DT3 from the data DT0 and calculates the expected rough machining completion time based on the data DT3.

Over the period F from the time T9 to the machining completion time T11, the information provision unit 722 measures the machining depth D1 from the image I2, calculates the machining speed from the measurement result, and calculates the expected rough machining completion time based on the machining speed. In other words, over the period F, the information provision unit 722 calculates the based on the data DT2.

5.3. Effects

With the specimen machining device 200, similar actions and effects to those of the specimen machining device 100 can be realized.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Besides the embodiments of the invention described in detail above, a person skilled in the art will readily appreciate that various modifications can be made from the embodiments without materially departing from the novel teachings and effects of the invention. Accordingly, all such modifications are assumed to be included in the scope of the invention.

What is claimed is:

1. A specimen machining device for machining a specimen by irradiating the specimen with an ion beam, the specimen machining device comprising:
    an ion source for irradiating the specimen with the ion beam;
    a specimen stage for holding the specimen;
    a camera for photographing the specimen;
    an information provision unit for providing information indicating an expected machining completion time; and
    a storage unit for storing past machining information,
    the information provision unit configured to perform:
    processing for calculating the expected machining completion time based on the past machining information;
    processing for acquiring an image photographed by the camera;
    processing for calculating a machining speed based on the acquired image; and
    processing for updating the expected machining completion time based on the machining speed.

2. The specimen machining device according to claim 1, wherein the information provision unit is further configured to perform processing for displaying the expected machining completion time on a display unit.

3. The specimen machining device according to claim 1, wherein the past machining information is information indicating past machining speeds.

4. The specimen machining device according to claim 1, further comprising:
    a specimen chamber for housing the specimen;
    an evacuation device for evacuating the specimen chamber; and
    a pressure gauge for measuring a pressure in the specimen chamber, wherein
    the storage unit stores past evacuation information relating to the specimen chamber, and
    the information provision unit is configured to perform:
    processing for calculating an expected evacuation completion time required for the pressure in the specimen chamber to reach a set pressure from an atmospheric pressure, based on the past evacuation information;
    processing for acquiring information indicating a measurement result of the pressure in the specimen chamber from the pressure gauge;
    processing for calculating a decrease speed of the pressure in the specimen chamber based on the acquired measurement result of the pressure in the specimen chamber; and
    processing for updating the expected evacuation completion time based on the decrease speed.

5. The specimen machining device according to claim 1, further comprising:
    a cooler for cooling the specimen; and
    a temperature sensor for measuring a temperature of the specimen, wherein
    the storage unit stores past cooling information relating to the specimen, and
    the information provision unit is configured to perform:
    processing for calculating an expected cooling completion time required for the temperature of the specimen to be cooled to have a set temperature based on the past cooling information;
    processing for acquiring information indicating a measurement result of the temperature of the specimen from the temperature sensor;
    processing for calculating a cooling speed based on the acquired measurement result of the temperature of the specimen; and
    processing for updating the expected cooling completion time based on the cooling speed.

6. The specimen machining device according to claim 1, further comprising a machining control unit for changing an irradiation condition under which the ion source emits the ion beam based on the acquired image.

7. The specimen machining device according to claim 6, further comprising:
    a shielding member that is disposed on the specimen and blocks the ion beam; and
    a transmission illumination device that emits illumination light that is transmitted through and illuminates the specimen, wherein
    the camera photographs the specimen transmissively illuminated by the illumination light, and
    in the changing of the irradiation condition, the machining control unit detects the brightness of light leaking through a gap between the specimen and the shielding member on the acquired image, detects the brightness of a region corresponding to the specimen on the acquired image, and changes the irradiation condition based on the brightness of the light leaking through the gap and the brightness of the region corresponding to the specimen.

8. The specimen machining device according to claim 6, wherein, in the changing of the irradiation condition, the machining control unit measures a machined width on the acquired image and changes the irradiation condition based on the measured machined width.

9. An information provision method implemented in a specimen machining device for machining a specimen by irradiating the specimen with an ion beam, the specimen machining device including an ion source for irradiating the specimen with the ion beam, a specimen stage for holding the specimen, and a camera for photographing the specimen, the information provision method comprising:
    calculating an expected machining completion time based on past machining information;
    acquiring an image photographed by the camera;

calculating a machining speed based on the acquired image; and updating the expected machining completion time based on the machining speed.

\* \* \* \* \*